United States Patent [19]
Har'El et al.

[11] Patent Number: 5,163,016
[45] Date of Patent: Nov. 10, 1992

[54] ANALYTICAL DEVELOPMENT AND VERIFICATION OF CONTROL-INTENSIVE SYSTEMS

[75] Inventors: Zvi Har'El, Haifa, Israel; Robert P. Kurshan, New York, N.Y.

[73] Assignee: AT&T Bell Laboratories, Murray Hill, N.J.

[21] Appl. No.: 489,438

[22] Filed: Mar. 6, 1990

[51] Int. Cl.$^5$ .............................................. G06F 15/20
[52] U.S. Cl. ..................................... 364/578; 395/500
[58] Field of Search ............... 364/578, 200, 900, 488, 364/489; 371/23, 22.2; 395/500, 919, 920

[56] References Cited

U.S. PATENT DOCUMENTS

| | | | |
|---|---|---|---|
| 4,587,625 | 5/1986 | Marino, Jr. et al. ................. | 364/578 |
| 4,694,411 | 9/1987 | Burrows ............................. | 364/200 |
| 4,862,347 | 8/1988 | Rudy .................................. | 364/200 |
| 4,907,180 | 3/1990 | Smith ................................. | 371/23 |
| 4,965,758 | 10/1990 | Sherman ............................. | 364/578 |

OTHER PUBLICATIONS

R. P. Kurshan in Reducibility on Analysis of Coordination, published in Lecture Notes in Computer Science (LNICS) 103 titled Discreet Event Systems: Models and Applications, Springer-Verlag, pp. 19-39 (1987).

K. G. Larsen et al., in Lecture Notes in Computer Science, Springer-Verlag, 14th International Colloquium Karlsruhe, Fed. Rep. of Germ. Jul. 13-17, 1987.

J. E. Hopcroft in An n log n Algorithm for Minimizing the States in a Finite Automaton, Theory of Machines and Computations (Kohavi, Paz, eds.) Academic Press, pp. 189-196.

Van Nostrand; "Sequential Machines"; 1983.

Dowsing; "Simulating hardware Structure in OCCAM"; Software and Microsystems vol. 4, No. 4 Aug. 1985.

*Primary Examiner*—Thomas G. Black
*Assistant Examiner*—Ellis B. Ramirez
*Attorney, Agent, or Firm*—Henry T. Brendzel

[57] ABSTRACT

Designs are created through a high-level to low-level transformation in the form of a formal top-down development procedure based upon successive refinement. Starting with a high-level (abstract) model, such as a formal abstraction of a protocol standard, successively more detailed models are created through successive refinement, in a fashion which guarantees that properties verified at one level of abstraction hold in all successive levels of abstraction. The successive refinements end with a low-level "model" which forms the ultimate implementation of the protocol. In one embodiment of this invention, the analysis/development apparatus creates a unique C language code representation of the specified system that is guaranteed to carry out the tasks specified when executed in a stored program controlled machine. In another embodiment, the code is used to create a "net list" for manufacturing the specified system.

29 Claims, 5 Drawing Sheets

FIG. 7

```
module - finite state machine 1 while TRUE
  {

Set state vectors
  Set mode switch (mode)
    {
    case 'select':
        switch (state vector)
          {
          case '1':
                action statements
                error statements
          case '2':
                action statements
                error statements
          case '3':
                action statements
                error statements
            .
            .
            .
          }
    case 'resolve':
        switch (state vector)
          {
          case '1':
                action statements
                error statements
          case '2':
                action statements
                error statements
          case '3':
                action statements
                error statements
```

ANALYTICAL DEVELOPMENT AND VERIFICATION OF CONTROL-INTENSIVE SYSTEMS

BACKGROUND OF THE INVENTION

This invention relates to control-intensive systems, and more particularly to the development of finite state machine implementations of such systems through a methodology based upon formal verifications.

Digital circuits that have memory are commonly referred to as sequential circuits or finite state machines. Finite state machines can be divided into two categories. One is signal processing machines whose proper operations must be described in terms of a routine which calls itself recursively, and the other is non-recursive control-intensive machines. FIR filters, for example, belong to the first category. Communication protocol hardware belongs to the second category. Design of control-intensive finite state machines is a difficult task. Typically, the objective of such a design is to efficiently and quickly develop an implementation that is correct, robust with respect to changes in data structures and easy to support.

The value of a particular formal verification framework may be measured by the scope of generality of the requirements for which an implementation may be tested. For example, one can verify that at each state the protocol will not do anything untoward. This may be sufficient in some applications and not in others. In connection with communications protocols, for instance, such verification is not sufficient because the primary concern is that a message should be received at the destination, and such verification cannot guarantee that.

In order to ensure proper behavior of an implementation, extensive behavioral testing must be conducted. Normally that would imply extensive simulation, but it is now generally accepted that simulation is inadequate (the set of possible sequences of input signals that must be simulated for complete confidence is infinite). Formal verification techniques, on the other hand, can have the power to draw conclusions about the general behavior of a system under all situations through a finite test.

Since requirements address broad properties of a finite state machine, formal verification is most easily and most often applied to a high-level model or abstraction of the implementation. Such verification is not enough. For verification of a high-level model to have real meaning for an implementation, there must exist a formal association or transformation from the high-level model to the implementation.

Even in the absence of a formal transformation from an abstract model to its actual implementation, formal analysis of the model is useful. In connection with finite state machines that embody a protocol, for example, formal analysis discloses faults in the very concept of the protocol itself. However, it is deceptive to refer to an implementation as "verified" in the absence of such faults if there is no formal, testable, relationship between the verified model and its actual implementation.

A simple way to define a formal relationship between a high-level model or standard and an implementation is to associate a state in the model or standard with a set of states of the implementation. Such an association, for example, may require that the Receiver-Ready state of the high-level model of a communications protocol correspond to the set of implementation states for which a certain state machine component of the protocol implementation is in its Receiver-Ready state. The set of implementation states for which this state machine component is in the Receiver-Ready state may be very large since the state is determined by all the possible respective values of pointers, buffers, counters and so on in the circuit which may occur together with the state machine component having state Receiver-Ready. If one were to suppose that according to the high-level model or standard, the correct transition from Receiver-Ready is to the state Transmit, still it may be that for certain implementation states (i.e., for certain values of pointers, buffers and so on) the implementation tracks the model or standard, while for others it does not. To certify truly that a high-level model or standard abstracts an implementation, it would be necessary to demonstrate this abstraction not only for a single implementation state and transition corresponding to each respective high-level state and transition, but rather for every low-level state and transition. Indeed, it is well-known that the greatest weaknesses of an implementation arise at the "boundaries" of operation (buffer empty, buffer full, etc.) and that these "boundaries" can be very complex.

As intimated above, one could use the brute force technique of simulating all possible states of the model (i.e., all possible combinations of pointers, buffers, etc.), but this is rarely practical. While a high-level model or standard may have as few as 50 to 500 states, an implementation typically has such a large number of states that the number can be appreciated only by analogy. For example, given all the possible combined values of its pointers, buffers and state machine controllers of an "average" protocol implementation, it turns out that the state space of a circuit contains approximately $10^{104}$ reachable states. Supposing that a brute force verification algorithm were perfectly parallelizable among every human being on earth, and each person, in order to accomplish his or her piece of the work, were given a super computer. With $10^{10}4$ states, the verification job could not be completed before the sun turned to stone.

Since it is rarely feasible to address directly all possible transitions of an implementation (i.e., to address all possible values of pointers, buffers, etc.), there must be an alternative by which to conclude that an implementation is faithful to its high-level abstraction.

Lastly, having formal verification together with a comprehensive and a proven method for transforming high level description to low level specifications is still insufficient in light of the tremendous complexity that finite state machines may represent. To reduce this complexity, artisans have attempted to replace complex problems with simpler presentations. K. G. Larsen et al. in *Lecture Notes in Computer Science*, Springer-Verlag, 14th International Colloquium Karlsruhe, Federal Republic of Germany, July 13-17, 1987 Proceedings, presented a compositional proof, by decomposing the system and demonstrating properties of the subsystems that are strong enough to hold true for the complete system. However, they have not provided a methodology for proving that their substitutions (of complex problems with simple problem equivalent) are valid.

In short, what is needed to the development of control-intensive FSM's is an automated software-aided design approach that incorporates formal verification, formal behavior-preserving transformation from a high-level design to a refined implementation, and the means to manage the ensuing complexity brought on by the refined implementations.

SUMMARY OF THE INVENTION

We present a high-level to low-level transformation in the form of a formal top-down development procedure based upon successive refinement. Starting with a high-level (abstract) model, such as a formal abstraction of a protocol standard, successively more detailed models are created through successive refinement. The refinements are created in a fashion which guarantees that properties verified at one level of abstraction hold in all successive levels of abstraction. The successive refinements end with a low-level "model" which forms the ultimate implementation of the protocol.

In one embodiment of this invention, the analysis/development apparatus creates a unique C language code representation of the specified system that is guaranteed to carry out the tasks specified when executed in a stored program controlled machine. The code is stored in the memory of a software-controlled processor which carries out the instructions of the code and thereby realizes the desired finite state machine. In another embodiment, the code is used to create a "net list" which is transformed to a set of layout masks and the masks are employed to manufacture integrated circuits of the specified system.

BRIEF DESCRIPTION OF THE DRAWING

FIG. 7 illustrates the structure of the code used in the verification blocks and the signal set that is developed by block 30 of FIG. 2.

DETAILED DESCRIPTION

As indicated above, this invention deals with the need to create a finite state machine that implements given functions, and to formally verify that the implemented machine carries out the intended functions without fail. This invention realizes the target finite state machine in a program controlled processor or in a specifically designed apparatus. The code which comprises the program that implements the target state machine in a processor, and which dictates the circuit's structure in a hardware embodiment, is developed by the analyzer/developer described hereinafter.

It should be understood at the outset that this invention creates a unique end product, and that is the finite state machine which is developed in accordance with the principles of this invention. This machine has unique properties as described infra. This invention also creates another product, and that is the formally verified specification that is suitable for developing the finite state machine (FSM); whether the FSM is embodied in "conventional" hardware (e.g. integrated circuit) or in software-controlled hardware. In connection with software-controlled embodiments, it should also be recognized that technological efforts have shifted greatly toward the development of control systems in software-controlled hardware, and many worker-hours have been devoted to the software generation effort. Such software generation efforts are greatly benefited by the method of this invention. So, this invention may be properly viewed as a tool for creating software controlled hardware.

Figure 1:
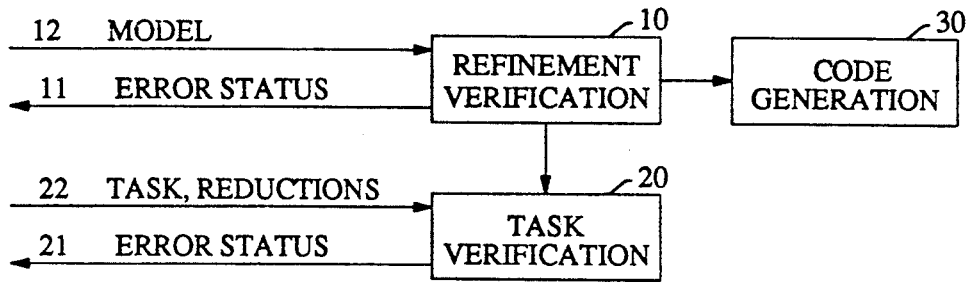
FIG. 1 presents a general block diagram of the analysis/development apparatus of this invention.

Developing a verified design of a finite state machine in accordance with the principles of this invention contemplates an interactive design process. With reference to FIG. 1, which depicts a generalized block diagram of the design analyzer/developer of this invention, the user enters into refinement block 10 a high level specification of the system to be designed. When block 10 determines that the specification contains no internal inconsistencies, the system specification information is passed to verification block 20. Block 20 receives task specifications from the user and formally verifies that the specified tasks are properly executed by the structure defined by the system specification provided by block 10. When an error is detected in blocks 10 or 20, an error message is sent to the user on status lines 11 or/and 21 and the user is given an opportunity to correct the error through input lines 12 and 22. When no errors are detected, the design iteration is completed.

The next iteration is initiated when the user provides more detailed information about the system's specification and identifies a more comprehensive set of tasks that the system must perform. At that time, block 10 analyzes the refinement in the system specification provided by the user to determine that the refined specification s subsumed by the specification verified in the previous iteration. When no errors are detected, the refined specification is passed to block 20, where it is assessed whether the newly specified tasks are properly executed by the structure defined by the refined specification.

Following a number of such iterations, the system specification contained in block 10 is sufficiently detailed and robust to execute all of the necessary tasks. That is, the specification is robust enough to cause all of the expected, or target, outputs to be developed in response to the possible applied inputs. Typically, at that time the design process proceeds to block 30. Block 30 converts the system specification within block 10 to a form that enables the user to construct the designed machine. In today's milieu, that may be a program to be executed on a stored program processor, it may be a collection of logic expressions that define the combinatorial circuit that forms the designed finite state machine. It may also be a net list for constructing a lay-out of an intergrated circuit.

Figure 2:
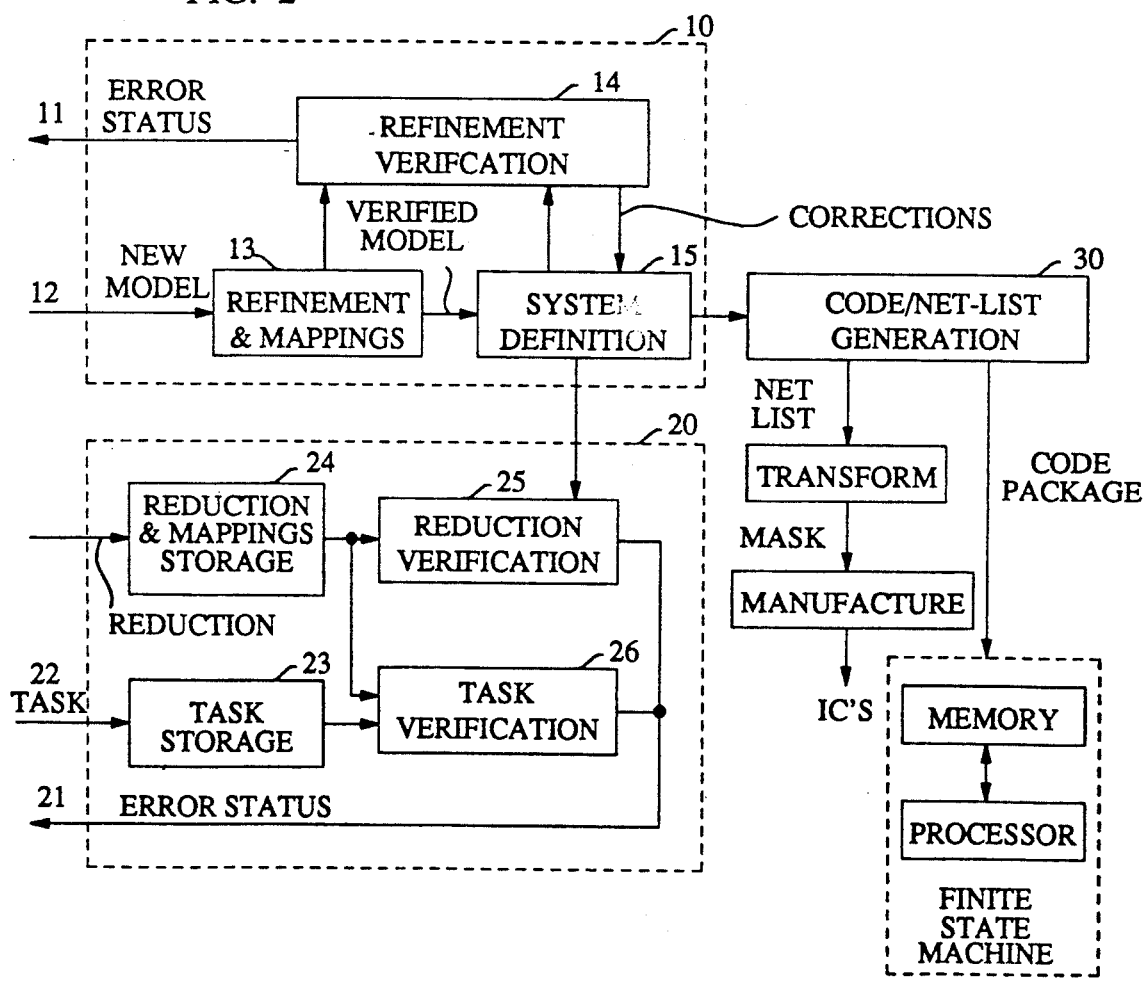
FIG. 2 expands in the block diagram of FIG. 1.

FIG. 2 presents a more detailed description of the FIG. 1 arrangement. Refinement block 10 contains refinement storage block 13, refinement verification block 14 and system definition storage block 15. Blocks 13 and 15 provide signals to block 14 and, in turn, block 14 provides corrections signals to block 15. Block 14 also provides signals to status line 11. In operation, the design process begins with an empty system-storage block 15. The user provides a high level definition of the system to be designed to block 13 and the analysis proceeds. Generally, block 14 analyzes the contents of block 13 to determine that the system definition of block 13 is subsumed by the system definition of block 15. In the first iteration, however, the affirmative conclusion of such analysis is automatic because flock 15 is empty.

This affirmative conclusion (i.e., the conclusion that the specification is error free) leads block 13 to transfer its contents to block 15 and to send a message on status line 11 that informs the user of the successful conclusion of the current iteration.

When the next iteration is initiated, the user inputs a refined definition of the system into block 13 and a mapping. The mapping maps the states, and actions at the states, of the system specification in block 15 to the states and actions at the states of the system specification in block 13. That is, it maps states to states and actions to actions, as depicted in FIG. 3.

Figure 3:
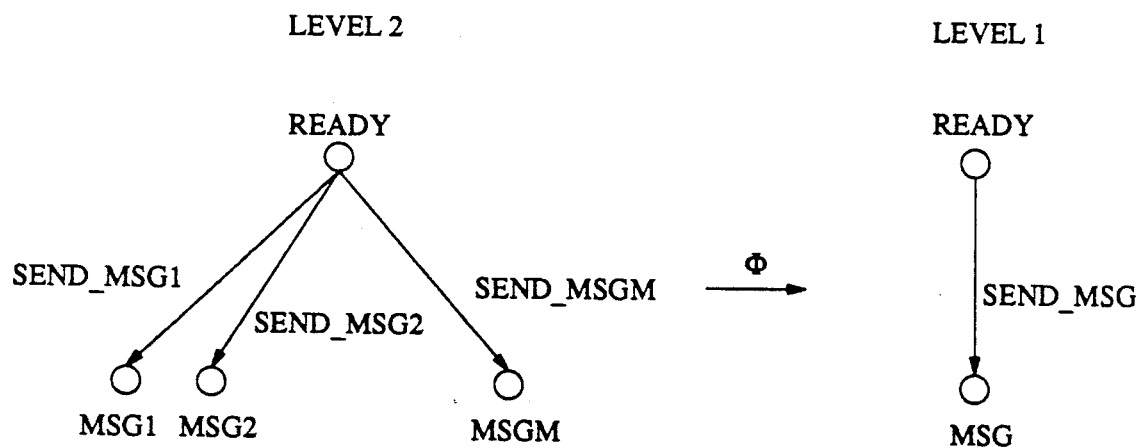
FIG. 3 illustrates the homomorphism concept embodied in the analysis/development approach of this invention.

FIG. 3 shows a portion of the system definition in block 15 as Level 1, and the more refined system definition in block 13 as Level 2. Specifically, Level 1 shows that there is a state "READY" and a state "MSG", an action "SEND-MSG", and a selection of state "MSG" when that action occurs. FIG. 3 also indicates that there exists a mapping Φ from Level 2 to Level 1. Level 2 shows that there is a state "READY" and states "MSG1", "MSG2", . . . "MSGM" which are selected following the actions "SEND MSG1", "SEND MSG2", . . . , "SEND MSGM". The mapping Φ is such that Φ(state in Level 2)>state in Level 1, and Φ(action in Level 2)>action in Level 1.

Block 14 analyzes that refined definition and the mapping vis-a-vis the definition contained in block 15. If an error is detected, status line 11 provides a diagnostic message to the user. The user can then correct the refinement contained in block 13 and try again. When no errors are detected, the contents of refinement storage block 13 are transferred through block 14 to system definition storage block 15. The iterative process continues until the system definition in block 15 is detailed enough.

In connection with the inputs to the FIG. 2 arrangement, it should be recognized that there are many ways of defining a system, and that the invention disclosed herein does not depend on that choice. The available choices include boolean expressions, directed graph descriptions, and others. In our implementation, we selected the signal graph approach, which is fairly conventional. In this approach, a system is defined as a collection of process states and transitions between the process states. At each process state, certain selections are possible as a function of the state. Associated with each state transition is an enabling predicate which is expressed in terms of the selections in this process state and other process states with which this process state communicates.

The syntax for describing the system as a collection of process states (nodes) and transitions (edges) forms a data flow language. Such a language includes means for identifying nodes and for identifying the edges the S/R language, which is modeled after the s/r model of coordination, is the language we use. It is basically defined in Appendix A.

The primary formal verification performed in block 14 is the task of determining that every edge in the refined system definition of block 13 maps onto, or corresponds to, exactly one edge in the system definition of block 15. Basically, the task is to go through each edge in the state space representation of the specification in block 14 and determine that, in accordance with the specified mappings, there is a corresponding edge in the state space representation of the specification in block 15. A more detained description is presented infra.

With each successful conclusion of an iteration within block 10, the specification within block 13 is transferred to block 15, and system definition information within block 15 is communicated to verification block 20. As indicated above, block 20 verifies that the system definition contained in block 15 can properly execute the necessary tasks of the system. The user inputs task definitions into block 23. Block 24 receives from the user reduction information to permit the analysis/development apparatus of FIG. 2 to evaluate whether the tasks are being properly performed. More specifically, the user supplies task definitions to block 23 and reduction mappings to block 24. Each reduction $R_i$ is associated with a task $T_i$. With respect to task $T_i$ the correctness of system operation can be ascertained by determining whether the task is performed by the reduced version as defined by reduction $R_i$.

The reductions of block 24 are verified vis-a-vis the system definition provided by block 15. This verification is performed in reduction verification block 25. The verification is performed on one task at a time. That is, each reduction is tested to determine whether it is a valid reduction, which means that the reduction leaves the operation of the reduced system invariant vis-a-vis the task. Concurrently, the task is tested in block 26 with respect to its reduced system to determine that it can be performed properly. When an error is detected in either block 25 or block 26, status line 21 provides the user a diagnostic message which enables the user to correct the system definition, the tasks defined, or the reductions. When no errors are detected, the processing advances to the next task and corresponding reduction mapping, until all tasks pass the tests successfully. The actual testing that is performed in verifying each reduction mapping is the same as the testing performed in verifying the mappings associated with the system refinements (block 14). That is, mathematically, the relationship between the system reduction (relative to some task) and the unreduced system is much like the relationship between the system definition within block 15 and the refined system definition within block 13. As an aside, in some of the literature, these mappings are sometimes referred to as "homomorphisms".

Once the reductions have been verified in block 25, block 26 determines whether each of the specified tasks is properly executed by its reduced system. The verification of block 25 insures that if a task is performed by its reduced system, it is also performed by the unreduced system. Checking the reduced system, of course takes substantially less time. There are many algorithms for checking that a task is performed by a system. One such algorithm is described in an article by R. P. Kurshan titled "Reducibility on Analysis of Coordination", published in Lecture Notes in Computer Science (LNICS) 103 titled Discrete Event Systems: Models and Applications, Springer-verlag, pp. 19–39, (1987). As an aside, in some of the literature, these algorithms are sometimes referred to as "language containment" algorithms.

When all of the tasks have been analyzed successfully, status line 21 informs the user that the iteration is complete. Thereafter, the user advances to the next iteration. The user provides a refinement of the system (to block 10), defines a more comprehensive set of tasks to be performed by the refined systems and reductions for testing the new set of tasks.

As described above, the arrangement of FIG. 2 carries out the testing functions, and the successful end result is a specification within block 15 that is as detailed as necessary for carrying out all of the specified tasks; i.e. all of the target output signal can be developed for the various possible input signals. At this time code generator 30 is engaged to develop explicit code for implementing the finite state machine. This code can be targeted for installation into a stored program controlled processor that would embody the finite state machine, or it can be code that forms an input to a step of developing the necessary information for a special purpose hardware realization. Such information, for example, can be a "net list" that defines the connections between various elements of an integrated circuit embodiment. The net list can be used directly to build the target FSM, or it can be transformed to one or more masks that are used to manufacture integrated circuits that realize the target FSM.

Before providing additional details regarding the verifications performed in blocks 14, 25 and 26, a generalized example of the above-described principles may be beneficial.

Figure 4:
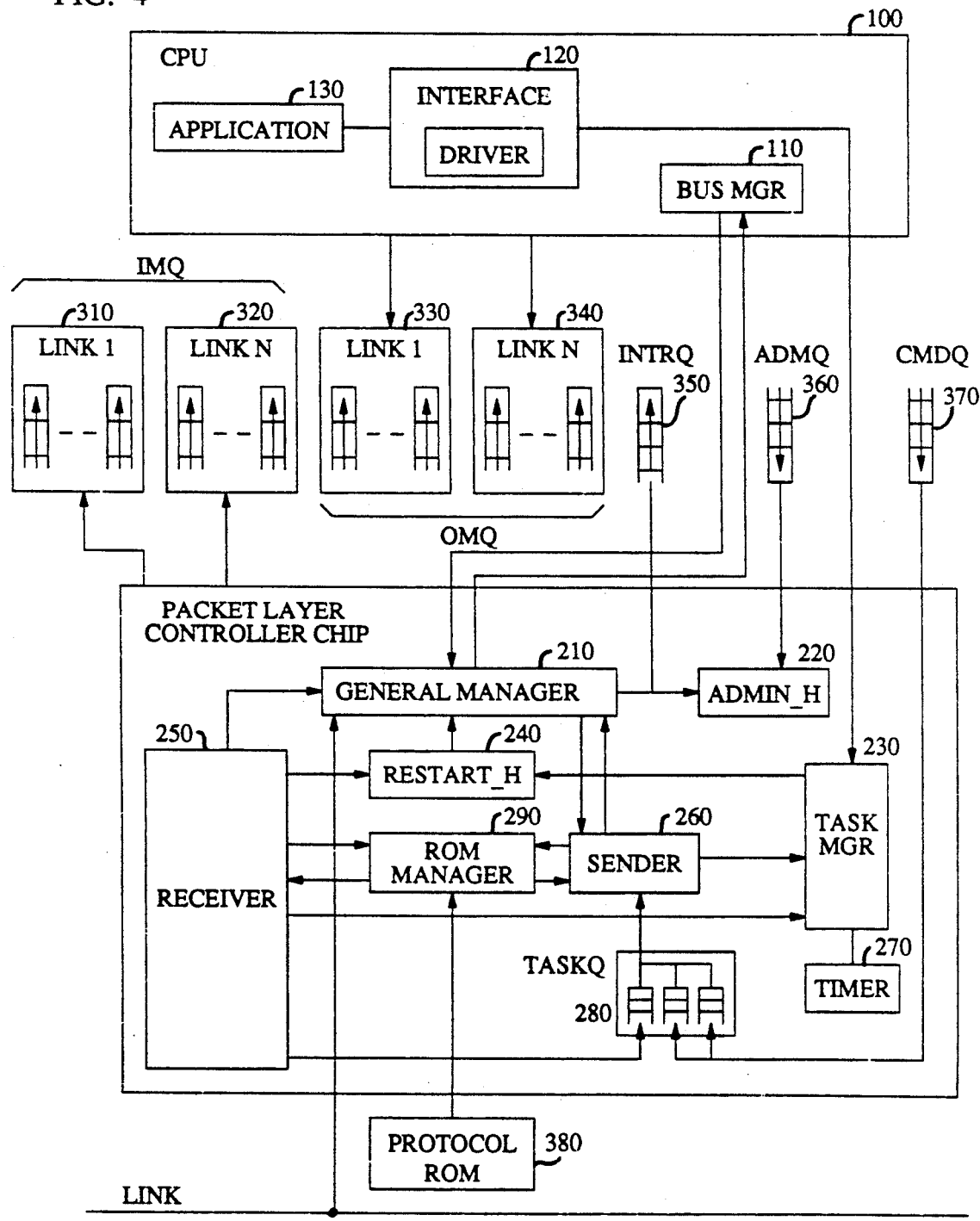
FIG. 4 presents an example of a protocol apparatus and the task-relative reductions that may be applied.

FIG. 4 presents a block diagram of a controller whose design is to be formally developed and verified in accordance with the principles of this invention. It includes, a CPU 100 and a packet layer controller (PLC) 200. CPU 100 includes a bus manager 110, interface driver 120 and applications 130. PLC 200 includes a general manager 210, an administration block 220, a task manager 230, a restart block 240, a receiver 250, a sender 260, a timer 270, a tasks queue block 280, and a ROM manager 290. Associated with the PLC are incoming and outgoing queues 310–370 and a protocol ROM 380.

One of the tasks that applications block 130 needs to have executed is an "enque-msg" task wherein the application outputs an "enque-msg" token and puts a message on an output message queue, e.g. queue 330. The "enque-msg" token is interpreted by driver 120 and sent to command queue 370. At the same time task manager 270 is informed of the insertion of the interpreted token into the command queue. The task manager picks the queued message off the command queue, brings it down to task queue 280, and from there sent it into sender 260. The sender gets access to the protocol in ROM 380, through ROM manager 290 and general manager 210. General manager 210 controls conflicts in the ROM and in the system bus which does the processing of the "enque-msg" task in accordance with the protocol. It eventually succeeds in moving the data from the output message queue down to the link.

In order to verify this task, it is necessary to reduce the complexity of the FIG. 4 system because the system is too complicated. That is, as it stands, there are too many states that the system may assume to permit an efficient verification (from the standpoint of computation effort). Hence, the reduction step described above. The aim of the reduction is to abstract the portions of the system which aren't involved the interaction with the "enque-msg" task and to reduce those portions to a much simpler set of blocks which interact with the job of the sender and the other components but which is not otherwise proactive in connection with the task at hand. As long as their interaction or interfering is at least as great as the interaction of the real components, a proof that the "enque-msg" task is performed with the reduced system is also a guarantee that the task will be performed with the unreduced system. One possible reduction, for example, may encompass blocks 310, 320, 350, 360, 220, 240, 250, and 290. On the other hand, it may turn out that even such a drastic reduction may not be encompassing enough.

One solution that can be employed is to decompose the "enque-msg" task into three subtasks. The first subtask may be to verify that when the application sends an "enque-msg", that the "enque-msg" token reaches the command queue. The second subtask may be to verify that, assuming the "enque-msg" token is somehow in the command queue, the task manager pulls it down properly to the sender. The third subtask may be to show that, assuming the "enque-msg" token is in the sender, the sender properly performs the data transfer to the link. To prove each of these subtasks, a much larger portion of the system may be encompassed in the reduced blocks. The resulting simpler system can then be analyzed and the subtasks proven more easily. Of course, there is an additional verification step that must be undertaken and that is to prove that performing the subtasks is tantamount of performing the original "enque-msg" task.

Returning to the verification performed in block 14, as indicated above, the relationship between the system specification in block 15 and the more refined system specification in bock 13 is defined by a mapping (homomorphism). To verify that the refined, more complex, specification is consistent with the less complex specification, it is necessary to test that whenever there is a transition from a state v to a state w in the more complex system which is enabled by a selection x and under the above mappings, v maps to v', w maps to w' and x maps to x', then the transition form v' to w' is enabled by x' (v', w' and x' relating to the less complex system).

The s/r model is employed to make the above evaluations. In simple terms, the s/r model may be explained by considering a global selection, a global state, and a multiplicity of component finite state machines that coordinate to form the overall finite state machine. At each iteration of this model, each of the component finite state machines selects an output from among the outputs that are possible from its current state, and thus contributes to the global selection. It then observes the global selection and moves to a next state to which the finite state machine may go. These iterations can continue ad infinitum.

We implement the s/r model for verification purposes in what we call the "crank machine". It includes a multiplicity of modules that correspond to the multiplicity of coordinating component finite state machines, and means for iterating through four steps. In addition to the two steps described above of making a selection and resolving to a state (which form steps 2 and 3 of the crank machine), the crank machine includes a first step of unpacking a global state from a register and applying it to the component state machines, and a fourth step of packing the new global state and storing it in the register. The register serves as a communications interface between the component finite state machines, which provides for the interaction that is necessary between the component finite state machines. Each of the component finite state machines is responsive to the global state, and each of the finite state machines contributes to the creation of the next global state.

Of course, having the mere capability to cycle through various states of the system specification is insufficient for the purpose of testing the system specification. Means must be provided to actually cycle through all of the possible states and selections. It should be kept in mind that a system can have several selections when it is in a given state and, conversely, for each selection there can be resolution to one of several states.

Figure 5:
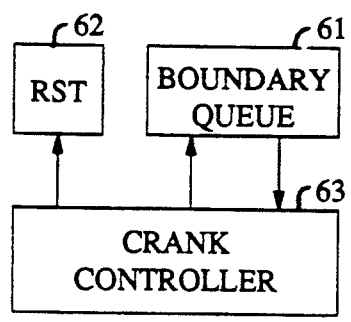
FIG. 5 presents a general block diagram of our embodiment of a "crank machine"

To test a system specification, we employ a boundary queue memory 61, a reached state table (RST) 62, and a crank machine controller 63, as shown in FIG. 5. The boundary queue is a stack that can be accessed from the top or the bottom, and it contains a list of global state pointers that point to states of the system within the RST. The crank machine controller (a software controlled processor) pops a state from the top of the boundary queue, unpacks the state and applies it to various modules that represent the component finite state machines. It then generates all of the possible selections, and for each selection generates all of the possible next states. With respect to each generated next state, the crank machine determines whether that state is already in the RST. If it's not in the RST, the crank machine adds the state to the RST and inserts a pointer in the boundary queue that points to the location of the inserted state in the RST. The pointer is inserted at the top of the boundary queue stack or at the bottom of the boundary queue stack, depending on the value of an acceptance criterion. More particularly, the pointer is inserted at the top of the stack when it is determined that access to the state was across a "recur" edge. This concept is found in the aforementioned LNICS paper by R. P. Kurshan.

Figure 6:
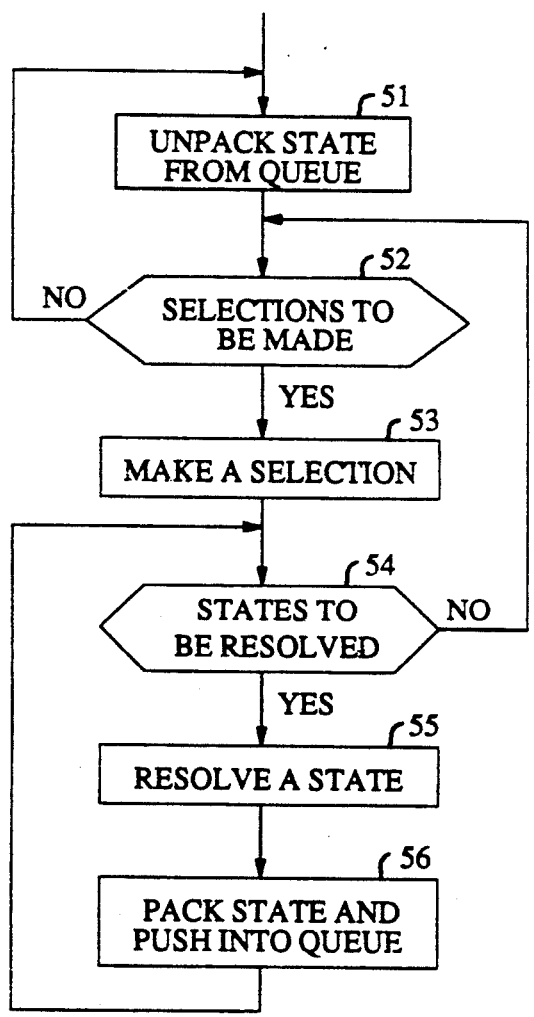
FIG. 6 depicts a flow chart for cycling through selections and states.

The above-described process follows basically the flow of FIG. 6. In block 51, the state is unpacked from the buffer queue. In block 52, a determination is made whether there are selections to be made in the system which have not been made previously. When the answer is affirmative, a selection is made in block 53 and control passes to block 55. Otherwise, control passed back to block 51 where another system state is popped from the stack and unpacked by the crank machine.

In block 54 a determination is made whether there are states to which the system can move (based on the selection made) which haven't been identified before. When the answer is affirmative, block 55 resolves to that state and block 56 packs the resolved state and pushes it onto the boundary queue stack. When no additional states can be resolved, control passes back to block 52 to make another selection.

Block 56 in FIG. 6 includes the logic for determining whether to push the packed state into the top of boundary queue stack 61 of into it bottom. Block 52 includes the logic for cycling through the various selections that are made by the component finite state machines.

The modules within the crank machine controller correspond to the component finite state machines. In accordance with our invention, these modules are created by compiling the S/R language specification. Our compiler creates a code that converts the specification to a collection of switch action statements with a structure as outlined in the C-like code of FIG. 7. FIG. 7 is merely illustrative and it is not intended to be exact. Executing the code "ccode.c" presented in the appendix B provides all of the necessary details for developing the actual code that FIG. 7 represents. For the illustrative purposes herein, FIG. 7 includes the "set state vector" construct to mark the effort of blocks 52 and 54 in connection with the cycling through all possible selections and all possible states that exist in the case statements that follow. FIG. 7 also includes a companion error statement with each of the action statements. The error statement entries represent the testing that is performed to effect the desired verification. One such testing is the stability testing. To test stability, one must determine that the specification is consistent with a continuous time asynchronous system definition. The theoretical treatment of the stability issue is presented in an article to be published, which is included herein in appendix D and made a part of this specification. The code for executing the stability test is included in the appendix C. It should be kept in mind that FIG. 7 represents only one component finite state machine and that the states and selections discussed above relate to global selections and global states.

The above describes the process of cycling through the various states that are possible and the various selections that are available. To perform the verification of block 14, the above process is applied to both, the specification of block 13 and the specification of block 15. The process is applied to both system simultaneously and at each step a determination is made to ascertain that when the system of block 13 experiences a transition from a state v to a state w which is enabled by a selection x, and the system of block 15 experiences the transitions from v' to w' in accordance with selection x', that v', w' and x' are related to v, w, and x by the mapping of block 13.

As indicated above, the verification process associated with block 25 is identical in kind to the verification process of block 14 and, therefore, for the sake of brevity, no more is said about it.

As for the code generator (block 30), it develops basically the same collection of switch statements that are created in the verification process of block 14. The only difference is that the testing submodules that are incorporated in the switch statements to cycle through all the possible states, for example, are removed. Also removed, of course, are the "error statements" entries of the FIG. 7 illustration. The result is that the code generator develops a code that has no calls to functions or subroutines. All of the decisions are made on one "level" of the switch statement. The results is that when the signals set that corresponds to the code package developed by the code generator is installed in a target machine (processor - memory combination) the resulting finite state machine is extremely fast. The difference between the finite state machine that is created with the signal set of code generator 30 and finite state machines developed by other means is akin to the difference in speed between a multiplier that comprises a processor that calculates products in accordance with some algorithm and a multiplier that comprises a lookup table (with the finite state machine of this invention being more like the look-up table).

Still, without more, the code generated by block 30 would comprise a collection of finite state machines. A still better product results, in accordance with our invention, by merging various subsets of the individual finite state machines into respective single one's. Practically, that means combining a number of switch statements into a single switch statement. Accomplishing such merging is not difficult; one needs only to realize of its effect, which is to decrease execution time at the possible expense of increased memory in software.

This effect of code lengthening in consequence of merging may be ameliorated by another step carried out in block 30, and that is a step of relative reduction on each of the various merged machines. The concept of reduction is not new. Conventional finite state machine reduction algorithms look at all possible input values and reduce the system to allow it to respond to those possible inputs. The reduction occurs by virtue of the limitation on the possible inputs. See J. E. Hopcroft in "An n log n Algorithm for Minimizing the States in a Finite Automation", Theory of Machines and Computations, (Kohavi, Paz, eds.) Academic Press, pp. 189-196. Our reduction is improved in that we look at the possible inputs at the various states of the FSM. Since not all inputs are possible at all of the states, the reduction that we achieve by considering individual states may be substantially greater than that which is available conventionally.

In summary, the way the analyzer/developer structure works is that the user specifies the general architecture, functionality for the components, and the tasks. The analyzer/developer then verifies that the tasks can be performed and allows the user to iteratively refine the system definition and the tasks to be performed by the refined system.

The difference between the top-down stepwise refinement approach of this invention and the conventional development approach is that the conventional development approach creates modules, one at a time, with complete functionality within each module. As new modules are added, new behaviors are added to the system. In accordance with this invention, on the other hand, the entire system is defined ab initio; first at a very abstract level and then at levels of increasing detail. Because at the highest level the system is very abstract, low level questions such as pertaining th checking correctness of the syntax of a datum, are left nondeterministic. For example, at the high level of specification a particular message could nondeterministically have good syntax or bas syntax. Both are possible. This is refined in subsequent levels to a system in which the syntax is defined and checked to yield the condition that a particular message will have either good syntax or bad syntax, but not both.

Viewed still differently, in accordance with this invention behaviors are removed rather than added. This distinction is particularly salient because when one expects to be able to prove something about the system as it is being developed, it is not possible to prove something about the behavior of a system when behaviors are added. The reason for that is that when something is proven about a component and then behaviors are added, it is no longer possible to know whether the previously proven proposition still holds. On the other hand, when behaviors are removed and it has been proved that all the behaviors of the abstract system are satisfactory, then it certainly remains true about the refined system of fewer behaviors. As a result, one important benefit of the approach of this invention is that it enables the user to detect fundamental designer errors at a very early time in development rather than having to wait until the full instantiations of all the elements of all the components is complete.

APPENDIX A

```
/*
 * SELECTION RESOLUTION LANGUAGE
 * --- GRAMMAR SPECIFICATION ---
 *
 * (Excerpt from parse.y 6.3 (AT&T-BL) 2/22/90)
 *
 *
 * SYSTEM:
 */
system
/*1*/   :       external_declaration_statements processes
        ;
external_declaration_statements
/*2*/   :       /*empty*/
/*3*/   |       external_declaration_statements macro_statement
/*4*/   |       external_declaration_statements type_statement
/*5*/   |       external_declaration_statements hom_statement
        ;
processes
/*6*/   :       /*empty*/
/*7*/   |       processes proc_block
/*8*/   |       processes proctype_block
/*9*/   |       processes code_block
        ;
/*
 * PROC BLOCK:
 */
local_name
/*10*/          :       NAME
        ;
proc_block
/*11*/  :       proc_head body END opt_name
/*12*/  |       proc_head named_subscripts':' prototype  /* array of proc's */
/*13*/  |       error
        ;
```

```
opt_name
/*14*/          :       /*empty*/
/*15*/          |       NAME
/*16*/          |       NAME '(' ')'
                ;
proc_head
/*17*/          :       PROC local_name
/*18*/          |       MONITOR local_name
/*19*/          |       FREE PROC local_name
/*20*/          |       REDUCE FNAME PROC local_name
/*21*/          |       MERGE FNAME PROC local_name
                ;
named_subscripts
/*22*/          :       /*empty*/
/*23*/          |       named_subscripts '[' local_name RELOP expr ']'
                ;
/*
 * PROCTYPE BLOCK:
 */
proctype_block
/*24*/          :       proctype_head '(' opt_formals ')' body END opt_name
/*25*/          |       proctype_head ':' prototype /* projection not implemented yet*/
/*26*/          |       proctype_head '(' opt_formals ')' ':' prototype /* fancy */
                /*      This format can be replaced by the first format      */
                /*      using a body with a single subprocess (defined as a  */
                /*      prototype) and a rsel to push its selection outside. */
                ;
proctype_head
/*27*/          :       PROCTYPE local_name
                ;
opt_formals
/*28*/          :       /*empty*/
/*29*/          |       formals
/*30*/          |       error
                ;
formals
/*31*/          :       formal
/*32*/          |       formals ';' formals
                ;
formal
/*33*/          :       variable_declaration
/*34*/          |       variables ':' TYPE /*not implemented*/
/*35*/          |       variables ':' BOOLEAN
                ;
/*
 * PROTOTYPE:
 */
prototype
/*36*/          :       local_name '(' opt_actuals ')'
                /*this include the unimplemented case when NAME is a formal parameter*/
                ;
opt_actuals
/*37*/          :       /*empty*/
/*38*/          |       actuals
                ;
actuals
/*39*/          :       expr
/*40*/          |       expr '@'
/*41*/          |       asterisk
/*42*/          |       actuals ',' actuals
                ;

/*
 * BODY:
 */
body
/*43*/          :       declaration_statements transition_structure opt_semicolon opt_code
/*44*/          |       declaration_statements processes
declaration_statements
/*45*/          :       /*empty*/
/*46*/          |       declaration_statements selvar_statement
/*47*/          |       declaration_statements stvar_statement
/*48*/          |       declaration_statements import_statement
/*49*/          |       declaration_statements macro_statement
/*50*/          |       declaration_statements bigmac_statement
/*51*/          |       declaration_statements type_statement
/*52*/          |       declaration_statements init_statement
```

```
/*53*/          |       declaration_statements cyset_statement
/*54*/          |       declaration_statements recur_statement
/*55*/          |       declaration_statements rsel_statement
/*56*/          |       declaration_statements hom_statement
/*57*/          |       declaration_statements error
                ;
opt_semicolon
/*58*/          :       /*empty*/
/*59*/          |       ';'
                ;
/*
* CODE
*/
opt_code_block
/*60*/          :       /*empty*/
/*61*/          |       code_block
                ;
code_block
/*62*/          :       CODE opt_code_defs '$' '$'
                ;
opt_code_defs
/*63*/          :       /*empty*/
/*64*/          |       code_defs
                ;
code_defs
/*65*/          :       code_def
/*66*/          |       code_defs ',' code_def
                ;
code_def
/*67*/          :       NAME /*shorthand for NAME ASSIGN NAME*/
/*68*/          |       path '.' NAME /*shorthand for NAME ASSIGN path '.' NAME*/
/*69*/          |       NAME ASSIGN expr
                ;
/*
* STVAR & SELVAR STATEMENT:
*/
stvar_statement
/*70*/          :       STVAR variable_declaration /*vector version not supported*/
/*71*/          |       stvar_statement ';' variable_declaration
                ;
selvar_statement
/*72*/          :       SELVAR extended_variable_declaration
/*73*/          |       selvar_statement ';' extended_variable_declaration
                ;
variable_declaration
/*74*/          :       variables ':' INTEGER
/*75*/          |       variables ':' STRING
/*76*/          |       variables ':' '(' items ')'
/*77*/          |       variables ':' NAME
/*78*/          |       variables ':' record_statement END
/*79*/          |       variables ':' packed_record_statement END
/*80*/          |       variables ':' PROC
/*81*/          |       variables ':' null_proc
/*82*/          |       variables error
                ;
record_statement
/*83*/          :       RECORD variable_declaration
/*84*/          |       record_statement ';' variable_declaration
                ;
packed_record_statement
/*85*/          :       BIGREC variable_declaration
/*86*/          |       packed_record_statement ';' variable_declaration
                ;
extended_variable_declaration
/*87*/          :       variable_declaration
/*88*/          |       equivalences
/*89*/          |       liftings
                ;
equivalences
/*90*/          :       local_name ASSIGN path
/*91*/          |       equivalences ',' equivalences
                ;
liftings
/*92*/          :       lifting
/*93*/          |       liftings ',' liftings
                ;
```

```
lifting
/*94*/          :       local_name '.' local_name
/*95*/          |       lifting '.' local_name
                ;
variables
/*96*/          :       variable
/*97*/          |       variables ',' variable
                ;
variable
/*98*/          :       local_name
/*99*/          |       variable '[' expr ']'
                ;
/*
 * TYPE STATEMENT:
 */
type_statement
/*100*/         :       TYPE variable_declaration
/*101*/         |       type_statement ';' variable_declaration
                ;
/*
 * IMPORT STATEMENT:
 */
import_statement
/*102*/         :       IMPORT import_declaration
/*103*/         |       import_statement ',' import_declaration
                ;
import_declaration
/*104*/         :       expr
                ;
/*
 * BIGMAC STATEMENT
 */
bigmac_statement
/*105*/         :       BIGMAC bigmac_definition
/*106*/         |       bigmac_statement ',' bigmac_definition
                ;
bigmac_definition
/*107*/         :       local_name ASSIGN expr
                ;
/*
 * MACRO STATEMENT
 */
macro_statement
/*108*/         :       MACRO macro_definition
/*109*/         |       macro_statement ',' macro_definition
                ;
macro_definition
/*110*/         :       local_name ASSIGN expr
                ;
/*
 * TRANSITION STRUCTURE:
 */
transition_structure
/*111*/         :       TRANS transition_block
/*112*/         |       transition_structure ';' transition_block
                ;
transition_block
/*113*/         :       state_predicate selection_predicate transitions
/*114*/         |       error
                ;
state_predicate
/*115*/         :       items
                ;
selection_predicate
/*116*/         :       /*empty*/
/*117*/         |       '{' vector_selections '}' /*still not fully implemented*/
/*118*/         |       '{' scalar_selections '}'
/*119*/         |       '{' error '}'
                ;
scalar_selections
/*120*/         :       expr ':' items
/*121*/         |       expr ':' ':' items
/*122*/         |       items
                ;
vector_selections
/*123*/         :       vector_selection ':' vector_selection
```

```
/*124*/         |       vector_selection
/*125*/         |       vector_selections ';' vector_selection
                ;
vector_selection
/*126*/         :       select_assignment
/*127*/         |       vector_selection ',' select_assignment
                ;
select_assignment
/*128*/         :       path ASSIGN expr
/*129*/         |       path ASSIGN error
                ;
transitions
/*130*/         :       transition
/*131*/         |       transitions opt_comma transition
                ;
transition
/*132*/         :       opt_path ARROW scalar_state ':' expr
/*133*/         |       error
                ;
opt_comma
/*134*/         :       /*empty*/
/*135*/         |       ','
                ;
/*
 * INIT STATEMENT:
 */
init_statement
/*136*/         :       INIT scalar_init
/*137*/         |       INIT vector_init
                ;
scalar_init
/*138*/         :       scalar_state
/*139*/         |       '[' NAME IN loop_items ']' '{' scalar_init '}'
/*140*/         |       asterisk /*unimplemented yet*/
/*141*/         |       scalar_init ',' scalar_init
                ;
scalar_state
/*142*/         :       expr '@'
/*143*/         |       expr
/*144*/         |       error
                ;
vector_init
/*145*/         :       vector_state
/*146*/         |       '[' NAME IN loop_items ']' '{' vector_init ';' '}'
/*147*/         |       vector_init ';' vector_init
                ;
vector_state
/*148*/         :       path ASSIGN scalar_state
/*149*/         |       '[' NAME IN loop_items ']' '{' vector_state '}'
/*150*/         |       vector_state ',' vector_state
                ;
/*
 * RECUR STATEMENT
 */
recur_statement
/*151*/         :       RECUR scalar_recur
/*152*/         |       RECUR vector_recur /* not implemented */
                ;
scalar_recur
/*153*/         :       scalar_state ARROW scalar_state
/*154*/         |       scalar_state ARROW asterisk      /*arbitrary endpoint*/
/*155*/         |       asterisk ARROW scalar_state      /*arbitrary starting point*/
/*156*/         |       scalar_state ARROW '@'  /*self edge*/
/*157*/         |       scalar_recur ',' scalar_recur
                ;
vector_recur
/*158*/         :       vector_state ARROW vector_state
/*159*/         |       vector_state ARROW asterisk
/*160*/         |       asterisk ARROW vector_state
/*161*/         |       vector_state ARROW '@'
/*162*/         |       vector_recur ';' vector_recur
                ;
/*
 * CYSET STATEMENT
 */
```

```
cyset_statement
/*163*/        :        CYSET scalar_cyset
/*164*/        |        CYSET vector_cyset
               ;
scalar_cyset
/*165*/        :        '{' scalar_cycle '}'
/*166*/        |        '[' NAME IN loop_items ']' '{' scalar_cyset '}'
/*167*/        |        scalar_cyset ',' scalar_cyset
               ;
scalar_cycle
/*168*/        :        scalar_state
/*169*/        |        '[' NAME IN loop_items ']' '{' scalar_cycle '}'
/*170*/        |        asterisk '@'
/*171*/        |        scalar_cycle ',' scalar_cycle
               ;
vector_cyset
/*172*/        :        '{' vector_cycle '}'
/*173*/        |        '[' NAME IN loop_items ']' '{' vector_cyset '}'
/*174*/        |        vector_cyset ',' vector_cyset
               ;
vector_cycle
/*175*/        :        vector_state
/*176*/        |        '[' NAME IN loop_items ']' '{' vector_cycle ';' '}'
/*177*/        |        vector_cycle ';' vector_cycle
               ;
/*
 * RSEL STATEMENT:
 */
rsel_statement
/*178*/        :        RSEL reductions
               ;
reductions
/*179*/        :        path ASSIGN expr
/*180*/        |        error
/*181*/        |        '[' NAME IN loop_items ']' '{' reductions '}'
/*182*/        |        reductions ',' reductions
               ;
/*
 * HOM STATEMENT:
 */
hom_statement
/*183*/        :        HOM homomorphisms
homomorphisms
/*184*/        :        path ASSIGN expr /*RHS refers to hom domain*/
/*185*/        |        error
/*186*/        |        '[' NAME IN loop_items ']' '{' homomorphisms '}'
/*187*/        |        homomorphisms ',' homomorphisms
               ;
/*
 * EXPRESSIONS
 */
opt_path
/*188*/        :        /*empty*/
/*189*/        |        path
               ;
path
/*190*/        :        NAME %prec ','
/*191*/        |        path '.' path
/*192*/        |        path '[' expr ']'
/*193*/        |        '.' path /*absolute path-name*/
               ;
expr
/*194*/        :        '(' expr ')'
/*195*/        |        expr '+' expr
/*196*/        |        expr '*' expr
/*197*/        |        expr '-' expr
/*198*/        |        '-' expr
/*199*/        |        expr DIVOP expr
/*200*/        |        expr '^' expr
/*201*/        |        expr '?' expr '|' expr
/*202*/        |        expr RELOP expr
/*203*/        |        '~' expr
/*204*/        |        '+' '[' NAME IN loop_items ']' expr %prec '+'
/*205*/        |        '*' '[' NAME IN loop_items ']' expr %prec '*'
/*206*/        |        '|' '[' NAME IN loop_items ']' expr '?' expr '|' expr
```

```
/*207*/         |       path
/*208*/         |       NUMBER
/*209*/         |       ATOM
/*210*/         |       '(' path ':' items ')'
/*211*/         |       null_proc
                ;
null_proc
/*212*/         :       local_name '(' ')'
                ;
loop_items
/*213*/         :       expr
/*214*/         |       expr DOTS expr/*range bounded by constant integers*/
/*215*/         |       loop_items ',' loop_items
                ;
items
/*216*/         :       expr
/*217*/         |       expr DOTS expr
/*218*/         |       items ',' items
                ;
asterisk
/*219*/         :       '*'
```

APPENDIX B

```
static char WHAT[] = "@(#)ccode.c   6.3 (AT&T-BL)   2/22/90   20:46:14";
/*
 *   Release 1.1 - November 5, 1985.
 *   Release 2.1 - June 5, 1986.
 *   Release 3.1 - August 27, 1986.
 *   Release 4.1 - February 19, 1987.
 *   Release 5.1 - September 27, 1987.
 *   Release 6.1 - October 17, 1989.
 *
 *   Author: Zvi Har'El, AT&T Bell Labs, Murray Hill, NJ 07974,
 *           and the Technion, Israel Institute of Technology.
 *   Copyright (C) AT&T Bell Laboratories
 */
#include "sr.h"
#include "parse.h"
extern char *cintype();/*return C-int type*/
extern targetbytesize;
static bits_string;
static labnum;
int indent = -1;
int *substack;
int endom;
Name **gnames;
Vertex *topfree;

ccode ()                                                                        ccode
/* C-code generator */
{
    int i, j;
    static void sortnames();
    if (!(subarray = (int*) malloc (indices)))
        syserr ("Can't allocate subscript array");
    if (!(substack = (int*) malloc (depth (proc) * sizeof (int))))
        syserr ("Can't allocate subscript stack");
    if (option['i'] && targetbytesize) {
        static char *Int[]={"char","short","long","long"};
        for (i = 0; i < 4; i++)
            out (1, "#ifndef Int%d\n#define Int%d %s\n#endif\n",
                i + 1, i + 1, Int[i]);
    } else out (1, "#ifndef Int\n#define Int int\n#endif\n");
    if (strings) {
        for (j = strings - 1; j; j >>= 1) bits_string++;
        if (!(gnames = (Name**) malloc (strings * sizeof (Name*))))
            syserr ("Can't allocate global name table");
        sortnames(names);
#ifndef NOENUM
        if (option['i']) {
#endif
            for (i = 0; i < strings; i++) {
                out (1, "#define ");
                cid (gnames[i]);
                out (0, " %d\n", i);
            }
            out (1, "#define String %s\n", cintype (bits_string));
#ifndef NOENUM
        } else {
            out (1, "typedef enum{\n");
            for (i = 0; i < strings; i++) {
                if (i) out (0, ",\n");
                tab (2);
                cid (gnames[i]);
            }
            outc ('\n');
            out (1, "}String;\n");
        }
#endif
    } else out (1, "#define String Int\n");
    vars (proc, !option['i'], C, 0);
    if (option['i']) {
        /*implementation code has no local vars in the procs.
        thus we have to declare here the block counter/stvar for merged procs
```

```
          and the block counters for all processes with multiple blocks*/
                bstor (proc, 0);
          }
          if (proc->type.p.bigm) out (1, "#define BIGM\n");
          if (!option['i']) {
#ifdef NOENUM
                out (1, "#define NCENUM\n");
#endif
                out (1, "#define STATESIZE %d\n",
                     (proc->ext.bits-1)/(int)BITS+1);
                if (merging) {
                    out (1, "#define MERGING ");
                    cpath (merging);
                    outc ('\n');
                    out (1, "#define MBITS %d\n", merging->ext.bits);
                    out (1, "#define MTRANS %d\n", trans (merging, 1, 0));
                    out (1, "int moffset=%d,mreduce=%d;\n",
                              merging->ext.offset,
                              merging->type.p.reduced);
                    out (1, "char mergename[]=\"%s\";\n", mergename);
                }
                if (!option['n'] && pause) out (1, "#define PAUSE\n");
                if (homverify) {
                    out (1, "#define HOMVERIFY '%c'\n", homverify);
                }
                out (1, "#include <crank.h>\n");
          } else out (1, "#include <crunch.h>\n");
          procs (0,0,0);/*dummy arguments, for lint's sake*/
          labnum = 0;
          liststate (1);
          labnum = 0;
          listsel ((Vertex*)0);
          if (merging) {
                static int inputs();
                labnum = 0;
                inputs (0);
                exports (merging, (Vertex*)0);
          }
          if (!option['i']) {
                if (j = cysets(proc, 0, (Vertex *)0)) {
                    out (1, "int cy_num=%d;\n", j);
                    out (1, "Cyset cyset[%d]={\n", j);
                    for (i = 0; i < j; i++)
                        out (2, "{sizeof cy_%d/sizeof newstate/2,0,cy_%d},\n", i, i);
                    out (1, "};\n");
                } else {
                    out (1, "int cy_num=0;\n");
                    out (1, "Cyset cyset[1]/*dummy*/;\n");
                }
          }
          out (1, "int strings=%d;\n", strings);
          out (1, "char *names[%d]={\n", strings + 1);
          for (i = 0; i < strings; i++)
                out (2, "\"%s\",\n", gnames[i]->s);
          out (2, "0\n");
          out (1, "};\n");
          out (0, "/*Process hierarchy\n");
          toc (proc, -1);
          out (0, "*/\n");
} procs (where, skip, mergf)                                                   procs
/*
 * Generate C-code to crank a process. Calls itself recursively to generate
 * all processes.
 *
 * The process block structure is as follows:
 * (i1, i2 are generated ids for array indices, n1, n2 are integer constants)
 *
 *{/*loop[i1<n1][i2<n2]*
 *      register i1=0,i2=0;
 *L3:
 *      ......... (children processes, if any)
 *proc7:
 *{/*7*proc P[i1][i2]*
 *      static struct local{
 *      .......... (local variables)
 *      }local[...][n1][n2];
 *      register struct local *S= &local[...][i1][i2];
 *      switch(f){
 *      ........... (crank code)
 *      }
 *      switch(f){
 *      ........... (embedded C-code)
 *      }
 *      if(skip)goto proc5;
 *}/*7*end P[i1][i2]*
 *      if(++i2<n2||(i2=0,++i1<n1))goto L3;
 *}/*end[i1<n1][i2<n2]*
 *
 * The extra subscripts in the local[...] are inherited from ancestral array processes.
 *
 * The 'goto proc5' , i. e. skip to the the block of the effective parent,
 * where the index is given by the parameter 'where',
 * is replace by a 'goto end' for external processes (where=-1).
 * This skip statement is generated if the boolean parameter 'skip' is set
 * upon entry to procs(). This happens if the current process has a right sibling
 * or if its parent is degenerate (has no code associated with it) and had its
 * 'skip' parameter set.
 *
 * The local varivles are as follows:
 *      a - flag, set for recur resolution (-1 for * in LHS)
 *      b - transition block index.
 *      e - "else" flag.
 *      g - flag, set for blocks with pause selection (-1 for double colon)
```

```
 *      j - resolution index.
 *      s - selection index.
 *      n - number of resolutions for current selection.
 *      p - current state (double)pause bit.
 *      r - recur LHS index (-1 for *).
 *      L - next state (double) pause bit.
 *      l - next state category (SELF/UNST/SET/SSELF).
 */
{
        Vertex *z, *w, *u, *v;
        Vertex *stvar=0, *selvar=0, *codep=0, *selhom=0, *sthom=0;
        int i, j, here, back;
        static procnum;
        int blocks = 0, arrows = 0, inits = 0, rsels = 0, recurs = 0, cysets = 0;
        if (!proc->ext.parent){
                if (proc->type.p.code) for (w = proc->child.v; w; w = w->sibling)
                        if (w->op == CODE) {
                                copycode (w);
                                break;
                        }
                out (1, "BEGIN\n");
                for (w = proc->child.v; w; w = w->sibling) if (w->op == PROC) {
                        proc = w;/* child will restore original value!*/
                        procs(-1, !!w->sibling,
                                w->type.p.merging);
                }
                out (1, "END\n");
                if (proc->type.p.bigm) {
                        bigmacs ();
                        out (2, "goto begin;\n");
                        out (1, "}\n");
                }
                return;
        }
        here = procnum++;
        for (w = proc->child.v; w; w = w->sibling) switch (w->op) {
        case INIT:
                inits++;
                break;
        case CYSET:
                cysets++;
                break;
        case RECUR:
                recurs++;
                break;
        case RSEL:
                rsels++;
                break;
        case SELVAR:
                if (proc->type.p.sel && !proc->type.p.vsel ||
                        option['i'] && w->type.i == ASSIGN) selvar = w;
                break;
        case STVAR:
                if (proc->type.p.st && !proc->type.p.vst) stvar = w;
                break;
        case TRANS:
                blocks++;
                for (i=0, u=w->child.v;u;u=u->sibling) if (u->op == ARROW) i++;
                if (i > arrows) arrows = i;
                break;
        case CODE:
                codep = w;
                break;
        case HOM:
                if (!(u = w->child.v)->op) {
                        if (u->child.v->op == SELVAR)
                                selhom = w;
                        else if (u->child.v->op == STVAR)
                                sthom = w;
                }
        }
        if (option['i']) {
                cysets = 0;
                recurs = 0;
                inits = !!inits;
        }
        if (homverify) {
                recurs = 0;
                if (homverify == 'f')
                        cysets = 0;
        }
        if (proc->type.p.free && !proc->ext.parent->type.p.free)
                topfree = proc;
/* Do nothing for a degenerate process*/
        if (proc->type.p.prod && !proc->ext.bounds && !inits && !cysets && !proc->type.p.sel &&
                !proc->type.p.merged &&!codep&&!selhom) {
                if (proc == target){
                        out (1, "endom:\n");
                        endom = 1;
                }
                for (w = proc->child.v; w; w = w->sibling) if (w->op == PROC) {
                        proc = w;/* child will restore original value!*/
                        procs(where, skip || w->sibling, mergf || w->type.p.merging);
                }
                proc = proc->ext.parent;
                return;
        }
/* Initialize array indices */
        if (w = proc->ext.bounds)
                loopstart (&back, proc->ext.range->child.i, w);
/* Generate children processes */
        if (proc->type.p.prod && !proc->type.p.merged){
                for (w = proc->child.v; w; w = w->sibling) if(w->op==PROC) {
```

```
                    proc = w; /* child will restore original value! */
                    procs(here, !!w->sibling, mergf || w->type.p.merging);
            }
            out (1,"procid:\n", here);
        }
/* Start process block */
        if (!proc->type.p.free) {
                out (1,"/*%d*proc ", here);
                srpath (proc);
                if (proc->type.p.merged) {
                        if (proc->type.p.reduced) out (0, "(reduced)");
                        else out (0, "(merged)");
                }
                out (0, "*/\n");
                indent++;
        }
/*
 * Generate code at the merged level
 */
        if (proc->type.p.merged) {
                codep = 0;
                mcode (here);
/*
 * Generate code for a free process
 */
        } else if (proc->type.p.free) {
                fcode (where, skip);
/*
 * Generate code at the product level:
 *
 * Generate local structure declaration, needed if two or more
 * initial states are declared in this process.
 */
        } else if (proc->type.p.prod) {
                if(inits>1){
                        out (1, "static struct local{\n");
                        out (2, "int j;\n");
                        out (1, "}local");
                        bounds (proc);
                        out (0, ";\n");
                        out (1, "register struct local *S= &local");
                        subs (proc);
                        out (0, ";\n");
                }
                if (cysets || inits || rsels || selhom) {
                        out (1, "switch(f){\n");
/* Generate code to initialize higher level cyset tables */
                        if (cysets) {
                                out (1, "case BEG_INIT:\n");
                                out (2, "i=");
                                running ();
                                out (0, ";\n");
                                /* loop on all cysets */
                                for (i=0, w=proc->child.v; i<cysets; w=w->sibling) if (w->op == CYSET)
                                        /* loop on all states in a cyset */
                                        for (j=0, z=w->child.v;z;j+=2,z=z->sibling)
                                                /* loop on all components of a state */
                                                for (u=z->child.v; u; u=u->sibling) {
                                                int off = offset (u->child.v);
                                                if (u->op != ASSIGN){
                                                        cerror (u->line, "ASSIGN expected");
                                                        break;
                                                }
                                                /* we assume here that the lhs is a scalar stvar,
                                                so that v->ext.parent is a process, so we know
                                                where to set the pause bit. also, the array o... : !
                                                is the same for both v and v->ext.parent*/
                                                if (!(v=getvar(u->child.v)) || v->op != STVAR) {
                                                        cerror (u->child.v->line, "illegal lhs of cyset");
                                                        continue;
                                                }
                                                if (v->ext.parent->type.p.paus) {
                                                        out (2, "set(cy->p+%d*STATESIZE+", j++);
                                                        out (0, "(%d+1)/BITS,(%d+1)%%BITS,%d,%d);\n",
                                                                v->ext.parent->ext.offset + off,
                                                                v->ext.parent->ext.offset + off,
                                                                endom + 1, endom + 1);
                                                        out (2, "set(cy->p+%d*STATESIZE+", j--);
                                                        out (0, "(%d+1)/BITS,(%d+1)%%BITS,%d,%d);\n",
                                                                v->ext.parent->ext.offset + off,
                                                                v->ext.parent->ext.offset + off,
                                                                endom + 1,
                                                                u->child.v->sibling->op == '@' ?
                                                                endom + 1 : 0);
                                                }
                                                out (2, "set(cy->p+%d*STATESIZE+", j++);
                                                out (0, "(%d+1)/BITS,(%d+1)%%BITS,%d,BIG);\n",
                                                        v->ext.offset + off, v->ext.offset + off,
                                                        v->ext.bits);
                                                out (2, "set(cy->p+%d*STATESIZE+", j--);
                                                out (0, "(%d+1)/BITS,(%d+1)%%BITS,%d,",
                                                        v->ext.offset + off, v->ext.offset + off,
                                                        v->ext.bits);
                                                if (u->child.v->sibling->op == '@')
                                                        expl (u->child.v->sibling->child.v);
                                                else expl (u->child.v->sibling);
                                                out (0, ");\n");
                                                }
                                        out (2, "cy++;\n");
                                        i++;
                                }
                        }
```

```
/* Generate code for higher level init statement */
                if (inits) {
                    if (!cysets) out (1, "case BEG_INIT:\n");
                    if (inits > 1)
                        out (2, "S->j=%d;\n", inits - 1);
                    if (!option['i']) out (1, "case CONT_INIT:\n");
                    out (2, "i=");
                    running ();
                    out (0, ";\n");
                    if (inits > 1){
                        indent++;
                        out (1, "if(!skip&&++S->j>%d)S->j=0;\n", inits - 1);
                        out (1, "switch(S->j){\n");
                        out (1, "case 0:\n");
                    }
                    /* loop over all initial states */
                    for (i=0,w=proc->child.v;i<inits;w=w->sibling)if(w->op==INIT) {
                        /*loop over all components of each state*/
                        for (z=w->child.v;z;z=z->sibling) {
                            if (z->op != ASSIGN)
                                cerror (z->line, "ASSIGN expected");
                            if (!(v = getvar (u = z->child.v)) || v->op != STVAR)
                                cerror (u->line, "illegal lhs of init");
                            if (homverify||option['i']) {
                                tab (2);
                                expl (u);
                                out (0, "= ");
                                if (u->sibling->op == '@')
                                    expl (u->sibling->child.v);
                                else expl (u->sibling);
                                out (0, ";\n");
                            }
                            if (!option['i']) {
                                int off = offset (u);
                                if (v->ext.parent->type.p.paus)
                                    out (2,
                                        "set(newstate+(%d+i)/BITS, (%d+i)%%BITS,%d,%c);",
                                        v->ext.parent->ext.offset+off,
                                        v->ext.parent->ext.offset+off,
                                        endom + 1,
                                        u->sibling->op == '@' ? endom + 1 : 0);
                                out (2, "set(newstate+(%d+i)/BITS, (%d+i)%%BITS,%c,",
                                    v->ext.offset+off, v->ext.offset+off,
                                    v->ext.bits);
                                if (homverify)
                                    expl (u);
                                else if (u->sibling->op == '@')
                                    expl (u->sibling->child.v);
                                else expl (u->sibling);
                                out (0, ");\n");
                            }
                        }
                        if (inits > 1) {
                            if (!i++) {
                                out (2, "break;\n");
                                out (1, "case 1:\n");
                            } else {
                                out (2, "skip=1;break;\n");
                                if (i < inits)
                                    ...
                            }
                        } else break;
                    }
                    if (inits > 1) {
                        indent--;
                        out (2, "}\n");
                    }
                }
                if (inits || cysets ) out (2, "break;\n");
/*
 * Generate code to compute the reduced selection
 * For each selvar we should have either a rsel or a hom or both:
 * If there is only one of them, set the selvar. If both, set the selvar
 * from rsel and comare from hom.
 * The comparison rsel's/hom's are marked 'RELOP' in their type fields.
 */
                if (rsels || selhom) {
                    out (1, "case BEG_SELECT:\n");
                    if (!option['i']) out (1, "case CONT_SELECT:\n");
                    for (w = proc->child.v; w; w = w->sibling)
                        if (w->op == RSEL || w->op == HOM)
                        {   z = w->child.v;
                            if (w->type.i != RELOP) {
                                tab (2);
                                expl (z);
                                out(0, "= ");
                                expl (z->sibling);
                                out (0, ";\n");
                                if (w->op == RSEL && selhom ||
                                    w->op == HOM && rsels)
                                    for (u = w->sibling; u; u = u->sibling)
                                        if (u->op == RSEL + HOM - w->op &&
                                            !diff (u->child.v, z, 0)) {
                                            u->type.i = RELOP;
                                            break;
                                        }
                            } else {
                                out (2, "if(");
                                expl (z);
                                out (0, "!=");
                                expl (z->sibling);
                                out (0, ")");
                                runerr ("NO_SELHOM");
                            }
                        }
```

```
                    out (?, "break;\n");
                }
                out (1, "}\n");
            }
        } else {
/*
 * Generate code at the leaf level:
 *
 * Generate the local structure and the code for initializing
 * its reference register 5.
 * Note that when determining the dimensionality of local[], ancestor
 * processes are also taken into account.
 */
            if (!proc->type.p.trans && !proc->type.p.code)
                cerror (proc->line, "no trans found");
            if (!option['i']) {
                out (1, "static struct local{\n");
                out (2, "int a,b,e,g,j,s,n,p,r,L;\n");
                if (stvar) {
                    if (stvar->type.i == STRING)
                        out (2, "String ");
                    else if (stvar->type.i == PROC)
                        out (2, "struct _%s *", stvar->ext.range->child.n->s);
                    else out (2, "int ");
                    cid (stvar->name);
                    out (0, "[%d];\n", arrows - 1 - endom);
                }
                out (2, "Ptype l,q[%d];\n", arrows+1 - endom);
                out (1, "}local");
                bounds (proc);
                out (0, ";\n");
                out (1, "register struct local *5= &local");
                subs (proc);
                out (0, ";\n");
            }
            if (cysets||inits||recurs||blocks)
                out (1, "switch(f){\n");
/* Generate code for initialization of cyset tables*/
            if (cysets) {
                out (1, "case BEG_INIT:\n");
                out (2, "i=");
                running ();
                out (0, ";\n");
                for (i=0, w=proc->child.v; i<cysets; w = w->sibling)
                    if (stvar && w->op == CYSET) {
                        for (j=0, u=w->child.v;u;j+=2,u=u->sibling) {
                            if (proc->type.p.paus){
                                out (2, "set(cy->p+%d*STATESIZE+", j++);
                                out (0, "(%d+i)/BITS,(%d+i)%%BITS,%d,%d);\n",
                                    proc->ext.offset, proc->ext.offset,
                                    endom + 1, endom + 1);
                                out (2, "set(cy->p+%d*STATESIZE+", j--);
                                out (0, "(%d+i)/BITS,(%d+i)%%BITS,%d,%d);\n",
                                    proc->ext.offset, proc->ext.offset,
                                    endom + 1,
                                    u->op == '@' ? endom + 1 : 0);
                            }
                            if (u->op == '@') v = u->child.v;
                            else v=u;
                            if (!v->op && v->type.i == '*') continue;

out (2, "set(cy->p+%d*STATESIZE+", j++);
                            out (0, "(%d+i)/BITS,(%d+i)%%BITS,%d,BIG);\n",
                                stvar->ext.offset, stvar->ext.offset,
                                stvar->ext.bits);
                            out (2, "set(cy->p+%d*STATESIZE+", j--);
                            out (0, "(%d+i)/BITS,(%d+i)%%BITS,%d,",
                                stvar->ext.offset, stvar->ext.offset,
                                stvar->ext.bits);
                            expl (v);
                            out (0, ");\n");
                        }
                        out (2, "cy++;\n");
                        i++;
                    }
            }
/* Generate code for computing initial states at the leaf level*/
/* The pause bit(s) is/are set according to the @ suffix.
 If the process never pauses but is in the target of a hom, we still set a pause
 bit for it, whatever the suffix is*/
            if (inits && sthom) {
                if (!cysets) out (1, "case BEG_INIT:\n");
                out (1, "case CONT_INIT:\n");
                if (stvar != sthom->child.v->child.v)
                    cerror (sthom->line, "stvar/hom mismatch");
                tab (2);
                cpath (stvar);
                out (0, "= ");
                expl (sthom->child.v->sibling);
                out (0, ";\n");
                for (i=0, w = proc->child.v; w; w = w->sibling)
                    if (w->op == INIT) {
                        if (!i) out (2, "if(");
                        else out (2, "else if(");
                        cpath (stvar);
                        out (0,"==");
                        if ((u = w->child.v)->op == '@') {
                            expl (u->child.v);
                            if (proc->type.p.paus) out (0, ")PACK(2,2)\n");
                            else if (pause) out (0,")spause();\n");
                            else out (0, "){;\n");
                        } else {
                            expl (u);
```

```c
            if (proc->type.p.paus) out (0, ")PACK(0,2)\n");
            else if (pause) out (0,")spause();\n");/*sic*/
            else out (0, "){;\n");
        }
        if (++i == inits) break;
    }
    out (2, "else{\n");
    if (proc->type.p.paus) out (3, "PACK(2,2)\n");
    out (3, "PACK(");
    cpath (stvar);
    out (0, ",%d)\n", stvar->ext.bits);
    tab (3);
    runerr ("NO_STHOM");
    out (2, "}\n");
    out (2, "PACK(");
    cpath (stvar);
    out (0, ",%d)\n", stvar->ext.bits);
} else if (inits) {
    if (!cysets) out (1, "case BEG_INIT:\n");
    if (inits > 1)
        out (2, "S->j=%d;\n", inits - 1);
    if (!option['i']) out (1, "case CONT_INIT:\n");
    if (endom) out (2, "if(skip)break;\n");
    if (inits > 1) {
        indent++;
        out (1, "if(++S->j>%d)S->j=0;\n", inits - 1);
        out (1, "switch(S->j){\n");
        out (1, "case 0:\n");
    }
    for (i=0, w = proc->child.v; i<inits; w = w->sibling)
        if (stvar && w->op == INIT) {
            u = w->child.v;
            if (!option['i'] && proc->type.p.paus || pause && endom) {
                if (endom && proc->type.p.paus){
                    if (u->op == '&') out (2, "PACK(2,2)\n");
                    else out (2, "PACK(0,2)\n");
                } else {
                    if (u->op == '&' || endom) out (2, "spause();\n");
                    else out (2, "cpause();\n");
                }
            }
            if (u->op == '&') u = u->child.v;
            if (homverify) {
                tab (2);
                cpath (stvar);
                out (0, "= ");
                expl(u);
                out (0, ";\n");
                out (2, "PACK(");
                cpath (stvar);
                out (0, ",%d)\n",stvar->ext.bits);
            } else if (!option['i']) {
                out (2, "PACK(");
                if (stvar->type.i == PROC &&
                        !vtype (u))
                    outc ('&');
                expl (u);
                out (0, ",%d)\n",stvar->ext.bits);
            } else {
                tab (2);
                cpath (stvar);
                out (0, "= ");
                expl(u);
                out (0, ";\n");
            }
            if (inits > 1) {
                if (!i++) {
                    out (2, "break;\n");
                    out (1, "case 1:\n");
                } else {
                    out (2, "skip=1;break;\n");
                    if (i < inits)
                        out (1, "case %d:\n", i);
                }
            } else break;
        }
    if (inits > 1) {
        indent--;
        out (2, "}\n");
    }
} else if (stvar)
    cerror (stvar->line, "is not initialized", stvar->name->s);
if (cysets || inits)
    out (2, "break;\n");
if (blocks) {
/* Generate unpacking code */
/* in a hom target, if there is a pause selection, a double pause bit is
unpacked, and if no pause selection, one pause bit. If we just entered a new
state, the flag c2h or c2f is set, according to whether the process has a
seinom or not. */
    out (1, "case BEG_SELECT:\n");
    if (endom && !sthom) out (2, "if(skip)break;\n");
    if (!option['i'] && stvar) {
        if (proc->type.p.paus) {
            out (2, "S->p=");
            if (endom) out (0, "unpk(2);\n");
            else out (0, "tpause();\n");
        } else if (pause && endom) out (2, "S->p=tpause();\n");
        if (pause && endom) {
            out (2, "if(S->p");
            if(proc->type.p.paus) out (0, "==2");
            out (0, ")c2%c=1;\n", selvar ? 'h' : 'f');
        }
        tab (2);
```

```c
            cpath (stvar);
            if (stvar->type.i == STRING)
                out (0, "=(String)unpk(%d);\n", stvar->ext.:  ');
            else if (stvar->type.i == PROC)
                out (0, "=(struct _ts*)unpk(%d);\n",
                    stvar->ext.range->child.n->s,
                    stvar->ext.bits);
            else
                out (0, "=unpkse(%d);\n", stvar->ext.bits);
        }
        if (sthom) {
            out (2, "if(");
            cpath (stvar);
            out (0, "!=");
            expl (sthom->child.v->sibling);
            out (0, ")");
            runerr ("NO_STHOM");
        }
        if (blocks) {
            int cond=1;
            for (i=0,w=proc->child.v;i<blocks;w=w->sibling)
                if(w->op==TRANS) {
                    if ((u=w->child.v->child.v)->type.i == BOOLEAN &&
                        !u->op && u->child.i == 1 ||
                        (option['i']||mergf) && i == blocks - 1){
                        cond = 0;/*unconditional*/
                        if (i) {
                            out (2, "}else{\n");
                            indent++;
                        }
                    } else {
                        if (i) out (2, "}else if(");
                        else out (2,"if(");
                        for (u=w->child.v->child.v;u;u=u->sibling) {
                            expl (u);
                            if (vtype(u) != BOOLEAN) {
                                out (0, "==");
                                if (stvar) cpath (stvar);
                                else cerror (u->line,
                                    "illegal state predicate");
                            }
                            if (u->sibling) out (0, "||");
                        }
                        out (0, "){\n");
                        indent++;
                    }
                    tab (2);
                    if (blocks > 1) {
                        if (option['i']) {
                            out (0, "b%d", here);
                            subs (proc);
                        } else {
                            out (0, "S->b");
                        }
                        out (0, "=%d;", i++);
                    }
                    if (!option['i'] && proc->type.p.sel) {
                        out (0, "S->s=");
                        if (!proc->type.p.paus)
                            out (0, "0;");
                        else if (w->child.v->sibling->op == '{' &&
                            w->child.v->sibling->child.v->op == '@')
                            out (0, "!S->p;S->g=%d;",
                                w->child.v->sibling->child.v->type.i ?
                                -1 : 1);
                            /*if state cannot pause, ignore the pause bit*/
                        else out (0, "0;S->g=0;");
                    }
                    outc ('\n');
                    if (blocks > 1 || cond) indent--;
                    if (blocks == 1) break;
                }
            if (cond) {
                out (2, "}else ");
                runerr ("NO_BLK");
            } else if (blocks > 1) out (2, "}\n");
        }
/* Generate code for checking the LHS of recur */
        if (recurs) {
            out (2, "S->a=0;S->r= -1;\n");
            for (i=0,w=proc->child.v;i<recurs;w=w->sibling)
                if (w->op==RECUR) {
                    if (w->child.v->type.i == '*') break;
                    if (i) out (2, "else if(");
                    else out (2,"if(");
                    if (stvar) {
                        cpath (stvar);
                        out (0, "==");
                        if(w->child.v->op == '@')
                            expl (w->child.v->child.v);
                        else
                            expl (w->child.v);
                    }
                    out (0, ")S->r=%d;\n",i++);
                }
        }

/* Generate selection code */
/* we assume one selvar and atmost one selhom */
        if (blocks && !option['i']) {
            out (1, "case CONT_SELECT:\n");
            if (endom && !selhom) out (2, "if(skip)break;\n");
            if (endom && pause) out (2, "S->L=1;\n");
```

```
        }
        if (selhom && selvar != selhom->child.v->child.v)
                cerror (selhom->line, "selvar/hom mismatch");
        else if (!proc->type.p.sel) {
                if (option['i'] && selvar && selvar->type.i == ASSIGN) {
                        /*under -i, equivalences are dynamic*/
                        tab (2);
                        cpath (selvar);
                        out (0, "=");
                        cpath (selvar->child.v->child.v);
                        out (0, ";\n");
                }
        } else {
                if (blocks>1) {
                        indent++;
                        out (1, "switch(");
                        if (option['i']) {
                                out (0, "bid", here);
                                subs (proc);
                        } else {
                                out (0, "S->b");
                        }
                        out (0, ")[\n");
                }
                for (i=0,w=proc->child.v;i<blocks;w=w->sibling)
                        if (w->op==TRANS) {
                                int at_found=0,beenhere=0;
                                if (w->child.v->sibling->op != '(') {
                                        cerror (w->line, "missing selection predicate");
                                        i++;
                                        continue;
                                }
                                if (blocks>1) out (1, "case %d:\n",i++);
/*selection hom - check if assigned value in range - considering the double pause bit*/
/*pause selections may be selected only is S->p is nonzero*/
/*non-pause selections may be selected only if S->p is not two. If it is one
S->L is cleared, and the flag clh is set.*/
                                if (selhom) {
                                        tab (2);
                                        cpath (selvar);
                                        out (0, "= ");
                                        expl (selhom->child.v->sibling);
                                        out (0, ";\n");
                                        for (u=w->child.v->sibling->child.v;u;u=u->sibling) {
                                                out (2, "if(");
                                                if (u->op == '@') {
                                                        out (0, "S->p&&");
                                                        cpath (selvar);
                                                        out (0, "==");
                                                        expl (u->child.v);
                                                        out (0, ")break;\n");
                                                        at_found = 1;
                                                } else if (u->op == DOTS) {
                                                        if (at_found) out(0,"S->p!=2&&");
                                                        cpath (selvar);
                                                        out (0, ">=");
                                                        expl (u->child.v);
                                                        out (0, "&&");
                                                        cpath (selvar);
                                                        out (0, "<=");
                                                        expl (u->child.v->sibling);
                                                        out (0, "){if(S->p){S->L=0;clh=1;}break;}\n");
                                                } else {
                                                        if (at_found) out(0,"S->p!=2&&");
                                                        cpath (selvar);
                                                        out (0, "==");
                                                        expl (u);
                                                        out (0, "){if(S->p){S->L=0;clh=1;}break;}\n");
                                                }
                                        }
                                        tab (2);
                                        runerr ("NO_SELHOM");
/*implementation - pick first non-pause selection*/
                                } else if (option['i']) {
                                        tab (2);
                                        if (selvar) cpath (selvar);
                                        out (0, "= ");
                                        u=w->child.v->sibling->child.v;
                                        if (u->op == '@') u = u->sibling;
                                        if (u->op == DOTS) u = u->child.v;
                                        expl (u);
                                        out (0, ";\n");
                                } else if (!((u=w->child.v->sibling->child.v)->sibling)) {
/*single selection or a single range*/
                                        tab (2);
                                        if (selvar) cpath (selvar);
                                        out (0, "= ");
                                        if (u->op == DOTS) {
                                                out (0, "%d+S->s++;\n",u->child.v->child.i);
                                                out (2,"if(S->s==%d;S->s=;more=--, ..
                                                        u->child.v->sibling->child.i -
                                                        u->child.v->child.i + 1);
                                                out (2, "if(S->s==1)more++;else skip=1;\n");
                                        } else {
                                                expl (u);
                                                out (0, ";\n");
                                        }
/*pause selection and single selection or a single range - not hom target*/
                                } else if (!endom && u->op == '@' && !u->sibling->sibling) {
                                        out (2, "if (!S->s)");
                                        if (selvar) cpath (selvar);
                                        out (0, "= ");
                                        expl (u->child.v);
                                        out (0, ";\n");
```

```c
                            u = u->sibling;
                            if (u->op == DOTS) {
                                out (2, "else{");
                                if (selvar) cpath (selvar);
                                out (0, "= ");
                                out (0, "%d+S->s++;\n",u->child.v->child.i - 1);
                                out (3,"if(S->s==%d){S->s=1;more--;}",
                                    u->child.v->sibling->child.i -
                                    u->child.v->child.i + 2);
                                out (0, "if(S->s==2)more++;else skip=1;}\n");
                            } else {
                                out (2, "else ");
                                if (selvar) cpath (selvar);
                                out (0, "= ");
                                expl (u);
                                out (0, ";\n");
                            }
                        } else {
/*multiple selections*/
/*note that in the hom target with no selhom, if S->p==2, only the pause
selection is selected; if S->p==1, all selections are selected, and
if S->p==0, only non-pause selections are selected.
If S->p==1 and a non-pause selection is selected, the flag clf is set.
and S->L is cleared*/
                            out (2, "switch(S->s){\n");
                            for (j=0,u=w->child.v->sibling->child.v;u;) {
                                int jmax;
                                if (u->op == DOTS){
                                    int k;
                                    jmax=u->child.v->sibling->child.i
                                        - u->child.v->child.i + j;
                                    for (k=j; k<=jmax; k++)
                                        out (2, "case %d:\n", k);
                                }
                                else out (2, "case %d:\n", j);
                                tab (3);
                                if (selvar) cpath (selvar);
                                out (0, "= ");
                                if (u->op == '@') {
                                    expl (u->child.v);
                                    out (0, ";\n");
                                    if (endom)
                                        out (3, "if(S->p==1){S->s=1;more++;}\n");
                                    out (3, "break;\n");
                                    u=u->sibling;j=1;
                                    at_found=1;
                                } else if (u->op == DOTS) {
                                    out (0, "%d+S->s++;\n",
                                        u->child.v->child.i - j);
                                    if (endom && at_found)
                                        out (3, "if(S->p){S->L=0;clf=1;}\n");
                                    if (!(u = u->sibling)) {
                                        out (3,"if(S->s==%d){S->s=",jmax + 1);
                                        if (endom && at_found) out (0, "!S->p;");
                                        else if (at_found) out (0, "1;");
                                        else out (0,"0;");
                                        if (endom && at_found)
                                            out (0, "if(S->p)more--;""\n");
                                        else if (beenhere)
                                            out (0, "more--;}\n");
                                        else out (0, "}\n");

}
                                    if (endom && at_found)
                                        out (3, "if(!S->p&&S->s==%d)more++;else ",
                                            j - 1);
                                    else if (!beenhere)
                                        out (3, "if(S->s==%d)more++;else ", j - 1);
                                    else tab (3);
                                    out (0, "skip=1;break;\n");
                                    beenhere = 1;
                                } else {
                                    expl (u);
                                    out (0, ";\n");
                                    if (endom && at_found)
                                        out (3, "if(S->p){S->L=0;clf=1;}\n");
                                    out (3,"S->s=");
                                    if (u = u->sibling) out (0, "%d;", ++j);
                                    else if (endom && at_found)
                                        out (0, "!S->p;");
                                    else if (at_found) out (0, "1;");
                                    else out (0, "0;");
                                    if (!beenhere && u {
                                        if (endom && at_found)
                                            out(0, "if(!S->p)");
                                        out (0, "more++;");
                                    }
                                    if (!beenhere && !u && endom && at_found)
                                        out (0, "if(S->p){more--;skip=1;}");
                                    if (beenhere && !u) out (0, "more--;");
                                    if (beenhere++) out (0, "skip=1;");
                                    out (0, "break;\n");
                                }
                            }
                            out (2, "}\n");
                        }
                        out (2, "break;\n");
                        if (blocks == 1) break;
                    }
                    if (blocks>1) {
                        indent--;
                        out (2, "}\n");
                        out (2, "break;\n");
```

```
            }
/* Generate resolution code */
        if (blocks) {
            int line = 0; /*count transition lines*/
            if (!proc->type.p.sel) out (2, "break;\n");
            out (1, "case BEG_RESOLVE:\n");
            if (!option['i']) out (2, "S->n=0;S->e=1;\n");
            if (blocks>1) {
                indent++;
                out (1, "switch(");
                if (option['i']) {
                    out (0, "bid", here);
                    subs (proc);
                } else {
                    out (0, "S->b");
                }
                out (0, "){\n");
            }
            for (i=0,w=proc->child.v;i<blocks;w=w->sibling)
                if (w->op==TRANS) {
                    Vertex *st = 0;
                    int beenhere = 0;
                    if (blocks>1) out (1, "case %d:\n",i++);
                    for (u=w->child.v;u;u=u->sibling) if (u->op==ARROW){
                        int cond = 1;
                        v=u->child.v;
                        if (v->op != ':'){
                            if (v->op || v->type.i!= ASSIGN ||
                                (st = v->child.v)->op != STVAR ||
                                st->ext.parent != proc)
                                cerror (w->line, "illegal state component");
                            v = v->sibling;
                        }
                        v=v->child.v;
                        if (!st) {
                            if (stvar) st = stvar;
                            else cerror (w->line,
                                "missing state component");
                        }
                        if (!v->sibling->op && v->sibling->type.i == BOOLEAN &&
                            v->sibling->child.i == 1 ||
                            (option['i'] || mergf) && !u->sibling) {
                            cond = 0;/*unconditional*/
                            if ((option['i'] || mergf) && beenhere++)
                                out (1, "/else/\n");
                        } else {
                            if ((option['i'] || mergf) && beenhere++) {
                                indent --;
                                out (2, "/else if(");
                            } else out (2, "if(");
                            expl (v->sibling);
                            out (0, "){\n");
                            indent++;
                        }
                        tab (2);
                        if (mergf)
                            out (0, "*Cline++=%d;", line++);
                        else if (!option ['i'] && u->sibling)
                            out (0, "S->e=0;");
                        if (!option['i']) {
                            out (0, "S->");
                            cid (st->name);
                            out (0, "[S->n]= ");
                            if (st->type.i == PROC &&
                                !(v->op == '&' ?
                                vtype (v->child.v) :
                                vtype (v)))
                                outc ('&');/*procptr*/
                            if (v->op == '&') {
                                expl (v->child.v);
                                out (0, ";S->q[S->n++]=SET;\n");/*new state*/
                            } else {
                                expl (v);
                                out (0, ";S->q[S->n++]=SELF;\n");/*not necessarily*/
                            }
                        } else if (!v->op && v->type.i == ASSIGN && v->child.v == st)
                            out (0, ";\n");
                        else {
                            cpath (st);
                            if (v->op == '&') v = v->child.v;
                            out (0, "= ");
                            if (st->type.i == PROC &&
                                !vtype (v))
                                outc ('&');/*procptr*/
                            expl (v);
                            out (0, ";\n");
                        }
                        if (cond && !option['i'] && !mergf ||
                            !cond && beenhere>1 && (option['i'] || mergf)) {
                            indent--;
                            out (2, "}\n");
                        }
                        if (!cond && (option['i'] || mergf))
                            break;
                    }
                    if (blocks>1) out (2, "break;\n");
                    else break;
                }
            if (blocks>1) {
                indent--;
                out (2, "}\n");
```

```
            }
            if (!option['i'] && !mergf) {
                    out (2, "if(!S->n)");
                    runerr ("NO_EDGE");
                    if (endom || !option['n']) {
                            out (2, "if(S->n>1)");
                            runerr ("NO_SEMI");
                    }
            }
/* Generate code to check the resolved next states for pausing */
            if (!option['i']) {
                    out (2, "for(i=0;i<S->n;i++)\n");
                    if (stvar) {
                            out (3, "if(S->");
                            cid (stvar->name);
                            out (0, "[i]!=");
                            cpath (stvar);
                            out (0, ")S->q[i]=SET;\n");
                            if (!proc->type.p.paus)
                                    out (3, "else S->q[i]=SELF;\n");
                            else if (endom)
                                    out (3,"else if(!S->g||S->p==2||S->p&&S->L)S->q[i]=SELF; :");
                            else {
                                    out (3,"ELSTAT(");
                                    cid (stvar->name);
                                    out (0,")\n");
                            }
                    }
                    out (2, "S->j=0;");
                    if (recurs) out (0, "S->a=0;");
                    if (!endom) out (0, "S->l=SELF;");
                    outc ('\n');
/* Generate packing code */
                    out (1, "case CONT_RESOLVE:\n");
                    if (proc->type.p.paus) {
                            if (endom) out (2, "SETDP\n");
                            else out (2, "SETP\n");
                            if (mergf) out (2, "SETMSEQ\n");
                    } else if (pause) {
                            if (endom) out (2, "SETSP\n");
                            else out (2, "SETNP\n");
                    }
                    if (stvar) {
                            out (2, "PACK(S->");
                            cid (stvar->name);
                            out (0, "[S->j],%d)\n", stvar->ext.bits);
                    }
            }
/* Generate code for checking the RHS of recurs */
            if (recurs) {
                    out (2, "switch(S->r){\n");
                    for (i=0,w=proc->child.v;i<recurs;w=w->sibling)
                            if (w->op==RECUR) {
                                    if (w->child.v->type.i == '*') {
                                            out (2, "/\n");
                                            indent--;
                                    }else out (2,"case %d:\n", i++);
                                    out (3, "if(");
                                    if ((u = w->child.v->sibling)->type.i == '*')
                                            out (0, "!S->a)plus++,S->a= %d;\n",
                                                    w->child.v->type.i=='*'?-1:1);
                                    else while (u) {
                                            if (stvar) {
                                                    out (0, "S->");
                                                    cid(stvar->name);
                                                    out (0, "[S->j]==");
                                                    if (u->op == '@'){
                                                            expl(u->child.v);
                                                            if (proc->type.p.paus)
                                                                    out(0,"&&(S->q[S->j]==SET||S->L)");
                                                    } else {
                                                            expl(u);
                                                            if (proc->type.p.paus)
                                                                    out(0,"&&(S->q[S->j]==SET||!S->L)");
                                                    }
                                            }
                                            if (u = u->sibling) out (0, "||");
                                            else {
                                                    out (0, ")(if(!S->a)plus++,S->a= %d;\n",
                                                            w->child.v->type.i=='*'?-1:1);
                                                    out (3, "else if(S->a==%d)plus--,S->a=0;\n",
                                                            w->child.v->type.i=='*'?-1:1);
                                            }
                                    }
                                    if (w->child.v->type.i == '*') {
                                            indent++;
                                            break;
                                    } else if (i == recurs) {
                                            out (2, "}\n");
                                            break;
                                    } else out (3, "break;\n");
                            }
            }
/* CONT_RESOLVE looping code */
            if (!option['i']) {
                    out (2, "if(!S->j++){if(S->n>1)loop++;else S->j=0;break;}\n");
                    out (2, "if(S->j==S->n){S->j=0;loop--;}\n");
                    out (2, "goto end;\n");
            } else out (2, "break;\n");
    }
    if (cysets||inits||recurs||blocks) out (1, "}\n");
}
```

```
/*
 * end of proc
 */
        if (!proc->type.p.free) {
            if (codep) {
                out (1, "switch(f){\n");
                copycode (codep);
                out (1, "}\n");
            }
            if (!option['i'] && (skip || proc->ext.bounds) && !endom) {
                out (1, "if(skip)goto ");
                if(where >=0) out (0, "procid;\n",where);
                else if (!homverify) out (0, "end;\n");
                else out (0, "endom;\n");
            }
            indent--;
            out (1, "}/*%d*end ", here);
            srpath (proc);
            out (0, "*/\n");
        }
        if (w = proc->ext.bounds)
            loopend (&back, proc->ext.range->child.l, w);
        proc = proc->ext.parent;
        return;
} copycode (v)                                                                                  copycode
Vertex *v;
/* Copy embedded C-code from temporary file */
/* Also record current line number and restore it later*/
{
        Vertex *w;
        int i, c;
        static long byte = 0;
        static int line = 1;

if (codename && !option['p']) {
            fseek (yyout, byte, 0);/*position after last call*/
            while ((c = getc (yyout)) != EOF)/*count lines since*/
                if (c == '\n') line++;
        } for (w=v->child.v; w->type.i!='$'; w=w->sibling->sibling) {
            out (0, "#define C");
            cid (w->child.n);
            outc (' ');
            expl (w->sibling);
            outc ('\n');
            line++;
        }
        fseek (yytmp, w->child.l, 0);/*position temp file on beginning of code*/
        for (i=w->sibling->child.l - w->child.l; i--; ) {
            outc (c = getc (yytmp));/*copy code*/
            if (c == '\n') line++;
        }
        for (w = v->child.v; w->type.i!='$'; w=w->sibling->sibling) {
            out (0, "#undef C");
            cid (w->child.n);
            outc ('\n');
            line++;
        }
        if (codename && !option['p']) {
            out (0, "#line %d \"%s\"\n", ++line, codename);
            byte = ftell (yyout);/*record position for next call*/
        }
} bigmacs ()                                                                                    bigmacs
{
        Vertex *w;
        int back;
        if (!proc->type.p.bigm||proc->type.p.free) return;
        if (w = proc->ext.bounds)
            loopstart (&back, proc->ext.range->child.l, w);
        for (w=proc->child.v; w; w=w->sibling)
            if (w->op==BIGMAC) {
                tab (2);
                cpath (w);
                out (0, "= ");
                expl (w->child.v);
                out (0, ";\n");
            } else if (w->op==PROC) {
                proc = w;
                bigmacs ();
                proc = w->ext.parent;
            }
        if (w = proc->ext.bounds)
            loopend (&back, proc->ext.range->child.l, w);
}

Vertex *
expr (v, member)                                                                              expr
Vertex *v, *member;
/*
 * Generate C-code for an expression, and return a pointer to the variable
 * if expression is a path.
 */
{
        char *sep = 0, *pref = 0;
        int op, i;
        Vertex *z, *w, *u;
        if (!v) abort();
        switch (op = v->op) {
```

```c
case 0:
    switch (v->type.i) {
    case PROC:
        out (0, "0", v->child.n->s);
        return 0;
    case '[':/*array index id*/
        out (0, "i%d", v->child.i);
        return 0;
    case INTEGER:
        out (0, "%d",v->child.i);
        return 0;
    case BOOLEAN:
        if (v->child.i == -1) out (0, "S->e");
        else out (0, "%d", v->child.i);
        return 0;
    case STRING:
        cid (v->child.n);
        return 0;
    case ASSIGN:
        cpath2 (u = v->child.v, member);
        return u;
    default:
        if (v->type.i > TYPE)
            cerror (v->line, "unrecognized type: %#x", v->type.i);
        else
            cerror (v->line,"unrecognized type: %s", yyvis (v->type.i));
        error ("fatal error, aborting");
    }
case '[':
    w = expr(z=v->child.v, member);
    for(u = w->ext.bounds; z = z->sibling; u = u->sibling) {
        outc ('[');
        expl (z);
        outc (']');
    }
    return w;
case '.':
    z = v->child.v ;
    w = expl(z);
    while (z = z->sibling)
        w = expr (z, w);
    return w;
case '?':
    outc ('(');
    i=0;
    for (z = u = v->child.v; z->sibling; z = z->sibling->sibling) {
        expl (z->sibling);
        outc ('?');
        if (!vtype (z))
            outc ('`');
        expl (z);
        outc (':');
    }
    if (!vtype (z))
        outc ('`');
    expl (z);
    outc (')');
    return 0;
case '=':
    sep = "==";
    break;
case -'=':
    sep = "!=";
    break;
case -'>':
    sep = "<=";
    break;
case -'<':
    sep = ">=";
    break;
case '>':
case '<':
    break;
case '%':
    if (!option['b']) {
        pref = "mod";
        sep = ",";
    };
    break;
case '/':
    if (!option['b']) {
        pref = "div";
        sep = ",";
    }
    break;
case '^':
    pref = "ipow";
    sep = ",";
    break;
case '-':
    pref = "!";
    break;
case '-':
    if (!v->child.v->sibling) pref = "-";
    break;
case '+':
    if (v->type.i == BOOLEAN) sep = "//";
    break;
case '*':
    if (v->type.i == BOOLEAN) sep = "&&";
    break;
default:
    if (op > TYPE)
        cerror (v->line, "unrecognized operator: %#x", op);
```

```
            else
                cerror (v->line, "unrecognized operator: %s", yyvis (op));
            error ("fatal error, aborting");
        }
        if (pref) out (0, pref);
        outc ('(');
        for (z = v->child.v; z;) {
            if (op == '=' || op == '-=')
                if (!vtype (z))
                    outc ('&');
            expl (z);
            if (z = z->sibling) {
                if (sep) out (0, sep);
                else outc (op);
            } else outc (')');
        }
        return 0;
} cid (n)                                                                             cid
Name *n;
{
        switch (*n->s) {
        case '$':
                out (0, "dol");
                return;
        case '#':
                out (0, "num");
                return;
        case '%':
                out (0, "pct");
                return;
        default:
                out (0, "_%s",n->s);
                return;
        }
} cpath2 (v, member)                                                                  cpath2
Vertex *v, *member;
{
        Vertex *w, *u;
        if ((w = v->ext.parent) && (!member ||
                member->op == PROC && w != member ||
                w->op == PROC && member->op != PROC && member->type.i == PROC &&
                member->ext.range->child.n != w->child.v ->child.n)) {
                cpath2 (w, member);
                if (w->op == PROC && w->ext.bounds) {
                        int i = w->ext.range->child.i;
                        for (u = w->ext.bounds; u; u = u->sibling)
                                out (0, "[%d]", i++);
                }
        }
        if (w && member && member->op != PROC && (member->type.i == PROC &&
                member->ext.range->child.n == w->child.v ->child.n ||
                option['l'] &&
                member->type.i == ASSIGN && member->child.v->child.v->type.i == PROC &&
                member->child.v->child.v->ext.range->child.n == w->child.v->child.n))
                out (0, "->");
        else if (w) outc ('.');
        cid (v->name);
} int
srpath (v)                                                                          srpath
Vertex *v;
{
        int i;
        Vertex *w;
        if (!(w = v->ext.parent))
                return 0;/*arbitrary*/
        i = srpath (w);
        out (0, ".%s", v->name->s);
        if (w = v->ext.bounds) {
                if (v->op == PROC)
                        i = v->ext.range->child.i;
                for (; w; w = w->sibling)
                        out (0, "[%d]", i++);
        }
        if (v->op == PROC)
                i = indices;
        return i;
} int
vars (v, pack, deep, tagged)                                                        vars
Vertex *v;
int pack, deep, tagged;
/*
 * Generate global structure for S/R variables. If 'pack' is set, compute
 * offsets and field widths for packed variables. If 'deep' is set,
 * the process is free or merged, and if 'deep' is two or more, a parent is such.
 * In the latter case, the structure for a selection variable has to be generated
 * only if it is lifted to the top free/merged process level.
 * If 'tagged' is set, a tag for the structure has already been defined,
 * and no further structure description has to be generated.
 * Returns 0 if generated structue, 1 otherwise;
 */
{
        int j;
        Vertex *u, *w;
        static offset = 0;
        extern mbits;/* set by mcode.c:mload()*/
```

```
static Vertex *top;
static endom;

if (!v->name) return 1;
        if (v->op == PROC && !v->type.p.struc) {
                if (v == target) endom = 1;
                return 1;
        }
        if (v->op == PROC && !v->type.p.sel && !v->type.p.lift &&
                (v->type.p.free || v->type.p.merged)) return 1;
        if (v->type.i == ASSIGN && !option['i']) return 1;
        if (v->op == PROC && (deep || (v->type.p.free || v->type.p.merged))) deep++;
        if (deep) {
                if (option['i'] && v->op == STVAR && top->type.p.free) return 1;
                if (deep == 1 && v->op == PROC) top = v;
                if (deep > 1 || v->op == STVAR) {
                        for (w = top->child.v; w; w = w->sibling){
                                if (w->op == SELVAR && w->type.i == ASSIGN){
                                        if (w->child.v->op) {
                                                cerror (w->line, "unsupported equivalence");
                                                continue;
                                        }
                                        for (u = w->child.v->child.v; u && u != v; u = u->ext.parent)
                                                ;
                                        if (u) break;
                                }
                        }
                        if (!w) return 1;
                }
        }
        if (pack) {
                v->ext.offset = offset;
                if (v->op == PROC) {
                        if (deep) {
                                if (v->type.p.merged) offset += v->ext.bits;
                        } else if (v->type.p.paus || pause && endom)
                                offset += v->ext.bits =
                                        endom && v->type.p.paus ? 2 : 1;
                }
        }
        if ((u = v->child.v) && v->op != BIGMAC && v->type.i != ASSIGN) {
                int dummy = 1;
                if (tagged) {
                        for (u = v->child.v; u; u = u->sibling)
                                (void)vars (u, pack && u->op != SELVAR && u->op != BIGMAC && !deep, deep, 1);
                } else if (v->op == PROC && !u->op && u->type.i == PROC) {
                        out (1, "struct _%s", u->child.n->s);
                        if (u->child.n->scope == local) {
                                outc(' ');
                                for (; u; u = u->sibling)
                                        (void)vars (u, pack && u->op != SELVAR && u->op != BIGMAC && !deep,
                                                deep, 1);
                        } else {
                                u->child.n->scope = local;
                                out (0, "/\n");
                                goto notag;
                        }
                } else {
                        out (1, "struct{\n");
notag:                   indent++;
                        for (; u; u = u->sibling)
                                dummy &= vars (u, pack && u->op != SELVAR && u->op != BIGMAC && !deep, deep, 1);
                        if (dummy) out (1, "int dummy;\n");
                        indent--;
                        out (1, "}");
                }
        } else {
                if (!tagged) {
                        if (v->type.i == PROC ||
                                v->type.i == ASSIGN && v->child.v->child.v->type.i == PROC) {
                                out (1, "struct _%s *", (v->type.i == ASSIGN?
                                        v->child.v->child.v : v)->ext.range->child.n->s);
                        } else if (v->type.i == STRING ||
                                v->type.i == ASSIGN && v->child.v->child.v->type.i == STRING)
                                out (1, "String ");
                        else
                                out (1, "%s ", cintype (getbits (v->type.i == ASSIGN?
                                        v->child.v->child.v : v))));
                }
                if (pack)
                        offset += v->ext.bits = getbits (v);
        }
        if (!tagged) cid (v->name);
        if (!tagged && option['i'] && v->ext.parent && (!v->ext.parent->op ||
                v->ext.parent->op == SELVAR || v->ext.parent->op == STVAR) &&
                v->ext.parent->type.i == BIGREC)
                out (0, ":%d",getbits (v->type.i == ASSIGN?
                        v->child.v->child.v : v));/*bit field*/
        j = 1;
        for (u = v->ext.bounds; u; u = u->sibling) {  /*compute array size*/
                if (!tagged) out (0, "[%d]", u->child.i);
                j *= u->child.i;
        }
        if (pack) {
                if (v->ext.parent) v->ext.parent->ext.bits += j * v->ext.bits;
                offset += (j-1)*v->ext.bits; /*allocate bits for remainder of array*/
        }
        if (!tagged) out (0, ";\n");
        return 0;
} int
getbits (v)                                                                     getbits
Vertex *v;
{
```

```
        int bits, i, max;
        Vertex *u;

if (v->type.i == STRING)
                return bits_string;
        if (v->type.i == PROC) {
                if (sizeof(int) < sizeof(char *))
                        cerror (v->line, "long pointers not supported");
                return BITS;
        }
        if (!(u = v->ext.range))
                return BITS;/*full size*/
        max = 0;
        bits = 1;/*one extra for the sign*/
        for (; u; u=u->sibling) {
                if (u->op == DOTS) {
                        i = u->child.v->child.i;
                        if (i < 0) i = -i;
                        if (max < i) max = i;
                        i = u->child.v->sibling->child.i;
                        if (i < 0) i = -i;
                        if (max < i) max = i;
                } else {
                        i = u->child.i;
                        if (i < 0) i = -i;
                        if (max < i) max = i;
                }
        }
        for (; max; max >>= 1)/*count the bits*/
                bits++;
        return bits;
} char *
cintype (size)                                                              cintype
int size;
{       extern targetbytesize;/*set by sr.c:main(), on "-B" option*/
        static char s[] = "Int0";

if (!option['i'] || !targetbytesize)
                return "Int";
        s[3] = '0' + (size+targetbytesize-1)/targetbytesize%10;
        return s;
} int
cysets (v, j, b)                                                            cysets
/*
 * Generate cy_ arrays, and return their number;
 */
Vertex *v, *b;
int j;
{
        int i;
        Vertex *u;
        static *q;
        if (!q) q = substack;
        if (b) {
                *q = 0;
                i = b->child.i;
        } else i = 1;
        while (i--) {
                if (b && b->sibling) {
                        q++;
                        j = cysets (v, j, b->sibling);
                        q--;
                } else if (u = v->child.v) {
                        if (v->type.p.prod) {
                                if (b) q++;
                                for (; u; u = u->sibling) if (u->op == PROC)
                                        j = cysets (u, j, u->ext.bounds);
                                if (b) q--;
                        }
                        for (u = v->child.v; u; u = u->sibling) if (u->op == CYSET) {
                                register k = 0;
                                register Vertex *w = u->child.v;
                                for (; w; k++, w=w->sibling);
                                out (1,"static int cy_%d[%d*2*STATESIZE];/*", j++, k);
                                qpath (v);
                                out (0, "*/\n");
                        }
                }
                if (b) (*q)++;
        }
        return j;
}
qpath (v)                                                                   qpath
Vertex *v;
{
        Vertex *w;
        static *q;
        if (w = v->ext.parent){
                qpath (w);
                out (0, "%s", v->name->s);
                if (w = v->ext.bounds) {
                        for (; w; w = w->sibling)
                                out (0, "[%d]", *q++);
                }
        } else q = substack;
} int
trans (v, mul, j)                                                           trans
```

```
Vertex *v;
/*
 * Return the number of subprocesses (multiplicity counted) with transitions.
 * Called as trans(proc, 1, 0) and calls itself recursively.
 */
{
        Vertex *u;

for (u = v->ext.bounds; u; u = u->sibling) mul *= u->child.i;
        if (v->type.p.prod) {
                for (u = v->child.v; u; u = u->sibling) if (u->op == PROC)
                        j = trans (u, mul, j);
        } else if (v->type.p.trans) j += mul;
        return j;
} running ()                                                                      running
/*
 * Generate running offset in bits for the current process
 *       ... . proc[i1<n1][i2<n2][i3<n3]
 * i.e.
 *       ... + ((( i1 )*n2+i2 )*n3+i3) * proc->ext.bits
 */
{
        Vertex *v, *w;
        int i, found=0;

for (v=proc; v; v=v->ext.parent) if (w=v->ext.bounds){
                if (found)outc ('+');
                else found=1;
                i = v->ext.range->child.i;
                for (;w;w=w->sibling) outc (' (');
                for (w=v->ext.bounds; w; w=w->sibling) {
                        if (w!=v->ext.bounds)out (0, "*%d+", w->child.i);
                        out (0, "i%d)", i++);
                }
                out (0, "*%d", v->ext.bits);
        }
        if (!found) outc ('0');
} offset (v)                                                                      offset
Vertex *v;
/*
 * Return the offset in bits for a constant path-name p[i].q[j].r[k]...
 * relative to p[0].q[0].r[0]...
 * Used for generating high level inits and cysets.
 */
{
        if (v->op == '.') {
                int k = 0;
                for (v = v->child.v; v; v = v->sibling)
                        k += offset (v);
                return k;
        } else if (v->op == '[') {
                Vertex *z, *b;
                int k = 0;
                if ((v = v->child.v)->op*|| v->type.i != ASSIGN) {
                        cerror (v->line, "illegal array");
                        return 0;
                }
                for (z = v->sibling, b = v->child.v->ext.bounds; z && b;
                                z = z->sibling, b = b->sibling) {
                        if (z->op || z->type.i != INTEGER) {
                                cerror (z->line, "nonconstant subscript");
                                return 0;
                        }
                        k = k * b->child.i + z->child.i;
                }
                return k * v->child.v->ext.bits;
        } else return 0;
} runerr(code)                                                                    runerr
char *code;
/*
 * Generate a run error indication
 *      {errloc = proc->ext.offset + running;errline=__LINE__;return code;}
 */
{
        out (0, "ERROR(%d+",proc->ext.offset);
        running();
        out (0, ",%s);\n", code);
} bounds (v)                                                                      bounds
Vertex *v;
/*
 * Generates expression of type
 *      [n1][n2][n3][n4]...
 * for an array of the form
 *      a[i1<n1][i2<n2].b[i3<n3][i4<n4]...
 */
{
        Vertex *w;

if (!(w = v->ext.parent))
                return;
        bounds (w);
        for (w = v->ext.bounds;w;w=w->sibling)
                out (0, "[%d]", w->child.i);
}
```

```
int
subs (v)                                                                                                subs
Vertex *v;
/*
 * Generates expression of type
 *      [i1][i2][i3][i4]...
 * for an array of the form
 *      a[i1<n1][i2<n2].b[i3<n3][i4<n4]...
 */
{
        Vertex *w;
        int i;

if (!(w = v->ext.parent))
                return 0;/*arbitrary*/
        i = subs (w);
        if (w = v->ext.bounds) {
                if (v->op == PROC)
                        i = v->ext.range->child.i;
                for (; w; w = w->sibling)
                        out (0, "[%d]", i++);
        }
        if (v->op == PROC)
                i = indices;
        return i;
}
static void
sortnames (n)                                                                                           sortnames
Name *n;
{
        static i;
        if (n->left) sortnames (n->left);
        if (n->scope == global) gnames[i++] = n;
        if (n->right) sortnames (n->right);
}
int pausesize;
liststate (mul)                                                                                         liststate
int mul;/*process multiplicity*/
/*
 * Generate liststate() routine.
 * Used by analyze() under the 'l' option.
 * May be used by main() under 'i' option.
 */
{
        Vertex *w;
        int back;
        static listsize;
        static endom;
        if (!proc->ext.parent) {
                if (option['i'])
                        out (1, "liststate(fp)FILE *fp;{\n");
                else {
                        out (1, "liststate(df,rst,fp)RST *rst;FILE *fp;{\n");
                        out (2, "int bit=0,acc,*wd=(int*)rst-STATESIZE,errbit,*errwd=0,\
*sv=savestate,star;\n");
                        if (pause) out (2, "int p, *svp=savepause;\n");
                        out (2, "PUTIND\n");
                }
        }
        if (w = proc->ext.bounds) {
                loopstart (&back, proc->ext.range->child.i, w);
                for (; w; w = w->sibling) mul *= w->child.i;
        }
        for (w = proc->child.v; w; w = w->sibling) {
                if (w->op==STVAR) {
                        if (option['i']) {
                                out (2, "fprintf(fp,\"\\t");
                                runpath (w);
                                if (w->type.i == STRING){
                                        out (0, "=%s\",names[(int)");
                                        cpath (w);
                                        out (0, "]);\n");
                                } else if (w->type.i == PROC) {
                                        out (0, "=.(%d)\",");
                                        cpath (w);
                                        out (0, "?(int*)");
                                        cpath (w);
                                        out (0, "-(int*)&_:-1);\n");
                                } else {
                                        out (0, "=%d\",");
                                        cpath (w);
                                        out (0, ");\n");
                                }
                        } else {
                                listsize += mul;
                                out (2, "GETTAB;");
                                if (proc->type.p.paus || pause && endom) {
                                        pausesize += mul;
                                        if (endom && proc->type.p.paus)
                                                out (0, "GETDP;");
                                        else out (0, "GETAT;");
                                }
                                out (0, "acc=unpk");
                                if (w->type.i == INTEGER) out (0, "se");
                                out (0, "(%d);\n", w->ext.bits);
                                out (2, "if(df||*sv!=acc");
                                if (proc->type.p.paus || pause && endom)
                                        out (0, "||*svp!=p");
                                out (0, "||star){\n");
                                out (3, "PUTTAB;fprintf(fp,\"");
                                runpath (w);
                                if (w->type.i == STRING)
                                        out (0, "=%s\",names[acc]);");
```

```
                        else if (w->type.i == PROC)
                                out (0, "=.[%d]\",acc?(int*)acc-(int*)&_:-1);");
                        else out (0, "=%d\",acc);");
                        if (proc->type.p.paus || pause && endom) {
                                if (endom && proc->type.p.paus) out (0, "PUTOP;\n");
                                else out (0, "PUTAT;\n");
                                out (2, "/\n");
                                out (2, "if(df>=0){*sv++=acc;*svp++=p;}\n");
                        } else {
                                outc ('\n');
                                out (2, "/\n");
                                out (2, "if(df>=0){*sv++=acc;}\n");
                        }
                }
        } else if (w->op==PROC && !w->type.p.free) {
                if (w == target) endom = 1;
                proc = w;
                if (proc->type.p.merged) {
                        mliststate();
                        listsize++;/*has to do something more in mcode.c*/
                } else liststate (mul);
                proc = w->ext.parent;
        }
    }
    if (w = proc->ext.bounds)
            loopend (&back, proc->ext.range->child.i, w);
    if (!proc->ext.parent) {
            out (2, "putc('\n',fp);\n");
            out (1, "}\n");
            if (!option('i')) {
                    out (1, "int savestate[%d];\n",
                            listsize ? listsize : 1);
                    if (pause) out (1, "int savepause[%d];\n",
                            pausesize ? pausesize : 1);
            }
    }
} int inputbits;

static int
inputs (deep)                                                                   inputs
int deep;
/*
 * Generate inputs() routine recursively.
 * Return the accumulated number of pause bits in the process being merged.
 */
{
        Vertex *w;
        static void inputvar();
        int back, mseqbits;
        if (!proc->ext.parent) {
                out (1, "inputs()\n{\n");
                out (2, "extern int minput[],mseq;\n");
                out (2, "int bit=0,*wd=minput;\n");
        }
        if (proc->type.p.merging)
                deep = 1;/*the merging bit is not inherited by children!*/
        mseqbits = deep && proc->type.p.paus;
        if (w = proc->ext.bounds)
                loopstart (&back, proc->ext.range->child.i, w);
        for (w = proc->child.v; w; w = w->sibling) {
                if (w->op == PROC) {
                        proc = w;
                        mseqbits += inputs (deep);
                        proc = w->ext.parent;
                } else if (w->op==SELVAR && w->name)
                        inputvar (w);
        }
        if (w = proc->ext.bounds)
                loopend (&back, proc->ext.range->child.i, w);
        if (deep)
                for (; w; w = w->sibling)
                        mseqbits += w->child.i;
        if (!proc->ext.parent) {
                int i;
                if (mseqbits)/*pack mseq as well*/
                        out (2, "PACK(mseq,%d)\n",mseqbits);
                out (1, "}\n");
                i = (inputbits + mseqbits - 1)/(int)BITS + 1;
                out (1, "int minput[%d],minputsize=%d;\n",i,i);
        }
        return mseqbits;
} static void
inputvar (selvar)                                                               inputvar
Vertex *selvar;
/* pack a selvar if it is imported or exported by the process being merged */
{
        Vertex *w, *u;
        int i;
        static int isimport();
        if (selvar->type.i == RECORD || selvar->type.i == BIGREC) {
                for (w = selvar->child.v; w; w = w->sibling)
                        inputvar (w);
                return;
        }
        if (selvar->type.i == ASSIGN)
                selvar = selvar->child.v->child.v;
        if (proc->ext.parent->type.p.merging) {
                for (w = merging->child.v; w; w = w->sibling){
                        if (w->op == SELVAR && w->type.i == ASSIGN){
                                if (w->child.v->op)
                                        continue;
```

```
                for (u = w->child.v->child.v; u && u != selvar; u = u->ext.parent)
                        ;
                        if (u) break;
                }
            }
            if (!w) return;
        } else if (!proc->type.p.merging) {
            for (w = merging->child.v; w; w = w->sibling)
                if (w->op == IMPORT)
                    if (isimport (selvar, w->child.v))
                        break;
            if (!w) return;
        }
        if (selvar->ext.bounds) {
            cerror (selvar->line, "unsupported array as merge input: %s",
                selvar->name->s);
            return;
        }
        out (2, "PACK(");
        cpath (selvar);
        inputbits += i = getbits (selvar);
        out (0, ",%d)\n", i);
} static int
isimport (selvar, w)                                                                isimport
Vertex *selvar, *w;
/* check if a selvar or a parent of it appears in the import list */
{
        Vertex *u;
        if (!w->op && w->type.i == ASSIGN) {
            for (u = selvar; u; u = u->ext.parent)
                if (u == w->child.v)
                    return 1;
        }
        if (w->sibling && isimport (selvar, w->sibling)) return 1;
        if (w->op && w->child.v && isimport (selvar, w->child.v)) return 1;
        return 0;
} exports (v, b)                                                                      exports
Vertex *v;/*pointer to variable in tree*/
Vertex *b;/*pointer to current bounds vertex*/
{
        int i;
        Vertex *u, *w;
        static Vertex *proc;
        static hide;
        for (i = b ? b->child.i : 1; i--; ) {
            if (b && b->sibling) {
                exports (v, b->sibling);
            } else if (v->op == PROC) {
                proc = v;
                if (!v->ext.parent->type.p.merging) {
                    out (0, "char mexport[]={\n");
                    tab (2);
                }
                for (w = v->child.v; w; w = w->sibling) {
                    if (w->name)
                        exports (w, w->ext.bounds);
                }
                if (!v->ext.parent->type.p.merging)
                    out (0,"\n};\n");
            } else if (v->type.i == RECORD || v->type.i == BIGREC) {
                if (v->op && v->op != SELVAR)
                    hide = 1;/*this is really useless now,
                        as only selvars may be records*/
                for (w = v->child.v; w; w = w->sibling)
                    exports (w, w->ext.bounds);
                hide = 0;
            } else if (hide || v->op && v->op != SELVAR) {
                out (0, "0,");
            } else if (!proc->ext.parent->type.p.merging) {
                out (0, "1,");
            } else {
                for (w = merging->child.v; w; w = w->sibling){
                    if (w->op == SELVAR && w->type.i == ASSIGN && !w->name){
                        if (w->child.v->op)
                            continue;
                        for (u = w->child.v->child.v; u && u != v; u = u->ext.parent)
                            ;
                        if (u) break;
                    }
                }
                if (w) out (0, "1,");
                else out (0, "0,");
            }
        }
        return;
} loopstart (lab, ind, b)                                                             loopstart
int *lab, ind;
Vertex *b;
/*
 * Generate the code to begin a loop:
 *
 *      {/*loop[i1<n1]...[ik<nk]*
 *          register i1,...,ik;
 *      Ln:
 *
 * The label index is picked from 'labnum' and saved in *lab,
 * to be used later by a matching loopend() (see below).
```

* In a start of a new C function, 'labnum' may be reset externally.
*/
{
    Vertex *u;
    int i;
    out (1, "{/*loop");
    for (i = ind, u = b; u; u = u->sibling)
        out (0, "[i%d<%d]", i++, u->child.i);
    out (0, "*/\n");
    out (2, "register ");
    for (;;) {
        out (0, "i%d=0", ind++);
        if (b = b->sibling) outc (',');
        else break;
    }
    out (0, ";\n");
    out (1, "L%d:\n", *lab = labnum++);
    return;
} loopend (lab, ind, b)                                                                loopend
int *lab, ind;
Vertex *b;
/*
* Generate the code to end a loop:
*       if(...)goto Ln
*       }/*end[i1<n1]...[ik<nk]*
*
* The expression inside the 'if' is generated by loopexpr() below.
*/
{
    out (2,"if(");
    loopexpr (ind, b, 1);
    out (0, ")goto L%d;\n", *lab);
    out (0, "}/*end");
    for (; b; b = b->sibling)
        out (0, "[i%d<%d]", ind++, b->child.i);
    out (0,"*/\n");
} loopexpr (ind, b, f)                                                                 loopexpr
int ind, f;
Vertex *b;
/*
* Generates recursively loop expressions of the form
*      (    ++ik<nk)||(ik=0, ..., ++il<nl)
* f=1 when called by loopend() for il,
* f=0 for subsequent self-calls for i2,...,ik.
*/
{
    if (b->sibling) /*not ik*/
        loopexpr (ind + 1, b->sibling, 0);
    else outc ('(');
    out (0, "++i%d<%d)", ind, b->child.i);
    if (!f) out (0, "||(i%d=0,", ind);
} int
runpath (v)                                                                          runpath
Vertex *v;
{
    int i, j;
    Vertex *w;
    if (!(w = v->ext.parent))
        return 0;/*arbitrary*/
    i = runpath (w);
    out (0, ".%s", v->name->s);
    if (w = v->ext.bounds) {
        if (v->op == PROC)
            i = v->ext.range->child.i;
        for (j = 0; w; j++, w = w->sibling)
            out (0, "[%%d]");
        outc ('"');
        while (j--)
            out (0, ",i%d", i++);
        out (0, ");fprintf(fp,\"");
    }
    if (v->op == PROC) return indices;
    else return i;
} toc (v, level)                                                                       toc
Vertex *v;
int level;
/* print table of contents */
{
    static procnum;
    Vertex *u;

if (level >= 0) {
        int k = level;
        out (0, "%d:\t",procnum++);
        while (k--)
            out (0, "  ");/*two spaces!!*/
        srpath (v);
        if (v->type.p.merged) {
            if (v->type.p.reduced) out (0, "(reduced)\n");
            else out (0, "(merged)\n");
            return;
        } else outc ('\n');
    }
    for (u = v->child.v; u; u = u->sibling)
        if (u->op == PROC)
            toc (u, level+1);
}

```
bstor (v, f)                                                                                    bstor
Vertex *v;
int f;
/*
 * Define storage for block counters for implementation.
 * Free process needs no such counter, so it is called with f set.
 * A merged process needs such a counter, but its childern do not.
 */
{
        static procnum;
        Vertex *u;

if (v->type.p.trans && !f) {
                int size = 0, blocks = 0;
                for (u = v->child.v; u; u = u->sibling)
                        if (u->op == TRANS)
                                blocks++;
                if (blocks > 1) {
                        for (; blocks; blocks >>= 1) size++;
                        out (1, "%s b%d", cintype (size), procnum);
                        bounds (v);
                        out (0, ";\n");
                }
        }
        if (v->ext.parent) procnum++;
        if (v->type.p.prod)
                for (u = v->child.v; u; u = u->sibling)
                        if (u->op == PROC)
                                bstor (u, f || u->type.p.free ||
                                        u->type.p.merged && u->ext.parent->type.p.merged);
}

/*VARARGS*//*PRINTFLIKE2*/
out (tabs, f, a, b, c, d, e)                                                                    out
/* formatted print with indentation */
register tabs;
char *f;
{
        if (tabs) for (tabs += indent; tabs>0; tabs--) putc('\t');
        if (f) fprintf(yyout, f, a, b, c, d, e);
}
```

APPENDIX C

```
static char WHAT[] = "@(#)analyze.c 6.3 (AT&T-BL)     2/22/90      20:47:39";
/*
 *      Release 1.1 - January 29, 1986.
 *      Release 2.1 - June 5, 1986.
 *      Release 3.1 - August 27, 1986.
 *      Release 4.1 - February 19, 1987.
 *      Release 5.1 - September 27, 1987.
 *      Release 6.1 - October 17, 1989.
 *
 *      Author: Zvi Har'El, AT&T Bell Labs, Murray Hill, NJ07974,
 *              and the Technion, Israel Institute of Technology.
 *      Copyright (C) AT&T Bell Laboratories
 *
 *      E X C E R P T  - S T A B I L I T Y   C H E C K
 */
#include "analyze.h"
{       .move = rst1;
        if (!rst1->status.permanent)
        {       rst1->status.move = 1;
                if (option['s']) rst1->origin = rst;
        }
        if (!unstable)
        {       if (rst1->status.permanent && rst1->status.move)
                        unstable = 1;
                else if (rst->status.move)
                        unstable = -1;
                if (unstable && option['s'])
                {       if (unstable < 0)
                        {       RST *temp;
```

```
                temp = rst->origin;
                rst->origin = rst1;
                rst1 = rst;
                rst = temp;
            }
            if (rst1->origin->status.permanent)
                warning ("Stability failed at %u(%u)->%u(%u)->%u(%u).",
                        rst->index, rst->dfnumber,
                        rst1->index, rst1->dfnumber,
                        rst1->origin->index, rst1->origin->dfnumber);
            else
                warning ("Stability failed at %u(%u)->%u(%u)->%u(?).",
                        rst->index, rst->dfnumber,
                        rst1->index, rst1->dfnumber,
                        rst1->origin->index);
            if (verbose.error)
            {   liststate (startdiff, rst, stderr);
                liststate (contdiff, rst1, stderr);
                liststate (contdiff, rst1->origin, stderr);
            }
            goto fail;
        }
        if (unstable)
        {   char *verb;
            verb = unstable > 0 ? "exit" : "enter";
            if (rst1->status.permanent)
                warning ("Stability failed %sing %u(%u)->%u(%u).",
                        verb, rst->index, dfnumber,
                        rst1->index, rst1->dfnumber);
            else
                warning ("Stability failed %sing %u(%u)->%u(?).",
                        verb, rst->index, dfnumber,
                        rst1->index);
            if (verbose.warning)
            {   liststate (startdiff, rst, stderr);
                liststate (contdiff, rst1, stderr);
            }
        }
    }
}
```

Subject: Analysis of Discrete Event Coordination

1. Introduction

Continuous-time processes such as asynchronous distributed controllers as well as intrinsically discrete-time distributed processes may coordinate according to discrete events. When such coordination is a significant factor in a system's behavior, its analysis can be extremely difficult in practice: whereas conventional computer programs are serial and deterministic, distributed programs involve branching created by parallelism and non-determinism, resulting in a diversity of possible behaviors which grows geometrically with increasing time.

Formal verification of such processes has been thrust to the forefront by researchers interested in the problem of how to develop control-intensive computer hardware and software so that it works properly. The primary basis for this thrust is the failure of classical methods centered around simulation to cope with increasingly complex coordination problems, brought on by asynchrony and distributed control. It is now standard among theoreticians to analyze such coordination in the context of formal assertions founded in logic, formal language theory and general mathematical reasoning, employing a variety of modelling paradigms such as finite state machines, Petri nets, process algebras, partial orders and so on. Given a modelling paradigm and a formal assertion context such as logic or language theory, a relationship is drawn between the assertion context and the modelling paradigm, in order through formal assertions to draw conclusions about the models. While recent work has spawned a large number of interesting and varied ideas, only a very small number of these truly address the original problem of developing properly functioning programs.

The reason for this seems to be that in order truly to address this problem, one needs a methodology which embraces three objectives simultaneously: formal verification, complexity management and formal refinement, as follows. Formal verification, the basis upon which one determines whether development objectives have been met, has a utility which may be measured by expressiveness (what class of properties can be verified), mitigated by the complexity of the verification methodology. There may be a tradeoff between expressiveness and complexity: the more expressive the formal framework, the more complex and hence less useful the methodology. To address the original problem as a practical matter, one seeks the most expressive framework in which one can deal with verification tractably in a largely algorithmic fashion. As the formal framework in any case introduces a high level of complexity, there must be techniques built into the methodology which can circumvent this complexity; otherwise, the methodology is intractable and the original problem remains unsolved. Finally, to solve the original problem, one needs a methodology to map a design specification to an implementation. Such a mapping, commonly known as a refinement mapping, is needed to guarantee that properties verified in a design remain true in an implementation. (Practice has shown that the process of implementation of a design is no less a source of errors than conceptual flaws in the design itself.) These three objectives: verification, complexity management and refinement are like three legs of a stool supporting development of properly functioning hardware and software; less any leg, the support is questionable.

This paper presents a methodology founded in automata theory which encompasses verification, complexity management and refinement. Verification is cast in terms of testing whether the formal language $\mathscr{L}(D)$ of a design specification D is contained in the formal language $\mathscr{L}(T)$ of a "task" T which is to be performed by the design. Complexity management and refinement both are cast in terms of transformations called "reductions". Design specifications D are modelled by state machines, while tasks T are defined by automata.

In order to test whether $\mathscr{L}(D) \subset \mathscr{L}(T)$, one may reduce D, relative to T, to a less complex D' with an associated less complex T' such that $$\mathscr{L}(D') \subset \mathscr{L}(T') \Rightarrow \mathscr{L}(D) \subset \mathscr{L}(T). \tag{1.1}$$

The reduction of D to D', in that it is relative to the task T to be verified, is significantly more powerful than equivalence and minimization. For example, suppose that T refers only the parity of outputs $1, \ldots, N$ of D; then, in order to test whether D performs the task T, D may be simplified by abstracting its N output values to 2 values: (odd and even), although this reduction of D is not equivalent to D and D may be minimal up to equivalence.

The basic concept of "reduction" is as old as mathematics: reduce the amount of effort needed to prove a result by eliminating extraneous or redundant details. To one extent or another, it is used in most actual efforts concerned with the analysis or simulation of real systems. However, it is important to give this basic concept a precise embodiment, whose validity can be verified algorithmically. In this paper, the reduction transformation D→D' is presented in the form of a formal language homomorphism, whose validity can be verified in time linear in the size of components of D, and the number of such components.

It is shown furthermore that refinement is simply inverse reduction, and thus is handled through the same mechanism. In (1.1), if D' is a design, if D is an implementation of D', if T' is a task verified for the design D' and if T is the naturally induced image of T' under the refinement transformation D'→D, then the relation (1.1) means that tasks verified for the design remain valid for the implementation. In practice, a design may undergo a succession of refinements, each step refining or "implementing" the "design" of the previous step, consistent with (1.1). By transitivity of such stepwise refinement, (1.1) obtains when D is the ultimate implementation and D' is any design in the refinement hierarchy, verified for any task T' defined at the "level" of D'.

Because of the very large complexity associated with real designs, even defining the reduction homomorphism D→D' directly may well be intractable, simply on account of the size of D. This problem can be circumvented by defining the homomorphism D→D' indirectly in terms of homomorphisms on components of D. If D may be factored as $D = D_1 \otimes \ldots \otimes D_k$ and D' likewise factored as $D' = D_1' \otimes \ldots \otimes D_k'$, then it is shown that the existence of component homomorphisms $\Phi_i : D_i \to D_i'$ for $i = 1, \ldots k$ imply the existence of a product homomorphism $$\prod_{i=1}^{k} \Phi_i : D \to D'. \tag{1.2}$$

Although the size of D grows geometrically with k, the complexity of verifying that each $\Phi_i$ has the required properties is only linear in the size of $D_i$.

In order to carry out a program for the mutual support of formal verification, reduction and refinement as above, it is important to have a close relationship between the formal assertion context used for verification (say, logic or automata theory) and the modelling paradigm used to represent the design specification. Without such a close relationship, methodologies for reduction and refinement may be difficult to discern. Specifically, if the modelling paradigm and the assertion context are not closely related, it may be difficult to relate transformations in the former to transformations in the latter in such a way that an assertion valid for a model transforms to an assertion valid for the transformed model.

As already indicated, this paper adopts the modelling paradigm of finite state machines, using formal assertions founded in automata theory. Finite state machines are bound closely to automata through their respective languages and the similarities of their generators, both given in terms of finite directed graphs. Just how this close relationship affords a tractable theory for reduction and refinement is the subject of this paper. It should be conceded that the regular languages generated by automata are not sufficiently expressive to capture assertions dealing with the correctness of many distributed algorithms, such as those employing recursion and induction. However, verification of such algorithms is problematic in any context, and there is much debate concerning which really have been proved, or even what is a proof [Ba89]. Therefore, there may be some justification to the contention that regular (and ω-regular) assertions encompass the major portion of assertions admitting widely acceptable proofs. If this is the case, it may be futile to adopt a more powerful context for formal assertions, only to find that widely believed proofs (or any proofs at all) are few and far between. On the other hand, automata theory admits certain weak forms of induction [KM89], as well as a context in which to reason about parameterized automata and state machines. This affords a framework in which certain non-regular assertions can be reduced to regular assertions, or at least reasoned about to the extent they may be reasoned about in any other context. While there has been only preliminary thinking in this direction, it may hold a promise for extending automata theory to effectively computable results. In any case, since a Turning machine is an infinite state automaton (with bounded state transitions), all recursively enumerable assertions may be expressed in this context (although not necessarily decided).

In order to facilitate the treatment of state machine models in the context of assertions defined by automata, it has been convenient to alter slightly the standard definitions of both, and present each through a uniform context of enabling transition predicates, non-deterministic outputs (for state machines) and a new acceptance condition (for ω-automata). The enabling transition predicates (Boolean functions of inputs and outputs) combine (through Boolean conjunction, disjunction and negation) to form a Boolean algebra basic to the theory of reduction developed here. State machines are taken to be essentially Moore machines, but unlike Moore machines, the state machines used here are endowed with non-deterministic outputs. This non-determinism is important for several reasons. First of all, it provides a necessary mechanism to introduce uncertainty or variety into a design, allowing designs to be specified as closed systems, containing all "input" and "output" within. (This is basic to the analysis described here.) Nondeterminism also may be used to model incompletely defined response, indeterminate delay and actions whose control is external to the model (and thus unknown, but for their effect). Furthermore, non-determinism affords a "place-keeping" mechanism for refinement: details to be added at a later point in development may be modelled non-deterministically in the high-level design. Finally, non-determinism affords an important reduction mechanism; a deterministic state machine D may be replaced by a non-deterministic state machine D' with fewer states and larger language over the same alphabet; if such a reduced machine D' were shown to have a certain (ω-) regular language property T, then in the sense of (1.1), the original machine would have that property T as well (although the reduced machine and the original machine may by no means be equivalent in any general sense). Such a reduced D' may be obtained by "freeing" a state machine component $D_i$ of D (cf. (1.2) by replacing $D_1$ with $D_1'$ where $D_1'$ has a single state from which it non-deterministically outputs all the outputs of $D_1$. Finally, while a Moore machine with non-deterministic transitions cannot (in general) be determinized, allowing non-deterministic outputs is enough to be able to determinize the transitions of the machine, an important step in many procedures.

The Boolean algebra generated by transition predicates affords a basis for decomposition of state machines. It turns out that a state machine can be represented by a matrix over this Boolean algebra in such a way that decomposition of the state machine into coordinating component machines is represented by the tensor product of the matrices associated with each component machine. This decomposition is essential for verification of reduction and refinement, which must be accomplished component-wise in large systems. Conventional homomorphism of Boolean algebras gives rise to the language homomorphisms used in the theory developed here.

Formal assertions about state machine models are given here in terms of infinitary (ω-regular) automata. Such automata, while generally applied to reasoning about non-terminating processes, apply as well to terminating processes, through concatenation of an infinite tail of "null" symbols to each finite prefix; thus, there is no reason to deal with languages comprised of both (finite) strings and (infinite) sequences together as is commonly done: sequences alone suffice to model both. Like the state machines, the ω-automata used here, the L-automata defined over the Boolean algebra L. comprise a slight variation on standard ω-automata. In addition to being defined in terms of the same underlying transition structure and Boolean algebra L as the state machines, they have two acceptance conditions which in an intuitive sense, may be associated, one with "fairness" or "liveness" and the other with "safety" and "eventuality" properties, as they are often understood. While experience [HK90] has indicated the practical utility of this definition with regard to specifying tasks, perhaps more important is that it gives rise to a decomposition technique in which any ω-regular property can be built up from smaller, more easily testable properties.

Classically, given automata Λ and Γ, in order to test whether $\mathscr{L}\Lambda \subset \mathscr{L}(\Gamma)$, one first constructs an automaton $\widetilde{\Gamma}$ which defines the complementary language $\mathscr{L}(\Gamma)'$, then one constructs an automaton $\Lambda * \widetilde{\Gamma}$ satisfying $\mathscr{L}\Lambda * \widetilde{\Gamma} = \mathscr{L}(\Lambda \cap \mathscr{L}(\widetilde{\Gamma})$ and finally one tests whether $\mathscr{L}(\Lambda * \widetilde{\Gamma}) = \phi$. This entire procedure is at least as complicated as constructing $\widetilde{\Gamma}$, and since Λ may be taken to define all sequences (over the given alphabet), testing language containment is at least as hard as testing whether $\mathscr{L}(\widetilde{\Gamma}) = \phi$, the so-called "emptiness of complement" problem. This problem is PSPACE-complete in the number of states for non-deterministic Büchi automata [SVW85], while deterministic Büchi automata are strictly less expressive than non-deterministic Büchi automata.

On the other hand, given an ω-regular language $\mathscr{L}$, a finite number of deterministic L-automata $\Gamma_1, \ldots, \Gamma_n$ may be found such that $$\mathscr{L} = \bigcap_{i=1}^{n} \mathscr{L}(\Gamma_i).$$

(This is not true for Büchi automata.) In order to test $\mathscr{L}(\Lambda) \subset \mathscr{L}$, one tests $\mathscr{L}(\Lambda) \subset \mathscr{L}(\Gamma_i)$ for i=1, ..., n. Each test $\mathscr{L}(\Lambda) \subset \mathscr{L}(\Gamma_i)$ may be completed in time linear in the number of edges of Λ and linear in the number of edges of $\Gamma_i$ [Ku87]. Not only do the several individual tests $\mathcal{L}(\Lambda) \subset \mathcal{L}(\Gamma_i)$, $i=1,\ldots,n$ defined by the task decomposition $$\mathcal{L} = \bigcap_i \mathcal{L}(\Gamma_i).$$

provide a test which is more tractable in bounded space than the single test $\mathcal{L}(\Lambda) \subset \mathcal{L}$, but it provides a greater potential for reduction; each test $\mathcal{L}(\Lambda) \subset \mathcal{L}(\Gamma_i)$ may be separately reducible to a test $\mathcal{L}(\Lambda_i') \subset \mathcal{L}(\Gamma_i')$, with each $\Lambda_i'$ different for different i.

2. Preliminaries

Conventionally, the transition structure of a state machine or automaton is viewed dynamically in terms of a "successor" relation on a set of states; this relation defines a "next" state (for deterministic structures) or in general, a set of next states, for each "current" state and "input". I prefer to view a transition structure statically as a directed graph whose vertices correspond to states and whose edges are labelled respectively with the set of input values which enable the associated state transition (cf. [Ts59]). The labelled graph is defined by its "labelled" adjacency matrix, whose ij-th element is the label on the edge from vertex i to vertex j. We will see that this provides a more convenient notation for combining transition structures than the dynamic definition. Furthermore, it turns out to be natural and useful to impose an algebraic structure on the inputs. Specifically, inputs are manipulated through predicates over input tokens. These predicates, which naturally form a Boolean algebra (a set closed under conjunction, disjunction and negation), provide a succinct means to represent sets of input values. For example, if inputs (say, from two sources) are represented in terms of the respective values of variables x and y, the enabling predicate for a certain transition may be represented syntactically as "x<y", denoting the set of all input pairs satisfying that relation. If L is the Boolean algebra of such predicates (semantically, the set of all subsets of inputs), then a transition structure is a square matrix over L. Conversely, for any Boolean algebra L, a square matrix over L may be interpreted as a transition structure for the set of inputs represented by the atoms of L (see below).

2.1 Boolean Algebra

Let L be a Boolean algebra, with meet (disjunction, product) *, join (conjunction, sum) +, complement ~, multiplicative identity 1 and additive identity 0 [Ha74]. A Boolean algebra admits of a partial order $\leq$ defined by $x \leq y$ iff $x*y=x$. If $x \leq y$ and $x \neq y$, write $x < y$. Atoms are minimal elements with respect to this order. A Boolean algebra is said to be atomic if every non-zero element majorizes an atom. In this case every non-zero element can be expressed as a sum of atoms in a unique way. In this paper, every Boolean algebra L is assumed to be atomic (it is certainly true if L is finite). Let S(L) denote the set of atoms of the Boolean algebra L. For the purposes of this paper, little is lost if one thinks of L as $2^S$, the power field over S, which is the set of all subsets of a finite set S (the "alphabet") where $1=S$, $0=\phi$, 8 is set intersection, + is set union and ~ is set complementation in S; the atoms of L in this case are the (singleton sets comprised of) elements of S. A homomorphism of Boolean algebras is a map which is linear with respect to *, + and ~ (i.e., $\phi(x*y)=\phi(x)8\phi(y)$, $\phi(x+y)=\phi(x)+\phi(y)$ and $\phi(\sim x)= \sim \phi(x)$). Any homomorphism is order-preserving ($x<y \Rightarrow \phi(x)<\phi(y)$).

Every Boolean algebra contains as a subalgebra the trivial Boolean algebra $\mathbb{B}=\{0,1\}$. If $S \subset L$ is a subset of L, $\mathbb{B}[S]$ is defined to be the smallest subalgebra of L containing S. A sum or product indexed over the empty set is 0, 1 respectively.

Suppose $L_1, \ldots, L_k$ are subalgebras of a Boolean algebra L. Define $$\prod_{i=1}^{k} L_i = \left\{ \sum_{j \in J} x_{ij}^* \ldots *x_{kj} \mid x_{ij} \in L_i \text{ for } i=1,\ldots,k, j \in J \text{ and } J \text{ is finite} \right\}.$$

It is easily checked that $\pi L_i$ is a subalgebra of L, in fact $\pi L_i = \mathbb{B}[\cup L_i]$. It is easily seen that $S(\pi L_i) = \{s_1^* \ldots *s_k \mid s_i \in S(L_i), 1 \leq i \leq k\} \setminus \{0\}$. Say $L_1, \ldots, L_k$ are independent if $0 \neq x_i \in L_i$ for $i=1,\ldots,k \Rightarrow x_1* \ldots *x_k \neq 0$. Clearly, $L_1, \ldots, L_k$ are independent if and only if $S(\pi L_i) = \{s_1^* \ldots *s_k \mid s_i \in S(L_i), 1 \leq i \leq k\}$. Write $L_1.L_2. \ldots .L_k = \pi L_i$.

2.2 L-Matrix; Graph

Let L be a Boolean algebra, let V by a non-empty set and let M be a map $$M: V^2 \to L$$

(where $V^2 = V \times V$ is the Cartesian product). Then M is said to be an L-matrix with state space $V(M)=V$. The elements of $V(M)$ are said to be states or vertices of M. An edge of an L-matrix M is an element $e \in V(M)^2$ for which $M(e) \neq 0$. ($M(e)$ is the "label" on the edge e.) The set of edges of M is denoted by $E(M)$. If $e=(v,w) \in E(M)$, let $e^- = v$ and $e^+ = w$. If M is an L-matrix and $L \subset L'$ then M is an $L'$-matrix as well.

An L-matrix provides the transition structure for a state machine or automaton. In automata-theoretic terms, the "alphabet" is the set of atoms $S(L)$ and an "edge label" $M(e) \in L$ of an L-matrix M represents the set of atoms $\lambda = \{s \in S(L) \mid s \leq M(e)\}$ which enable the transition along the edge e, since $$M(e) = \sum_{s \in \lambda} s.$$

Since any two distinct atoms $s,t \in S(L)$ satisfy $s*t=0$, M is "deterministic" if for each state v and each "input letter" $s \in S(L)$, $s \leq M(v,w)$ for at most one $w \in V(M)$. Likewise, M is "complete" if for each $v \in V(M)$ and each $s \in S(L)$, $s \leq M(v,w)$ for some $w \in V(M)$. This is recapitulated below.

An L-matrix M is deterministic if for all $u,v,w \in V(M)$, $v \neq w \Rightarrow M(u,v)*M(u,w)=0$. An L-matrix M is complete if for all $v \in V(M)$ the sum $$\sum_{w \in V(M)} M(v,w) = 1.$$

If G is an L-matrix and $W \subset V(G)$, then $G|_W$, the restriction of G to W, is the L-matrix defined by $V(G|_W)=W$ and $G|_W(e)=G(e)$ for all $e \in W^2$.

A graph is a $\mathbb{B}$-matrix. The graph of the L-matrix is the graph $\bar{M}$ with state space $V(\bar{M})=V(M)$, defined by $$\overline{M}(e) = \begin{cases} 1 & \text{if } M(e) \neq 0 \\ 0 & \text{otherwise.} \end{cases}$$

A path in a graph G of length n is an (n+1)-tuple $v = (v_0, \ldots, v_n) \in V(G)^{n+1}$ such that $G(v_i, v_{i+1}) = 1$ for all $0 \leq i < n$; the path v is a cycle if $vv_n = v_0$. The path v is said to be from $v_0$ to $v_n$. The path v contains the edge $(v,w) \in E(G)$ if for some i, $0 \leq i < n$, $v_i = v$ and $v_{i+1} = w$. If $C \subset V(G)$ and each $v_i \in C$, then v is in C. A cycle (v,v) of length 1 is called a self-loop (at v). A vertex $v \in V(G)$ is reachable from $I \subset V(G)$ if for some $v_0 \in I$, there is a path in G from $v_0$ to v. Any statement about a "path" in a L-matrix $\overline{M}$ is to be construed as a statement about that path in $\overline{M}$.

Given an L-matrix M, a sequence $x \in L^\omega$ (a sequence, by definition, is infinite) and a sequence of states $v \in V(M)^\omega$, say v is a run (in M) of x from $v \in V(M)$ provided $v_0 = v$ and $x_i * M(v_i, v_{i+1}) \neq 0$ for all i.

Let G be a graph. A set $C \subset V(G)$ containing more than one element is said to be strongly connected provided for each pair of distinct elements $v, w \in C$ there is a path from v to w. A singleton set $\{v\} \subset V(G)$ is strongly connected if $(v,v) \in E(G)$. A maximal strongly connected set is called a strongly connected component (of G). Clearly, for every graph G, V(G) is uniquely partitioned into strongly connected components and a non-strongly connected set, each vertex of which has no self-loop. (The requirement that a single vertex have a self-loop in order to be strongly connected, at some variance with the customary definition, is important to the theory developed here.)

Let G,H be graphs and let $\Phi: V(G) \to V(H)$ be a map which satisfies $(v,w) \in E(G) \Rightarrow (\Phi(v), \Phi(w)) \in E(H)$. Then $\Phi$ extends to a map $\Phi: E(G) \to E(H)$ and we say $\Phi$ is a homomorphism from G to H, and write $$\Phi: G \to H.$$

Let M and N be L-matrices. Their direct sum is the L-matrix $M \oplus N$ with $V(M \oplus N) = V(M) \cup V(N)$, defined by $$(M \oplus N)(v,w) = \begin{cases} M(v,w) & \text{if } v,w \in V(M), \\ N(v,w) & \text{if } v,w \in V(N), \\ 0 & \text{otherwise.} \end{cases}$$

their tensor product is the L-matrix $M \otimes N$ with $V(M \otimes N) = V(M) \times V(N)$, defined by $$(M \otimes N)((v,w),(v',w')) = M(v,v') * N(w,w').$$

The direct sum and tensor product can be extended to a commutative, associative sum and an associative product, respectively, of any finite number of L-matrices. If L is complete (i.e., closed under infinite sums and products), the direct sum and tensor product can be extended to infinite sums and products as well.

Lemma: The tensor product of deterministic L-matrices is deterministic. The tensor product of complete L-matrices is complete.

Proof: Let $u, v, w \in V(M)$ and $u', v', w' \in V(N)$. Then $$(M \otimes N)[(v,v'), (w,w')] * (M \otimes N)[(v,v'), (u,u')] =$$

$$M(v,w) * N(v',w') * M(v,u) * N(v',u') =$$

$$(M(v,w) * M(v,u)) * (N(v',w') * N(v',u')).$$

If $(w,w') \neq (u,u')$ and M, N are deterministic, then either the left factor or the right factor must be zero, and it follows that $M \otimes N$ is deterministic. If M, N are complete then $$\sum_{w,w'} (M \otimes N)[(v,v'), (w,w')] =$$

$$\sum_{w,w'} M(v,w) * N(v',w') = \sum_w M(v,w) * \sum_{w'} N(v',w') = 1 * 1 = 1$$

and it follows that $M \otimes N$ is complete

Let G, H be graphs. The projection $$\pi_G: V(G \otimes H) \to V(G)$$

induces a (not necessarily onto) projection $$\pi_G: E(G \otimes H) \to E(G).$$

If G and H are matrices, $\pi_G$ will denote the projection on the underlying graph $\overline{G}$. Given $G_1, G_2, \ldots$, the projections $\pi_{G_i}$ may be written as $\pi_i$, for convenience.

3. L-Automata

Finite state automata which accept sequences (rather than strings) define the $\omega$-regular languages. This class of automata is established as a model in logic, topology, game theory and computer science [Bu62, Ra69, Ra72, Ch74, Ku87a, SVW85, etc.]. In computer science, such automata can be used to model non-terminating processes such as communication protocols and integrated hardware systems [AKS83, DC85, Ku85, BC87, KM90, etc.], as well as terminating processes, as already explained. Several different types of such automata have been proposed [Ch74, Sa88], distinguished by the condition under which a "run" of the automaton is accepted. While each type of automaton is well-suited to various applications, none proved well-suited for the reductions described here. A new type of automaton [Ku87] proved better-suited, for reasons described in the introduction.

An L-automaton is a 4-tuple $$\Gamma = (M_\Gamma, I(\Gamma), R(\Gamma), Z(\Gamma))$$

where $M_\Gamma$, the transition matrix of $\Gamma$, is a complete L-matrix, $\phi \neq I(\Gamma) \subset V(M_\Gamma)$, the initial states of $\Gamma$, $R(\Gamma) \subset E(M_\Gamma)$, the recurring edges of $\Gamma$ and $Z(\Gamma) \subset 2^{V(M_\Gamma)}$, the cycle sets of $\Gamma$, is a (possibly empty) set of non-empty subsets of $V(M_\Gamma)$. Set $V(\Gamma) = V(M_\Gamma)$, $E(\Gamma) = E(M_\Gamma)$ and $\Gamma(v,w) = M_\Gamma(v,w)$ for all $v, w \in V(\Gamma)$. Let $R^-(\Gamma) = \{e^- | e \in R(\Gamma)\}$ and $R^+(\Gamma) = \{e^+ | e \in R(\Gamma)\}$. Define the graph of $\Gamma$, $\overline{\Gamma} = \overline{M}_\Gamma$. Let $|\Gamma| = \text{card} V(\Gamma)$.

A sequence of states $v = (v_0, v_1, \ldots) \in V(\Gamma)^\omega$ is $\Gamma$-cyclic if for some integer N and some $C \in Z(\Gamma)$, $v_i \in C$ for all $i > N$, while v is $\Gamma$-recurring if $\{i | (v_i, v_{i+1}) \in R(\Gamma)\}$ is infinite. A sequence of atoms $x \in S(L)^\omega$ is accepted by, or is a tape of $\Gamma$ provided x has a $\Gamma$-cyclic or $\Gamma$-recurring run from an initial state. Such a run is an accepting run (of x). The set of tapes of $\Gamma$, $\mathscr{L}(\Gamma)$, is defined to be the language of (or accepted by)

Γ. Two L-automata Γ and Γ' are said to be equivalent if $\mathscr{L}(Γ)=\mathscr{L}(Γ')$. A chain of Γ is a pair (v,x) where v is an accepting run of a tape x. Let $\mathscr{L}(Γ)$ denote the set of chains in Γ.

The L-automaton Γ is said to be deterministic if $M_Γ$ is deterministic; if Γ is deterministic and $|I(Γ)|=1$ then Γ is said to be strongly deterministic. (Customarily, "deterministic" has been used in the literature to mean what is here called "strongly deterministic"; however, strong determinism often leads to unnecessary restriction, for example, in automata complementation and minimization, where only determinism is required.)

(3.1) Lemma: A tape accepted by a strongly deterministic L-automaton has a unique accepting run.

Relationships between L-automata and other types of automata are given in [Ku87].

4. L-Process

Evidently, L-automata are not directly suited to define coordinating discrete event systems, as there is no direct way to capture "coordination" of L-automata: they have no outputs, and hence no way to communicate. Instead, a coordinating discrete-event system may be built up from Moore machines, the outputs of each machine providing inputs to various machines. This provides a "data-flow" context [WA85] in which the system is represented by the collection of coordinating machines.

For our purposes here, as already explained in section 1, Moore machines are not quite adequate, on account of their determinism. On the other hand, merely to allow a Moore machine to be non-deterministic is not the answer: a deterministic transition structure is important to be able to compare machines. (Note that a non-deterministic Moore machine may not be determinizable.) Comparison is used to show that one machine abstracts or implements another, for purposes of reduction and refinement. Furthermore, it turns out to be convenient to be able to incorporate fairness constraints directly into the machine definition, rather than through other devices (such as L-automata) which may increase the size of the state space and thus the complexity of verification.

For these reasons, a process is modelled as a Moore-like machine which may at once have non-deterministic outputs and a deterministic transition structure, and incorporate fairness constraints without increasing the size of the state space. Thus, while at each state a Moore machine produces an output as a function of that state, the L-process defined below may produce non-deterministically one of several outputs possible from each state (the set of outputs possible form a state is a function of the state). While the transition structure of an L-process may be deterministic or non-deterministic, it may be determinized through the Rabin-scott subset construction. Although formally an L-process, like an L-automaton, is defined statically, it has a dynamic interpretation: an L-process recursively "selects" an output allowed from the current state and then "resolves" that selection by changing state along a transition enabled by that selection. This dynamic interpretation is the selection/resolution (or s/r) model of coordination proposed by B. Gopinath and this author in 1980 [GK80] and illustrated in [AKS83, Ku85] for modelling communication protocols and more general distributed discrete-event systems. More generally, a "system" is comprised of several L-processes, the selections (outputs) of some providing the "inputs" to others. While the dynamic interpretation is convenient conceptually, as with L-automata, a static definition turns out to be more useful for analysis.

Let L be a Boolean algebra. An L-process A is a 5-tuple $$A=(M_A, S_A, I(A), R(A), Z(A))$$

where $M_A$, $I(A)$, $R(A)$ and $Z(A)$ are as in the definition of L-automaton, except that $M_A$ is not required to be complete; $S_A$, the selector of A, is a function $$S_A: V(A) \to 2^L$$

from the states of A to the set of subsets of L, such that for each $v \in V(A)$, the set of selections of A at v, $S_A(v) \neq \phi$, and for all v, w $\in V(A)$, $$(4.1) \quad A(v,w) \leq \sum_{x \in S_A(v)} x.$$

(The condition (4.1) is explained below.) Let $$S(A) = \bigcup_{v \in V(A)} S_A(v),$$

the set of selections of A, and set $|A|=\text{card } V(A)$. Say that an L-process A is atomic if each selection $x \in S(A)$ is an atom in the Boolean algebra $\mathbb{B}[S(A)]$ generated by the set of selections of A. Thus, A is atomic iff for any selections x,y $\in S(A)$, $x*Y \neq 0 \Rightarrow x=y$. An assumption of process atomicity does not compromise expressiveness, and turns out to be fundamental in the analysis of coordination (cf. (4.10) below). therefore, this paper focuses mainly on atomic processes. Fortunately, atomicity is preserved under combining "independent" processes (4.8, below).

A selection $x \in S_A(v)$ enables the state transition (v, w) provided $x*A(v\ w) \neq 0$, i.e., provided that x and the transition predicate A(v, w) are jointly satisfiable. The condition (4.1) may be interpreted as meaning that every edge from a state v is enabled by some selection from v(i.e., some $x \in S_A(v)$). (This may be enforced by replacing each edge label A(v, w) by $$A(v,w)* \sum_{x \in S_A(v)} x.)$$

This is a technical assumption needed to relate the "language" of A to the language of a derived L-automaton; clearly, it does not limit the expressiveness of L-processes, as a transition from v enabled by no selection from v is never crossed. Note that a condition equivalent to (4.1) is: for all $v \in V(A)$, $$(4.2) \quad \sum_{w \in V(A)} A(v,w) \leq \sum_{x \in S_A(v)} x.$$

If in fact equality holds in (4.2) for all v and $0 \notin S(A)$, then A is said to be lockup-free. (This is related to completeness for L-automata, if we consider an L-automaton to be an L-process which has the single selection $1 \in L$ from each state.) If A is lockup-free, then for each selection $x \in S_A(v)J$, some transition out of v is enabled by x, i.e., $x*A(v,w) \neq 0$ for some $w \in V(A)$. However, equality in (4.2) is stronger than this condition. The problem with this weaker condition is that it is not preserved under products. Since in a strong sense a lockup is a defect in definition, we would like lockup-free components to combine to form a lockup-free system.

Thus far, the transition structure of an L-process has been defined statically and interpreted dynamically. Now, the "behavior" or language of an L-process is defined. While sometimes the "language" of a Moore machine is defined to be the set of all its possible productions (output sequences) this in fact is an inadequate definition, in that it masks the essential relationship between input and output. Rather, in dynamic terms, the language of an L-process is defined to be all sequences of input-output pairs, except for those sequences "ruled out" by the "fairness" constraints. More generally, since a "system" may comprise several L-processes, and the inputs of each process are taken from the selections of other processes, it is most suitable to cast the language of a process in terms of the selections of the system.

Let $x \in S(L)^\omega$ (the set of all sequences of atoms of L), and let A be an L-process. A run of x in A is a run v of x in $M_A$ with $v_0 \in I(A)$. Say x is a tape of A if it admits of a run v in A which satisfies:

$$\text{for some } N>0, i>N \Rightarrow (v_i, v_{i+1}) \notin R(A); \quad (4.3)$$

$$\text{for each } C \in Z(A) \text{ and each } i>0 \text{ there exists } j>i \text{ such that } v_j \notin C. \quad (4.4)$$

Such a run v is said to be an accepting run of x. The language of A, denoted $\mathscr{L}(A)$, is the set of all tapes of A. Two L-processes A and A' are equivalent if $\mathscr{L}(A) = \mathscr{L}(A')$.

A chain of an L-process A is a pair (v,x) where $x \in \mathscr{L}(A)$ and v is an accepting run of x in A. Let $\mathscr{C}(A)$ denote the set of chains of A.

Notice that (4.3) and (4.4) are the negation of the corresponding definitions for an L-automaton. The reason is that R(A) and Z(A) are used in L-processes to define "fairness" constraints: behaviors which are most conveniently and most often expressed negatively (e.g., "A will not forever remain in its 'critical section' states (designated by a cycle set"). Note, however, that there is no intrinsic notion of "fairness": any $\omega$-regular property may be represented, as shown in (4.5).

An L-process A is said to have deterministic resolutions if $M_A$ is deterministic.

(4.5) Proposition: Let L be a Boolean algebra and let $\mathscr{L}$ be an arbitrary $\omega$-regular language over S(L). There exists an L-process A with deterministic resolutions satisfying $\mathscr{L}(A) = \mathscr{L}$ Proof: Let $\Lambda_i, \ldots, \Lambda_i$ be strongly deterministic L-automata satisfying $\cap \mathscr{L}(\Lambda_i) = \mathscr{L}$ Ku87: Thm. 3; Cor. to Prop. 2]. Define L-processes $P_1, \ldots, P_k$ by $P_i = M_{\Lambda_i} 1, I(\Lambda_i), R(\Lambda_i), Z(\Lambda_i))$ where $1(v) = \{1\}$ for all $v \in V(\Lambda_i)$. By (3.1), $\mathscr{L}(P_i) = \mathscr{L}(\Lambda_i)'$. Set $P = (\oplus M_{P_i}, 1, \cup I(P_i), \cup R(P_i), \cup Z(P_i))$. Then $\mathscr{L}(P) = \cup \mathscr{L}(P_i) = \cup \mathscr{L}(\Lambda_i)' = \mathscr{L}$.

In the literature one often finds "process behavior" defined both in terms of (infinite) sequences and (finite) strings. This is an unnecessary complication. If a process models a program which terminates, there is no harm in modelling "termination" as a state in which the process can only self-loop, remaining forever after in that state and selecting thereafter a "null" selection which enables no non-self-loop of any process in the system. On the other hand, if a process terminates on account of a lockup, the view taken here is that this is a defect in the definition: what happens next is undefined.

(it is often convenient purposely to introduce lockups in processes which are implemented on a computer, as a practical means to determine if the lockup condition is every reached, in which case the computer should return an 'error'.)

Given an L-process A, the reachable subprocess of A is the L-process A* defined as the restriction of A to the set of states reachable from I(A). Certainly $\mathscr{L}(A^*) = \mathscr{L}(A)$.

Let A be an L-process. Define the L-automaton A# as follows: $V(A\#) = V(A) \cup \{\#\}$ where # is a symbol not in V(A); $I(A\#) = I(A)$; for v, w $\in$ V(A).

$$A\#(v,w) = A(v,w)$$

while $$A\#(v,\#) = \sum_{x \in S(A) \setminus S_A(v)} x.$$

$$A\#(\#,\#) = 1, \ A\#(\#,v) = 0;$$

$R(A\#) = \phi$, $Z(A\#) = \{V(A)\}$. Say that an L-process A is full if $R(A) = \phi$ and $Z(A) = \{\phi\}$; if A is full then no runs of the transition matrix of A are "unfair" and $\mathscr{L}(A) = \mathscr{L}(A\#)$.

Recall that a regular language C over $\Sigma$ is said to be prefix-closed if for all $x, y \in \Sigma^*$, $xy \in C \Rightarrow x \in C$. The limit of a language C is defined to be the $\omega$-language $$\lim C = \{x \in \Sigma^\omega | \text{for all } i_1 < i_2 < \ldots, (x_0, x_1, x_2, \ldots, x_{ij}) \in C \text{ for all } j\}.$$

(4.6) Theorem: Let L be a Boolean algebra and let $\mathscr{L} \neq \phi$ be an $\omega$-regular language over S(L). Then the following are equivalent:
1. $\mathscr{L} = \mathscr{L}(A\#)$ for some (lockup-free) L-process A;
2. $\mathscr{L} = \lim C$ for some regular prefix-closed C over S(L).

Proof: 1.$\Rightarrow$2.: Let C be the (regular) language accepted by the Rabin-Scott acceptor defined by $M = (M_A\#, I(A), V(A))$ (here V(A) is the set of "final" states). If $x \in \mathscr{L}(A\#)$ then for all $i \ x_0 \ldots x_i \in \mathscr{L}(M)$ so $\mathscr{L}(A\#) \subset \lim C$. If $x \in \lim C$ then $x_0 \ldots x_{ij} \in \mathscr{L}(M)$ for $j = 1, 2, \ldots$. Since there is no outgoing edge from the state $x \in V(M)$, $x \in \mathscr{L}(A\#)$. Thus $\mathscr{L} = \mathscr{L}(A\#) = C$. By construction, C is prefix-closed.

2.$\Rightarrow$1. Let $M = (M, I, F)$ be a deterministic Rabin-Scott acceptor [RS59] with $\mathscr{L}(M) = C$. Since C is prefix-closed, there can be no transition form a state of F' ($\equiv V(M) \setminus F$) to a state of F. Let A be the full L-process with $V(A) = V(M) \setminus F'$, $M_A = M|_{V(A)}, I(A) = I(M) \setminus F'$ and $$S_A(v) = \left\{ x \in S(L) | x^* \sum_{w \in F} M(v,w) = 0 \right\}.$$

Then $$\sum_{w \in V(A)} A(v,w) = \Sigma x (x \in S(L);$$

$w \in V(A); x^*M(v, w) \neq 0)$ and since M is deterministic, this sum is equal to $$\sum_{x \in S_A(v)} x.$$

therefore, A is a lockup-free L-process. Since A is full, $\mathscr{L}(A\#)=C=\mathscr{L}$.

Given L-processes $A_1, \ldots, A_k$ define their (tensor) product to be $$\bigotimes_{i=1}^{k} A_i =$$

$$\left( \bigotimes_{i=1}^{k} M_{A_i}, \; \pi \sum_{i=1}^{k} S_{A_i}, \; X \sum_{i=1}^{k} I(A_i) \; \cup \; \bigcup_{i=1}^{k} \pi_i^{-1} R(A_i), \; \bigcup_{i=1}^{k} \pi_i^{-1} Z(A_i) \right)$$

where $\left( \pi \sum_i S_{A_i} \right)(v_1, \ldots, v_k) =$ $$\{x_1^* \ldots {}^* x_n | x_i \in S_{A_i}(v_i), i=1, \ldots, k\}.$$

(4.7) Lemma: If $A_1, \ldots, A_k$ are L-processes, then their product $\otimes A_i$ is an L-process.

The L-processes $A_1, \ldots, A_k$ are said to be independent provided $$x_i \in S(A_i), (i=1, \ldots, k) > x_1^* \ldots {}^* x_k \neq 0.$$

(4.8) Proposition: If $A_1, \ldots, A_k$ are [atomic and] independent, lockup-free L-processes, then their product $\otimes A_i$ is [respectively, atomic and] lockup-free.

(4.9) Proposition: Let $A_1, \ldots, A_k$ be independent, lockup-free L-processes. Then.

1. $\mathscr{L}\left( \bigotimes_{i=1}^{k} A_i \right) = \bigcap_{i=1}^{k} \mathscr{L}(A_i);$ 2. $\left( \bigotimes_{i=1}^{k} A_i \right)^{\#} = \bigotimes_{i=1}^{k} A_i^{\#}.$ It follows directly from (4.9.1) that $\mathscr{L}\otimes A_i^*)=\mathscr{L}\otimes A_i)^*$.

The discrete-event coordination in a "system" of atomic, independent, lockup-free L-processes $A_1, \ldots, A_k$ is modelled by the behavior of the product L-process $A=A_1\otimes \ldots \otimes A_k$. Interpreting this system dynamically, at each time, in each process $A_i$, a selection $x_i$ possible at the "current" state $v_i$ (i.e., some $x_i \in S_{A_i}(v_i)$) is chosen non-deterministically. The product $x=x_1^* \ldots {}^*x_k$ defines a "current global selection", i.e., a selection of the product A at the state $v=(v_1, \ldots, v_k)$, with $x \in S_A(v)$. At each time, in each process, the current global selection determines a set of possible "next" states, namely those states to which the transition from the current state is enabled by the current global selection. IN $A_i$ the transition from state $v_i$ to state $w_i$ is enabled by x iff $x^*A_i(v_i,w_i)\neq 0$. Under appropriate conditions, each process separately may be considered to resolve the current global selection, by choosing (non-deterministically) one of these possible next states. A system of processes progresses in time by each repeatedly "selecting" and "resolving" (cf. FIG. 1). This interpretation correctly describes the behavior of the product if $L=\mathbb{B}[S(A)]$, since then by the atomicity assumption on each $A_i$ it follows that for $v=(v_1, \ldots, v_k)$ and $w=(w_1, \ldots w_k)$, $$x^*A_i(v_i,w_i)\neq 0 \text{ for } 1\leq i \leq k \longleftrightarrow x^*A(v,w)\neq 0. \quad (4.10)$$

The assumption that $L=\mathbb{B}[S(A)]$ provides that $S(A)$ includes all the selections of the "system" which determine the transitions of the component processes. If this is the case, then each $A_i$ is a $\mathbb{B}[S(A)]$-process, so one may as well assume that $L=\mathbb{B}[S(A)]$.

Modelling a hardware or software system by a family of coordinating L-processes $A_1, \ldots, A_k$ may be viewed in terms of writing a computer program to implement the functionality of the system, in a programming language in which "process" is a programming primitive. Such a language is intrinsically an automaton data-flow language, in the sense of [WA85], with processes as data nodes, and data-flow determined by the dependency of a process upon the selections of another process. The S/R language [JK86], developed explicitly to implement the s/r model consistently with (4.10), is an example of such a language.

The modelling discipline imposed by the syntax of the S/R language is intrinsically hierarchical in nature, skewed in favor of modelling a system as many small coordinating processes. The simplest processes are ones which play the role of a variable in a conventional program (but rather than being updated through assignment statements, here a "variable" process updates itself as a function of input values). Buffers and other "passive" data structures may be formed as an "array" of such variable processes, i.e., if $A_i$ is a process which models an array element (as a function of the parameter. i) then $A=\otimes A_i$ is a process which models the array. The "active" (and typically non-deterministic) portions of an S/R program consist of "controller" processes which coordinate the flow of data among the passive data structures. (These controllers correspond to the so-called "state machines" one sometimes finds in conventional programs.) The S/R language lends itself to hierarchical modelling of controller processes as well. Thus, a controller A may be decomposed into several component controllers $A_1, \ldots, A_k$ (with $A=A_1\otimes \ldots \otimes A_k$), each component controlling some aspect of the data flow, in coordination with the other controllers.

Such a data-flow language directly models hardware architecture, and thus is directly suited to modelling and implementing hardware. Nonetheless, it has been found to be no less suitable for control-intensive software programs such as communication protocols. In fact, on account of the intrinsic parallelism built into programs with distributed control, the fact that the s/r model imposes a "hardware architecture" on S/R programs seems to offer an advantage of modularity and hence clarity over equivalent non-data-flow programs, providing a potential for a dramatic increase in productivity and efficiency [HK90].

The dynamic interpretation of the s/r model may be used to model systems of processes coordinating asynchronously in continuous time by interpreting "at each time" for selecting and resolving consistent with (4.10), as meaning "at each real value of time", this provided state transitions are instantaneous and occurring at discrete points of time. (A necessary requirement for this interpretation is that there by no two adjacent states without self-loops.) This approach is expanded in section 5 below.

An L-process A is said to be deterministic if it has deterministic resolutions and for each $v \in V(A)$, $|S_A(v)|=1$; A is said to be strongly deterministic if A is deterministic and $|I(A)|=1$. Note that a strongly deterministic L-process A is a Moore machine with input alphabet S(L) and output alphabet S(A), and every Moore machine has this form.

(4.11) Theorem: Every full L-process is equivalent to a full L-process with deterministic resolutions and unique initial state.

Proof: Use the Rabin-Scott determinization algorithm [RS59].

5. Modelling Asynchrony

Delay may be modelled by a specific "pause" selection with the property that it does not disable the self-loop of any process in the "system". Upon entering a state, a process first selects "pause", causing the process to "self-loop", and conveying "no information" to any other process. By that, it is meant that no process is forced to change state on account of this "pause". At some future point in time, the process selecting "pause" non-deterministically may change its selection to some other value, enabling certain state changes. In this way, if state changes are interpreted as instantaneous events, then they are separated by a non-zero duration defined by such "pause" selections in one or more components; with this interpretation, the system of processes model discrete events occurring asynchronously in continuous time.

In a data-flow model of asynchronous processes, inter-node delays appear as such "pause" delays within particular "channel" processes (whose function may be simply to model such delay). Thus, the delayed asynchronous coordination of two controllers A and B may be modelled through the introduction of a third "channel" process C with the property that all coordination between A and B is via C. This may be realized as follows. At some point in time A changes its selection from a pause selection to a non-pause selection, say x. The (instantaneous) resolution of x in C is a change of state to a new state of C, let us say state "x". From its (new) state x, C may first select a pause selection, (conceptually) for an amount of time equal to the interprocess delay between A and B; the selection of C then changes (non-deterministically) from "pause" to the selection (say) x'. The resolution in B of x' reflects the passage of the "datum x" from A to B. In this case the process C is not part of the "implemented" program, but only a model of (part of) the environment in which the implemented program resides. (For software, C is "implemented" by the operating system interfaces, while for hardware, C may be implemented by wires or other component interface devices.)

When an S/R program is intended to model asynchrony and other continuous-time evolution, the "realizability" of such a program becomes an issue: there may in fact be no continuous-time implementation of a given program. For example, since state transitions are taken to be instantaneous, there can be no continuous-time implementation of a process having two consecutive states without self-loops. It is important, therefore, to identify a broadly applicable condition which guarantees that an S/R program is realizable.

Given an L-process A with a chain $(v,x) \in \mathscr{C}(A)$, a realization of (v,x) is a map $$\gamma_{v,x}: [0,\infty[ \rightarrow V(A) \times S(A)$$

with the property that $\gamma_{v,x}$ is a step-function (piecewise-constant), with i-th step value $(v_i,x_i)$, such that the i-th step has positive measure only if $x_i^*A(v_i,v_i)\neq 0$. Say that an L-process A is realizable if every chain of A admits of a realization.

(5.1) Lemma: The following are equivalent for an L-process A:
1. A is realizable;
2. for each chain (v,x) of A and each $i \geq 0$, $x_i^*A(v_i,v_i)=0 \Rightarrow x_{i+1},v_{i+1})\neq 0$;
3. for each v, $w \in V(A^*)$, if $x \in S_A(v)$, $x^*A(v,v)=0$ and $x^*A(v,w)\neq 0$ then $y^*A(w,w)\neq 0$ for all $y \in S_A(w)$.

Let A be an L-process. Define $E^1(A)=\{e \in E(A) | e^- \neq e^+\}$, the set of non-self-loop edges of A. A set of states $W \subset V(A)$ is said to be stabilizing if each selection from each state $w \in W$ enables the self-loop at w, i.e., $x^*A(w,\omega)\neq 0$ for each $x \in S_A(w)$, and for each $e \in E^1(A)$, either $e^- \in W$ or $e^+ \notin W$ or $e^+ \in W$. If A admits of a stabilizing set of states, say A is stable.

(5.2) Theorem: An L-process is realizable if and only if it is stable.

For $W \subset V(A)$ define $$S_A(W) = \bigcup_{w \in W} S_A(w).$$

A family of L-processes $A_1, \ldots, A_k$ is said to be a stable family if there are stabilizing sets of states $W_1, \ldots, W_k$ for $A_1, \ldots, A_k$ respectively such that for each $i \neq j$, $1 \leq i, j \leq k$, $$p \in S_A(W_i), w \in W_j \Rightarrow p^*A_j(w,w)\neq 0; \quad (5.3)$$

$$e \in E^1(A_i), f \in E^1(A_j), e^- \notin W_i, f^+ \notin W_j \Rightarrow A_i(e)^*A_j(f)=0. \quad (5.4)$$

(5.5) Theorem: If $A_1, \ldots, A_k$ is a stable family of independent L-processes then $\otimes A_i$ is stable.

The previous two results give a general means for constructing realizable "systems" (processes whose product is realizable). Indeed, say an L-process A is a "memory" process if A is deterministic, and V(A) is stabilizing (then A in essence "selects its state" and holds the last value "assigned" to it). Say A is an "asynchonous controller" if some set of "pause" states $V@ \subset V(A)$ is stabilizing, if for some designated "pause" selection p, $S_A(v)=\{p\}$ for all $v \in V@$ and if the L-matrix derived from $M_A$ by setting $M_A(v@,v@)=0$ for each $v@ \in V@$ is deterministic (so A "pauses" for an indeterminant amount of time in state v@, selecting the "pause" selection p, thereafter non-deterministically moving to a uniquely designated non-pause state, say v, from which it may make an arbitrary selection and then either move to another "pause" state or self-loop). It is natural and convenient to build asynchronous systems from building blocks comprised of such "memory" processes and "asynchronous controllers". The latter can model delays across asynchronous interfaces, processing-time delays and indeterminacy of actions at higher levels of abstraction. It is likewise natural to model systems consistent with condition )5.3), as no process is expected to branch upon the "pause" ($\equiv$"no information") selection of another process. Condition (5.4) is more problematic, in that it does not arise naturally. However, it does have a natural interpretation: among processes which stop "pausing" at the same time t, each of their respective subsequent "non-pause" selections must be in effect at time t (not one at t and the other in the open interval to the right of t). One way to enforce (5.4) is to choose some $u \in L$ independent of the selections of all the processes in the system, and for each "asynchronous controller" process A, redefine $M_A(v@, v)$ to be $u*M_A(v@,v)$ for each $v@ \in V@, v \notin V@$ and redefine $M_A(v,w@)$ to be $\sim u*M_A(v,w@)$ for $w@ \in V@$. This violates (4.10); however, the effect of this violation can be overlooked, since it does not alter the behavior of the component processes. It enforces the requirement that each process which changes its selection "at" time t has the new selection in effect at time t.

6. Verification

As stated in the introduction, "verification" is defined in terms of language properties. Specifically, let A be an L-process. A task for A is defined to be a set $\mathcal{T} \subset 2^{S(L)\omega}$ of $\omega$-languages over S(L). Say A performs the task $\mathcal{T}$ provided $\mathcal{L}(A) \in \mathcal{T}$. This definition captures all possible notions of model-checking. For example, if represents the branching-time property that a certain state is reachable ("there exists a path from an initial state to the given state"), then $\mathcal{T}$ consists of the set of all subsets of $S(L)^\omega$ which contain at least one sequence admitting a run starting at an initial state and running through the given state. An important class of tasks is the class of $\omega$-regular tasks: a task $\mathcal{T}$ is $\omega$-regular provided $\mathcal{T} = 2^{\mathcal{L}}$ for some $\omega$-regular language $\mathcal{L}$. Let $\mathcal{T} = 2^{\mathcal{L}}$ be an $\omega$-regular task for an L-process A. Then A performs $\mathcal{T}$ iff $\mathcal{L}(A) \subset \mathcal{L}$. Since $\mathcal{L}$ is $\omega$-regular, there is an L-automaton T such that $\mathcal{L} = \mathcal{L}(T)$. In such a case we say "T is a task for A" and "A performs T" if $\mathcal{L}(A) \subset \mathcal{L}(T)$. For the remainder of the paper, all tasks are assumed to be $\omega$-regular.

Let A be an L-automaton and let T be a deterministic L-automaton defining a task for A. Then task-performance $\mathcal{L}(A) \subset \mathcal{L}(T)$ may be decided in time linear in $|M_A \otimes M_T| \cdot |S(L)|$ [Ku87]. As an arbitrary $\omega$-regular language $\mathcal{L}$ may be represented as $$\mathcal{L} = \bigcap_{i=1}^{n} \mathcal{L}(T_i)$$

for deterministic L-automata $T_1, \ldots, T_n$, $\mathcal{L}(A) \subset \mathcal{L}$ can be decided by deciding $\mathcal{L}(A) \subset \mathcal{L}(T_i)$ for $i = 1, \ldots, n$. This is often appropriate in practice, as one often thinks in terms of separate deterministic tasks $T_1, \ldots$ rather than $\mathcal{L}$.

Verification can sometimes be posed as a "controller synthesis" problem [AKS83, RW87]: if $\mathcal{L}(A) \subset \mathcal{L}$ fails, it may nonetheless be the case that for some "controller" L-process C, $\mathcal{L}(A) \otimes (C) \subset \mathcal{L}$, as $\mathcal{L}(A) \otimes (C) = \mathcal{L}(A) \cap \mathcal{L}(C)$. A necessary and sufficient condition for the existence of such a controller is that $\mathcal{L}(C) \subset \mathcal{L}(A) \cap \mathcal{L} \cup \mathcal{L}A)'$.

In the course of defining and analyzing a system, one frequently places constraints or "commitments" on the "environment": the source of inputs to the system. Sometimes this has led to confusion due to the potential for circularity concerning "commitments" of the environment to the system and of the system to the environment: for example, "S works if E works; E works if S works" is satisfied if neither work. This potential for confusion can be avoided altogether by providing together with a model of the system, a model of the environment. Then, properties are proved about the closed system comprising the system-environment pair.

An important reduction method may be called "task decomposition". Suppose T is a task for $A = \otimes A_i$ which is "global" in the sense that each component $A_i$ "plays a part" in the performance of T. IN this case it may be conceptually difficult to see how to reduce the test $\mathcal{L}(A) \subset \mathcal{L}(T)$. For example, suppose A defines a communication protocol in its environment, as follows. $A = S \otimes SP \otimes CH\ 1 \otimes CH\ 2 \otimes RP \otimes R$ where S and R model respectively the "sending" and "receiving" interfaces of the environment, CH 1 and CH 2 model respectively the outgoing and incoming channels between the sender and the receiver, and SP and RP model respectively the "sender protocol" and "receiver protocol" under development, to be verified. Suppose that the channels could lose messages, but the protocols SP and RP work on the basis of sending acknowledgements and retransmissions in case of failures. Let us say the task T is that every message sent by S in eventually received by R, unless there are continual channel failures. The validity of T must depend upon the entire global behavior of the "systems" modelled by A, as messages must flow from S to SP to CH 1 to RP to R, and in order to handle the case of a failure in CH 1, acknowledgements must flow from RP to CH 2 to SP. Therefore, it is unlikely that any significant abstraction of A relative to T could be forthcoming. Nonetheless, in general the task T may be "decomposed" into "subtasks" $T_1, \ldots, T_n$ such that $$\bigcap_{i=1}^{n} \mathcal{L}(T_i) \subset \mathcal{L}(T)$$

and $\mathcal{L}(A) \subset \mathcal{L}(T_i)$ for each $i = 1, \ldots, n$, allowing for a reduction of each such test to a test $\mathcal{L}(B_i') \subset \mathcal{L}(T_i')$. In the example, $T_1$ may be that the sent message arrives from S to SP; to prove this, we may take $B_1' = S \otimes SP \otimes X$ where X is a significant abstraction of CH $1 \otimes$ CH $2 \otimes RP \otimes R$. Likewise, $T_2, \ldots$ may follow the flow of events related to the proper functioning of the protocol.

7. Homomorphism

Homomorphism, the basis of both reduction and refinement, is the means for dealing with large systems. Let L, L' be Boolean algebras, let $\sigma: S(L) \rightarrow S(L')$ be an arbitrary map and define the map $$\Phi: 2^{S(L)\omega} \rightarrow 2^{S(L')\omega} \tag{7.0.1}$$

of the languages over L to the languages over L' by $\Phi(\mathcal{L}) = \{(\sigma(x_i))_i | x \in \mathcal{L}\}$. Then $\Phi$ is said to be a (language) homomorphism with support $\sigma$. If $x \in S(L)^\omega$, define $\Phi(x) = (\sigma(x_i))_i$. It is shown in section 7.1 that the language homomorphism $\Phi$ gives rise to a Boolean algebra homomorphism $F(\Phi):L' \rightarrow L$, and conversely, for any Boolean algebra homomorphism $\phi:L' \rightarrow L$ there is a unique language homomorphism (7.0.1) satisfying $F(\Phi) = \phi$. This relationship between a language homomorphism and a Boolean algebra homomorphism is used to generate a language homomorphism which guarantees (1.1) from conditions on the processes and automata. This duality relationship further provides the mechanism for the decomposition (1.2).

First, observe how a language homomorphism can be used to generate a reduction or refinement (1.1). Suppose A is an L-process, T is an L-automaton, A' is an L'-process and T' is an L'-automaton. We seek conditions on their respective languages which will guarantee that $$\mathcal{L}(A') \subset \mathcal{L}(T') \Rightarrow \mathcal{L}(A) \subset \mathcal{L}(T). \quad (7.0.2)$$

Indeed, suppose a language homomorphism (7.0.1) satisfies $$\Phi \mathcal{L}(A) \subset \mathcal{L}(A'), \quad (7.0.3)$$

$$\Phi^{-1}\mathcal{L}(T') \subset \mathcal{L}(T). \quad (7.0.4)$$

If $\mathcal{L}(A') \subset \mathcal{L}(T')$ then for any $x \in \mathcal{L}(A)$, $\Phi(x) \in \mathcal{L}(A')$ so $x \in \Phi^{-1}\Phi(x) \subset \Phi^{-1}\mathcal{L}(A') \subset \Phi^{-1}\mathcal{L}(T') \subset \mathcal{L}(T)$ and (7.0.2) follows.

7.1 Support

For the remainder of this paper it is assumed that all given Boolean algebras are complete (i.e., infinite products and sums exist [Ha74]). Suppose $$\phi : L' \to L$$

is a homomorphism of Boolean algebras. For each $x \in L$ define $$x_\phi = \pi\{y \in L' | x \leq \phi(y)\};$$

since $L'$ is complete, $x_\phi \in L'$. The map $$\hat{\phi} : L \to L'$$

defined by $\hat{\phi}(x) = x_\phi$ is said to be the support of $\phi$.

(7.1.1) Proposition: For all $x \in L$, $y \in L'$, $x \leq \phi(x_\phi)$, $\phi(y)_\phi \leq y$.

Proof: It follows from the Stone representation theorem [Ha74] that for $x \in L$, $\phi(x_\phi) = \pi\{\phi(y) | y \in L', x \leq \phi(y)\} \geq x$. For $y \in L'$, $\phi(y)_{100} = \pi\{y' \in L' | \phi(y) \leq \phi(y')\} \leq y$.

(7.1.2) Lemma: $x_\phi = 0$ iff $x = 0$.

Proof: since $0 \leq \phi(0) (= 0)$, $0_\phi = \pi\{y \in L' | 0 \leq \phi(y)\} \leq 0$. Conversely, if $x_\phi = 0$ then by (7.1.1) $x \leq \phi(x_\phi) = \phi(0) = 0$.

(7.1.3) Proposition: $x \in S(L) \Rightarrow x_\phi \in S(L')$.

Proof: Say $x_\phi = y + z$. Then by (7.1.1), $x \leq \phi(x_\phi) = y + z$. since $x \in S(L)$, we may suppose $x \leq \phi(y)$; but then $y + z = x_{100} \leq y$ from the definition of $x_{100}$, so $z \leq y$. By (7.1.2), $x_\phi \neq 0$, so it follows that $x_\phi \in S(L')$.

(7.1.4) Proposition: $\hat{\phi}(x + x') = \hat{\phi}(x) + \hat{\phi}(x')$ for all $x, x' \in L$.

Proof: since $x \leq \phi(x_\phi)$ and $x' \leq \phi(x_\phi')$, $x + x' \leq \phi(x_\phi) + \phi(x_\phi') = \phi(x_\phi + x_\phi')$ so by the definition of $\hat{\phi}$, $(x + x')_\phi \leq x_\phi + x_\phi'$. Conversely, by (7.1.1), $x \leq x + x' \leq \phi((x + x')_\phi)$ so again by the definition of $\hat{\phi}$, $x_\phi \leq (x + x')_\phi$; similarly, $x_\phi' \leq (x + x')_\phi$ so $x_\phi + x_\phi' \leq (x + x')_\phi$.

(7.1.5) Corollary: $x \leq x' \Rightarrow x_\phi \leq x_\phi'$.

Proof: Set $z = x'^* \sim x$. Then, by (7.1.4), $x_\phi \leq x_\phi + z_\phi = (x + z)_\phi = x_\phi'$.

(7.1.6) Theorem: The following are equivalent:

1. $\phi$ is $1-1$ (i.e., ker $\phi = 0$);
2. $\hat{\phi}$ is onto;
2a. $\hat{\phi} : S(L) \to S(L')$ is onto;
3. $\hat{\phi} \circ \phi = \text{id}$ (i.e., $\phi(y)_\phi = y$ for all $y \in L'$);
4. $1_\phi = 1$.

Proof:

$1 \Rightarrow 3$: Let $z = \phi(y)_\phi, z' = y^* \sim z$. Then $z^* z' = 0$ so since ker $\phi = 0$, $\phi(z)^* \phi(z') = 0$. By (7.1.1), $\phi(y) \leq \phi(\phi(y)_\phi) = \phi(z)$ so $\phi(z) + \phi(z') = \phi(z + z') = \phi(y + z) = \phi(y) + \phi(z) = \phi(z)$ and thus $\phi(z') = 0$. Since ker $\phi = 0$ so $y \leq z = \phi(y)_\phi$. But $\phi(y)_\phi \leq y$ by (7.1.1) so $\phi(y)_\phi = y$.

$3 \Rightarrow 2a$: $\hat{\phi} S(L) \subset S(L')$ by (7.1.3); $3 \Rightarrow \hat{\phi}$ is onto.

$2a \Rightarrow 2$: $L' = \mathbb{B}[S(L')]$. $2 \Rightarrow 1$: If $\phi(y) = 0$ then $\phi(x_\phi) = 0$ for some $x \in L$ (with $x_\phi = y$) by 2., and $x \leq \phi(x_\phi) = 0$ so $x = b \ 0$. Thus, by (7.1.2) $y = 0$.

$4 \Leftrightarrow 2a$: If $1_\phi = 1$ then by (7.1.3) and (7.1.3), $$\sum_{s' \in S(L')} s' = 1 = 1_\phi = \left( \sum_{s \in S(L)} s \right)_\phi = \sum_{s \in S(L)} s_\phi$$

so $2a$. follows; if $2a$. is true then $1 = \Sigma s' = \Sigma s_\phi = (\Sigma s)_\phi = 1_\phi$.

(7.1.7) Corollary: For all $y \in L'$, $$(*) \quad \phi(y) = \sum_{x_\phi \leq y} x \geq \sum_{x_\phi = y} x;$$

if $\phi$ is $1-1$ then equality holds between the two sums.

Proof: if $x_\phi \leq y$ then $x \leq \phi(x_\phi) \leq \phi(y)$ so $$\sum_{x_\phi \leq y} x \leq \phi(y).$$

On the other hand, $\phi(y)_\phi \leq y$ by (7.1.1) so substituting $\phi(y)$ for one of the summands $x$ gives $$\sum_{x_\phi \leq y} x \geq \phi(y)$$

and thus (8) holds. If $\phi$ is $1-1$ then by (7.1.6) $\hat{\phi}$ is onto; for each $x \in L$ such that $x_\phi < y$, let $z = y^* \sim x_\phi$. Since $\hat{\phi}$ is onto there is some $x' \in L$ such that $x_\phi' = z$. Then, by (7.1.4), $(x + x')_\phi = x_\phi + x_\phi' = y$. It follows that (8) is an equality.

In the main result of this section, it is shown that the conditions of (7.1.3), (7.1.4) and (7.1.7) characterize the homomorphism $\phi$. This will enable us to define $\phi$ form $\hat{\phi}$.

Say that an arbitrary function $f : L \to L'$ is additively linear (respectively, monotone) if $f(x + y) = f(x) + f(y)$ (respectively, $x \leq y \Rightarrow f(x) \leq f(y)$) for all $x, y \in L$. If $f$ is additively linear, then, as in the proof of (7.1.5), $f$ is monotone.

(7.1.8) Theorem: If $f : L \to L'$ is additively linear and $f : S(L) \to S(L')$ then the map $\phi : L' \to L$ defined by $$\phi(y) = \sum_{f(x) \leq y} x$$

is a homomorphism and for all $0 \neq x \in L'$, $x_\phi = f(x)$.

This theorem gives the functor F described at the beginning of section 7. Its importance lies in the fact that it shows that in order to generate the Boolean algebra homomorphism needed to define a language homomorphism satisfying (7.0.3) and (7.0.4), it is enough to define its support on the set of atoms $S(L)$.

(7.1.9) Notes 1. Without the requirement that $f : S(L) \to S(L')$, it may happen that $f$ is additively linear and yet the map $$\phi(y) = \sum_{f(x) \leq y}$$

(x is not even additively linear (and thus not a homomorphism). Indeed, let $L = \mathbb{B}[x, y]$, $L' = \mathbb{B}[z]$ and define $f : L \to L'$ by $f(x^* y) = z$, $f(x^* \sim y) = \sim z$, $f(\sim x^* y) = f(\sim x^* \sim y) = 1$ and extend this to L by linearity, with $f(0) = 0$. then $f$ is additively linear by construction, but $\phi(1) = 1$ whereas $\phi(z) + \phi(\sim z) = x^* y + x^* \sim y = x < 1$.

2. In (7.1.8), if $|fS(L)|=1$ (i.e., if f maps S(L) to a single atom of L') then the hom $\phi$ satisfies $$\phi(y) = \begin{cases} 1 & \text{if } f(1) \leq y \\ 0 & \text{otherwise.} \end{cases}$$

However, it could happen that $f(0)=f(1)>0$. On the other hand, if $|fS(L)|>1$, say $s,t \in S(L)$ and $f(s)\neq f(t)$, then $f(0)+f(s)=f(0+s)=f(s)$ so $f(0) \leq f(s)$ and likewise $f(0) \leq f(t)$, so (since $f(s)*f(t)=0$) $f(0)=0$.

(7.1.10) Lemma: $f(x*x') \leq f(x)*f(x')$.

Proof: since $x*x' \leq x$ and $x*x' \leq x'$, by the additivity of f, f is monotone and hence $f(x*x') \leq f(x)$, $f(x*x') \leq f(x')$ so $f(x*x') \leq f(x)*f(x')$.

(7.1.11) Note:

$$x \leq \sum_{f(z) \leq f(x)} z.$$

(7.1.12) Lemma: $f\phi(y) \leq y, \phi f(x) \geq x$.
Proof:

$$f\phi(y) = f \sum_{f(x) \leq y} = \sum_{f(x) \leq y} f(x) \leq y.$$

$$\phi f(x) = \sum_{f(z) \leq f(x)} z \geq x.$$

Proof of (7.1.8): Let $y_1, y_2 \in L'$. Then $f(\phi(y_1)+\phi(y_2))=f\phi(y_1)+f\phi(y_2) \leq y_1+y_2$ by (7.1.12), so by (7.1.11)

$$\phi(y_1) + \phi(y_2) \leq \sum_{f(x) \leq f(\phi_1(y_1)+\phi_2(y_2))} x \leq \sum_{f(x) \leq y_1+y_2} = \phi(y_1 + y_2).$$

If $\phi(y_1)+\phi(y_2)<\phi(y_1+y_2)$ then there exists an atom $t \in S(L)$ with $t<\phi(y_1+y_2)*\sim(\phi(y_1)+\phi(y_2))$, and $f(t) \in S(L')$. But $f\phi(y_1+y_2) \leq y_1+y_2$ by (7.1.12) so by monotonicity $f(t) \leq f\phi(y_1+y_2) \leq y_1+y_2$; since $f(t)$ is an atom, we may as well assume $f(t) \leq y_1$. But then, by the definition of $\phi(y_1)$, $t \leq \phi(y_1)$, a contradiction. Hence $\phi$ is additively linear. To show that $\phi$ is multiplicatively linear, observe that by (7.1.10) if $f(x) \leq y_1$ and $f(x') \leq y_2$ then $f(x*x') \leq f(x)*f(x') \leq y_1*y_2$ while if $f(x) \leq y_1*y_2$ then $x=x$ and $f(x) \leq y_1$, $f(x) \leq y_2$. Hence $$\phi(y_1*y_2) = \sum_{f(x) \leq y_1*y_2} x$$

$$= \sum_{\substack{f(x) \leq y_1 \\ f(x') \leq y_2}} x*x'$$

$$= \left(\sum_{f(x) \leq y_1} x\right) * \left(\sum_{f(x') \leq y_2} x'\right)$$

$$= \phi(y_1)*\phi(y_2).$$

Next, $1 = f(1) + \sim f(1)$ so by (7.1.12) $\phi(1) = \phi f(1) + \phi(\sim f(1)) \geq 1 + \phi(\sim f(1)) = 1$. Now, $f:S(L) \to S(L')$ so by linear additivity of f, $f(x)=0 \Rightarrow x=0$, so $$\phi(\sim y)*\phi(y) = \phi(\sim y*y) = \phi(0) = \sum_{f(x) \leq 0} x = 0,$$

and thus $\phi(\sim y) \leq \sim \phi(y)$. Also, $1=\phi(1)=\phi(\sim x+x)=\phi(\sim y)+\phi(y)$. Hence $\sim\phi(y)=\sim\phi(y)*\phi(\sim y)=\phi(\sim y)$. It follows that $\phi$ is a homomorphism. Finally, for all $x \in L$, $$x_\phi = \pi\{y \in L' | x \leq \phi(y)\} =$$

$$\pi\left\{y \in L' \middle| x \leq \sum_{f(z) \leq y} z\right\} \leq f(x) \text{ by (7.1.11)}.$$

On the other hand, if $f(x)=0$ then by (7.1.12) $0=\phi f(x) \geq x$ so $x=0$ and $0_\phi = 0 = f(0)$. If $f(x) \neq 0$, write $x=\Sigma s_i$ where $s_i \in S(L)$. then $f(x)=\Sigma f(s_i)$ and $f(s_i) \in S(L')$ for all i. For any atom $t \leq f(x)$ there exists an atom s each that $s \leq x$ and $f(s)=t$. To show that $f(x)=x_\phi$ it suffices to show that $t \leq x_\phi$. Indeed, if $$x \leq \sum_{f(z) \leq y} y$$

then $$t = f(s) \leq f(x) \leq \sum_{f(z) \leq y} f(z)$$

so for some z, $t \leq f(z) \leq y$. Thus, $t \leq x_\phi$ and it follows that $f(x) \leq x_\phi$ so $f(x)=x_\phi$.

(7.1.13) Lemma: $\hat{\phi}O\phi = \text{id}$ on $\hat{\phi} L$ and $\ker \phi = (L' \setminus \hat{\phi}L) \cup \{0\}$.

Proof: let $x \in L$. Then $$\phi(x_\phi) \geq \sum_{z_\phi = x_\phi} z$$

by (7.1.7). Thus $\hat{\phi}O\phi(x_\phi) \geq \hat{\phi}(\Sigma z)=\Sigma z_\phi=x_\phi$. But $\hat{\phi}O\phi(x_\phi) \leq x_\phi$ by (7.1.1). Therefore, $\hat{\phi}O\phi = \text{id}$ on $\hat{\phi}L$, and thus by (7.1.6) $\ker \phi \cap \hat{\phi}L = \{0\}$. If $y \in L'$ and $\phi(y) \neq 0$ then $s \leq \phi(y)$ for some atom $s \in S(L)$, in which case $s_\phi \leq \phi(y)_\phi \leq y$ by (7.1.1), and so $y \notin L' \setminus \hat{\phi}L$ by (7.1.3).

(7.1.14) Lemma: Suppose $\phi, \psi: L' \to L$ are homomorphisms and $\hat{\phi}=\hat{\psi}$ on S(L). Then $\phi=\psi$.

Proof: if $\hat{\phi}=\hat{\psi}$ on S(L) then by (7.1.4) and (7.1.2), $\hat{\phi}=\hat{\psi}$ and $\ker \phi \psi$ by (7.1.13). Therefore $\phi,\psi: \hat{\phi}L \to L$ have 0 kernel so by (7.1.6) for any $y \in \hat{\phi}L$, $\hat{\psi}O\psi(y)=y=\hat{\phi}O\phi(y)=\hat{\psi}O\psi(y)$, and $\hat{\psi}$ is 1-1 on $\hat{\phi}L$. Therefore, $\psi(y)=\phi(y)$ on $\hat{\phi}L=\hat{\psi}L$. Since by (7.1.13) $\ker \phi = \ker \psi = (L' \setminus \hat{\psi}L) \cup \{0\}$, it follows that $\phi=\psi$.

(7.1.15) Corollary: let $\sigma: S(L) \to S(L')$ be an arbitrary map. Then there exists a unique homomorphism $\phi: L' \to L$ such that for all $s \in S(L)$, $s_\phi = \sigma(s)$.

Proof: Define $f: L \to L'$ by extending $\sigma$ linearly to L: set $f(0)=0$ and for $0 \neq x$ L, write $x=\Sigma s_i$ for $s_i \in S(L)$, and set $f(x)=\Sigma f(s_i)$. The result follows from (7.1.8) and (7.1.14).

(7.1.16) Corollary: let $\phi: L' \to L$ be a Boolean algebra homomorphism. Then there is a unique language homomorphism $\Phi: 2^{S(L)\omega} \to 2^{S(L')\omega}$ with support $\hat{\phi}$.

Suppose $L_1, \ldots, L_k$ are independent subalgebras of L with $L=\pi L_i$ and $L_1', \ldots, L_k'$ are independent subalgebras of $L'$ with $L' = \pi L_i'$. If $\sigma_i: S(L_i) \to S(L_i')$ are arbitrary maps for $1 \leq i \leq k$, we may define $\sigma: S(L) \to S(L')$ by $\sigma(s_1^* \ldots *s_k) = \sigma_1(s_1)^* \ldots *\sigma_k)$, in which case by (7.1.15) there exists a unique homomorphism $\phi: L' \to L$ with $\hat{\phi} = \sigma$ on $S(L)$. Conversely, if $\phi_i: L_i' \to L_i$ are arbitrary homomorphisms then $\hat{\phi}_i: S(L_i) \to S(L_i')$ and by (7.1.15) there is a unique homomorphism $\phi: L' \to L$ with $\hat{\phi}(s_1^* \ldots *s_k) = \hat{\phi}_1(s_1)^* \ldots *\hat{\phi}_k(s_k)$. Thus, we define the product homomorphism $$\pi_{i=1}^{k} \phi_i \equiv \phi: L' \to L.$$

It is this product which will allow us in the next sections to define a homomorphism of a product of L-automata or L-processes in terms of homomorphisms on the components.

7.2 L-Automaton Homomorphism

Let $\Gamma$ be an L-automaton and let $\Gamma'$ be an $L'$-automaton. A homomorphism $$\Phi: \Gamma \to \Gamma'$$

is a pair of maps $\phi = (\phi, \phi')$ where $$\phi: \bar{\Gamma} \to \bar{\Gamma}'$$

is a graph homomorphism satisfying $\phi^{-1} I(\Gamma') \subset I(\Gamma)$ \hfill (7.2.1)

$\phi^{-1} R(\Gamma') \subset R(\Gamma)$ \hfill (7.2.2)

$C' \in Z(\Gamma') \Rightarrow \phi^{-1}(C') \subset C$ for some $C \in Z(\Gamma)$ \hfill (7.2.3)

and $$\phi': L' \to L$$

is a Boolean algebra homomorphism such that for each $(v,w) \in V(\Gamma)^2$, $\phi$ and $\phi'$ jointly satisfy $\Gamma(v,w) \leq \phi' \Gamma'(\phi(v), \phi(w))$. \hfill (7.2.4)

If the containments in (7.2.1-3) are equalities and $Z(\Gamma') = \{\Phi(C) | C \in Z(\Gamma)\}$, then $\Phi$ is said to be exact. We may denote $\phi$ and $\phi'$ by $\Phi$.

(7.1.5) Theorem: If $\Phi: \Gamma \to \Gamma'$ is a homomorphism then $$\cdot \sum_{\substack{\Phi(r) = \Phi(v) \\ \Phi(s) = \Phi(w)}} \Gamma(r,s) \leq \Phi \Gamma'(\Phi(v), \Phi(w)),$$

with equality holding when $\Gamma'$ is deterministic.

Proof: Inequality is clear. Suppose $\Sigma \Gamma(r,s) < \Phi \Gamma'(\Phi(v), \Phi(w))$. then some atom $t < \Phi \Gamma'(\Phi(v), \Phi(w))$ satisfies $t^* \Sigma \Gamma(r,s) = 0$. Let $\Phi(r_0) = \phi(v), \phi(s_0) = \phi(w)$. Then $t^* \Gamma(r_0, s_0) = 0$, so for some $\hat{s}_0 \neq s_0$, $r^* \Gamma(r_0, \hat{s}_0) \neq 0$, and $\phi(\hat{s}_0) \neq \phi(w)$. Thus $t^* \phi \Gamma'(\Phi(v), \Phi(s_0)) \neq 0$ and hence 016 $(\Phi \Gamma'(\Phi(v), \Phi(w)))^*(\Phi' \Gamma'(\Phi(v), \phi(\hat{s}_0)))) = \Phi(\Gamma'(\Phi(v), \Phi(w))^* \Gamma'(\Phi(v), \Phi(\hat{s}_0))),$ contrary to the assumption that $\Gamma'$ is deterministic.

(7.2.6) Proposition: If $\Phi = (\phi, \phi')$ and $\Psi = (\psi, \psi')$ are homomorphisms, $\Phi: \Gamma \to \Gamma'$ and $\Psi: \Gamma' \to \Gamma''$, then $\Psi O \Phi =$ $(\psi O \phi, \phi' O \psi')$ is a homomorphism $\Gamma \to \Gamma''$; if $\Phi$ and $\Psi$ are exact then so is $\Psi O \Phi$.

(7.2.7) Lemma: let $\Phi: \Gamma \to \Gamma'$ be a homomorphism. If $\Gamma'$ is deterministic then $\Phi: E(\Gamma) \to E(\Gamma')$ is onto.

Proof: Let $v \in V(\Gamma')$. Then there is a path $(v_0, \ldots, v_n)$ in $\Gamma'$ with $v_0 \in I(\Gamma')$ and $v_n = v$. The proof that $\Phi$ is onto follows by induction on n. If $n = 0$, then $v_0 \in \Phi V(\Gamma)$ by the definition of $\Phi$. If $v_0, \ldots, v_{n=1} \in \Phi V(\Gamma)$, let $\hat{v}_{n-1} \in \Phi^{-1}(v_{n-1})$ and let $w_1, \ldots, w_m$ be exactly those states of $\Gamma$ satisfying $\Gamma(\hat{v}_{n-1}, w_i) \neq 0$. Then $$\sum_{i=1}^{m} \Gamma(\hat{v}_{n-1}, w_i) = 1, \text{ and } \Phi \sum_{i=1}^{m} \Gamma'(v_{n-1}, \Phi(w_i)) =$$

$$\Sigma \Phi \Gamma'(v_{n-1}, \Phi(w_i)) \geq \Sigma \Gamma(\hat{v}_{n-1}, w_i) = 1 \text{ so } \Sigma \Gamma'(v_{n-1}, \Phi(w_i)) = 1.$$

Since $\Gamma'$ is deterministic and $\Gamma'(v_{n-1}, v_n) \neq 0$, $v_n = \Phi(w_i)$ for some i, completing the induction step. The same proof thus shows that $\Phi: E(\Gamma) \to E(\Gamma')$ in onto.

Let $\Gamma$ be an L-automaton, let $\Gamma'$ be an $L'$-automaton and let $\Phi: \Gamma \to \Gamma'$ be an exact homomorphism. An $L'$ automaton $\Phi(\Gamma)$, the image of $\Gamma$ under $\Phi$, is defined in terms of $S(L')$ as follows:

$$V(\Phi(\Gamma)) = \Phi(V(\Gamma)),$$

$$(\Phi(\Gamma))(\Phi v, \Phi w) = \sum_{\substack{\Phi(r) = \Phi(v) \\ \Phi(s) = \Phi(w)}} \hat{\Phi} \Gamma(r,s),$$

(where $\hat{\Phi}$ is the support of the Boolean algebra homomorphism $\Phi: L' \to L$), $I(\Phi(\Gamma)) = \Phi I(\Gamma),$ $R(\Phi(\Gamma)) = \Phi R(\Gamma),$ $Z(\Phi(\Gamma)) = \Phi Z(\Gamma)$ (where $\Phi z(\Gamma) = \{\Phi(C) | C \in Z(\Gamma)\}$.

(7.2.8) Lemma: $\Phi(\Gamma)$ is an $L'$-automaton, and $\Phi: \Gamma \to \Phi(\Gamma)$ maps $E(\Gamma) \to E(\Phi\Gamma)$ onto.

Proof: It must be checked that $\Phi(\Gamma)$ is complete. Suppose for some $v \in V(\Gamma)$, $t \in S(L')$ and $$t^* \sum_{w \in V(\Gamma)} (\Phi \Gamma)(\Phi v, \Phi w) = 0.$$

Then, by (7.2.4)

$$0 = \Phi(t)^* \sum_{w} \Phi(\Phi \Gamma)(\Phi v, \Phi w) \geq \Phi(t)^* \sum_{w} \Gamma(v, w),$$

contradicting the fact that $\Gamma$ is complete. To check that $\Phi: E(\Gamma) \to E(\Phi \Gamma)$ is onto, suppose $e \in E(\Phi \Gamma)$ and let t be an atom of $L'$ such that $t^*(\Phi \Gamma)(e) \neq 0$. Then for some $v, w \in V(\Gamma)$ with $(\Phi v, \Phi w) = e$, $\Gamma(v,w)^* \Phi(t) \neq 0$, proving that $(v,w) \in E(\Gamma)$.

Note: It is possible for $\Gamma$ to be deterministic while $\Phi \Gamma$ is not deterministic, as well as for $\Phi \Gamma$ to be deterministic while $\Gamma$ is not deterministic.

(7.2.9) Corollary: If $\Phi: \Gamma \to \Gamma'$ and $\Gamma'$ is deterministic, then $\Phi(\Gamma) = \Gamma'$.

Proof: Let t be an atom satisfying $t^* \Gamma'(\Phi(v), \Phi(w)) \neq 0$. For some $u \in V(\Gamma)$, $\Gamma(v,u)^* \Phi(t) \neq 0$. Then $0 \neq \Gamma(v,u)*\Phi(t) \leq \Phi(\Phi\Gamma)(\Phi v, \Phi u)*\Phi(t)$, so $0 \neq (\Phi\Gamma)(\Phi v, \Phi u)*t$. By the determinism of $\Gamma'$, $\Phi u = \Phi w$. Thus, $\Phi(\Gamma)(\Phi(v), \Phi(w)) = \Gamma'(\Phi(v), \Phi(w))$. the conclusion follows.

If $\Phi: \Gamma \to \Gamma'$ is a homomorphism of the L-automaton $\Gamma$ to the L'-automaton $\Gamma'$, then the support $\hat{\Phi}$ of the Boolean algebra homomorphism $\Phi: L' \to L$ induces a language homomorphism (7.0.1) which it is natural to call $\Phi$, as well.

(7.2.10) Theorem: If $\Gamma$ is an L-automaton, $\Gamma'$ is an L'-automaton and $\Phi: \Gamma \to \Gamma'$ is a homomorphism, then $\Phi^{-1}\mathscr{L}(\Gamma') \subset \mathscr{L}(\Gamma)$, with equality holding if $\Phi$ is exact.

Proof: Let $c' = (v', x')$ be a chain of $\Gamma'$, and let $\Phi^{-1}(c') = \{c = (v,x) | \Phi(c) = c'\}$ where $\Phi(c) = ((\Phi(v_i))_i, (\hat{\Phi}(x_i))_i)$. By (7.1.3) and (7.2.1-4) it follows that $\Phi^{-1}(c') \subset \mathscr{C}(\Gamma)$. Now, $x \in \mathscr{L}(\Gamma)$ iff $(x,v) \in \mathscr{C}(\Gamma)$ for some $v$, so $\Phi^{-1}\mathscr{L}(\Gamma') \subset \mathscr{L}(\Gamma)$. If $\Phi$ is exact, then $\Phi\mathscr{C}(\Gamma) \subset \mathscr{C}(\Gamma')$ and thus $\Phi\mathscr{C}(\Gamma) = \mathscr{C}(\Gamma')$, so $\mathscr{L}(\Gamma) = \Phi^{-1}\mathscr{L}(\Gamma')$.

(7.2.11) Corollary: If $\Phi: \Gamma \to \Gamma'$ is a homomorphism then $\mathscr{L}(\Gamma') \subset \Phi\mathscr{L}(\Gamma)$; if $\Phi$ is exact, $\mathscr{L}(\Gamma') = \Phi\mathscr{L}(\Gamma)$.

Let $\Lambda, \Gamma$ be L-atuomata and let $\Lambda', \Gamma'$ be L'-automata. Homomorphisms $\Phi: \Lambda \to \Lambda'$ and $\Psi: \Gamma \to \Gamma'$ are said to be co-linear if they agree on L', i.e. $\hat{\Phi} = \hat{\Psi}: L' \to L$.

(7.2.12) Corollary: Let $\Phi: \Lambda \to \Lambda'$ and $\Psi: \Gamma \to \Gamma'$ be co-linear homomorphisms. Then
1. if $\Phi$ is exact then $\mathscr{L}(\Lambda') \subset \mathscr{L}(\Gamma') \Rightarrow \mathscr{L}(\Lambda) \subset \mathscr{L}(\Gamma)$;
2. if $\Psi$ is exact then $\mathscr{L}(\Lambda) \subset \mathscr{L}(\Gamma) \Rightarrow \mathscr{L}(\Lambda') \subset \mathscr{L}(\Gamma')$.

Proof: If $\Phi$ is exact and $\mathscr{L}(\Lambda') \subset \mathscr{L}(\Gamma')$ then $\mathscr{L}(\Lambda) = \Phi^{-1}\mathscr{L}(\Lambda') \subset \Phi^{-1}\mathscr{L}(\Gamma') = \Psi^{-1}\mathscr{L}(\Gamma') \subset \mathscr{L}(\Gamma)$.
If $\Psi$ is exact and $\mathscr{L}(\Lambda) \subset \mathscr{L}(\Gamma)$ then $\Phi^{-1}\mathscr{L}(\Lambda') \subset \mathscr{L}(\Lambda) \subset \mathscr{L}(\Gamma)$ so $\mathscr{L}(\Lambda') \subset \Phi\mathscr{L}(\Gamma) = \Psi\mathscr{L}(\Gamma) = \mathscr{L}(\Gamma')$.

7.3 L-Process Homomorphism

Process homomorphism is defined in a manner strictly analogous to automaton homomorphism, yielding analogous results. However, because of the difference in acceptance (the cyclic and recurring conditions for automata are negations of the respective conditions (4.3-4) for processes), and on account of the selections in processes, it is necessary to clarify the details.

Let $\Gamma$ be an L-process and let $\Gamma'$ be an L'-process. A homomorphism $$\Phi \Gamma \to \Gamma'$$

is a pair of maps $\Phi = (\Phi, \psi')$ as in the definition of automaton homomorphism, satisfying (7.2.1-4). We adopt the same terminology and notational conventions here.

Let A be a lockup-free L-process, A' an L'-process and $\Phi: A \to A'$ a homomorphism. It follows from (4.2), (7.1.13) and the homomorphism condition (7.2.4) that for each $x \in S_A(v)$ there exists an $x' \in S_{A'}(\Phi v)$ such that $\hat{\Phi}(x) \leq x'$. Thus, if $A_1, \ldots, A_k$ are a family of independent, lockup-free L-processes with $L = \mathbb{B}[S(A)]$ for $A = \otimes A_i$, then in view of section (7.1), any homomorphism of A is uniquely defined in terms of maps of the selections of $A_1, \ldots, A_k$. Thus, homomorphisms of A are determined by homomorphisms of $A_1, \ldots, A_k$.

It is easily checked that the corresponding results to (7.2.5-9) hold for L-processes. Analogously, the following hold.

Theorem: If A is an L-process, A' is an L'-process and $\Phi: A \to A'$ is a homomorphism then $\Phi\mathscr{L}(A) \subset \mathscr{L}(A')$, with equality holding if $\Phi$ is exact.

Theorem: Let A be an L-process, T an L-automaton, A' an L'-process, T' an L'-automaton and suppose $$\Phi: A \to A'$$

$$\Psi: T \to T'$$

are co-linear homomorphisms. Then
1. $\mathscr{L}(A') \subset \mathscr{L}(T') \Rightarrow \mathscr{L}(A) \subset \mathscr{L}(T)$;
2. if $\Phi$ and $\Psi$ are exact, $$\mathscr{L}(A) \subset \mathscr{L}(T) \Rightarrow \mathscr{L}(A') \subset \mathscr{L}(T').$$

8. Conclusions

Homomorphism has been shown to be a tool for reduction and refinement. It was shown how a homomorphism can be defined on a large space (implicitly) through homomorphisms on components. In the development of software and hardware systems, one begins with an abstract, high-level design and formally verifies that design for the performance of a variety of tasks, using reductions to cope with the complexity of this verification. Next, one redefines this design, adding more details. It is verified that this more detailed design is a refinement of the original design, and hence that all tasks whose performance were verified for the high-level design are guaranteed to be performed by the more detailed design as well. This is equivalent to proving that the high-level design is a reduction of the more detailed design, relative to all tasks performed by the high-level design (pulled back to the more detailed design). The more detailed design is verified for the performance of tasks not definable at the high level.

This step-wise refinement and verification continues until all details of the final implementation have been added to the model.

A measure of the success of this methodology may be taken from its application to large system development [HK90], where an order of magnitude saving in development time has been demonstrated, together with the production of an implementation which passing system test on the first trial with zero errors (virtually unknown with conventional development).

REFERENCES

[RS59] M. O. Rabin, D. Scott, "Finite Automata and their Decisions Problems", IBM J. Res. and Dev. 3(1959) 114–125. (Reprinted in [Mo64] 63–91.)

[Ts59] M. L. Tsetlin, "Non-primitive Circuits" (in Russian) Problemy Kibernetiki 2 (1959).

[Bu62] J. R. Büchi, "On a Decision Method in Restricted Second-Order Arithmetic", Proc. Internat. Cong. on Logic, Methodol. and Philos. of Sci., 1960, 1–11 (Stanford Univ. Press, 1962).

[Ra69] M. O. Rabin, "Decidability of Second-Order Theories and Automata on Infinite Trees", Trans. Amer. Math. Soc. 141 (1969) 1–35.

[Ra72] M. O. Rabin, *Automata on Infinite Objects and Church's Problem*. Amer. Math. Soc., 1972.

[Ch74] Y. Chouekr, "Theories of Automata on $\omega$-Tapes: A Simplified Approach", J. Comput. Syst. Sci. 8 (1974), 117–141.

Ha74] P. Halmos, *Lectures on Boolean Algebras*, Springer-Verlag, N.Y., 1974.

[GK80] B. Gopinath, R. P. Kurshan, "The Selection/Resolution Model of Coordinating Concurrent Processes", internal AT&T report.

[AKS83] S. Aggarwal, R. P. Kurshan. K. K. Sabnari, "A Calculus for Protocol Specification and Validation" in *Protocol Specification, Testing and Verification, III*, North-Holland, 1983, 19-34.

[DC85] D. L. Dill, E. M. Clarke, "Automatic Verification of Asynchronous Circuits Using Temporal Logic", Proc. Chapel Hill Conf. VLSI, Computer Sci. Press (1985) 127-143.

[Ku85] R. P. Kurshan, "Modelling Concurrent Processes", Proc. Symp. Applied Math, 3 (1985) 45-57.

[SVW85] A. P. Sistla, M. Y. Vardi, P. Wolper, "The Complementation Problem for Büchi Automata, with Applications to Temporal Logic", in Proc. 12th Internat. Coll. on Automata, Languages and Programming, *Lect. Notes Comp. Sci.*, 1985, Springer-Verlag.

[WA85] W. W. Wadge, E. A. Ashcroft, LUCID, *The Dataflow Programming Language*, Academic Press, 1985.

[KK86] J. Katzenelson and R. P. Kurshan, "S/R: A Language For Specifying Protocols and Other Coordinating Processes", Proc. 5th Ann. Int'l Phoenix Conf. Comput. Commun., IEEE, 1986, 286-292.

[BC87] M. C. Brown, E. M. Clarke, "SML—A High Level Language for the Design and Verification of Finite State Machines", in from *HDL Descriptions to Guaranteed Correct Circuit Designs* (D.Borrione, ed.) North-Holland (1987) 269-292.

[GK87] I. Gertner, R. P. Kurshan, "Logical Analysis of Digital Circuits", Proc. 8th Intn'l. Conf. Comput. Hardware Description Languages, 1987, 47-67.

[Ku87] R. P. Kurshan, "Reducibility in Analysis of Coordination", LNCIS 103 (1987) Springer Verlag, 19-39.

[Ku87a] R. P. Kurshan, "Complementing Deterministic Büchi Automata in Polynomial Time", J. Comput. Syst. Sci. 35(1987)59-71.

[RW87] P. J. Ramadge, W. M. Wonham, "Supervisory Control of a Class of Discrete-Event Processes", SIAM J. Contr. Opt. 25(1987) 206-230.

[Sa88] S. Safra, "On the Complexity of $\omega$-Automata", 29$^{th}$ FOCS (1988) 319-327.

[Ba89] J. Barwise, "Mathematical Proofs of Computer System Correctness", Notices AMS 36(1989) 884-851.

[KM89] R. P. Kurshan, K. McMillan, "A Structural Induction Theorem for Processes", Proc. 8th ACM Symp. PODC (1989) 239-247.

[KM90] R. P. Kurshan, K. McMillan, "Analysis of Digital Circuits Through Symbolic Reduction", IEEE Trans. CAD/ICS, to appear.

[HK90] Z. Har'El, R. P. Kurshan, "Software for analytical Development of Communication Protocols", AT&T Tech. J., to appear.

SUMMARY

0. The S/R Model.

1. The Graph Generator: This section explains the method for cranking a next state, including the 'odometers' for selections and resolutions. We must also explain here how pause states are represented, how they are resolved, and how certain resolutions are prevented to ensure proper real time behavior of the system (i.e., "normalization". This is done using the 'crank counters' $c1$ and $c2$).

2. The Search: In this section the reached state boundary stack and the ancestor stacks are explained, as well as their implementation. It illustrates the combination of the inherent BFS nature if the s/r machine with the DES needed for cycle recognition.

3. The Acceptance Test: This section explained how a simple cycle recognition is replaced by the Tarjan's strongly connected component algorithm, which is essentially lowlink computations superimposed on the same backtrack mechanism of the DFS. Cysets may be explained here. The second acceptance device, the recur edges, is explained, and also the mechanism of pushing 'recur vertices' at the bottom of the stack, which makes it practically into a queue. The reasons for implementing it as a circular queue are explained(?).

4. The Transition Checks: This section explains lock-ups, nondeterminism, deadlocks and stability failures. It also explains how semi-determinism may be used to simplify graph generation.

5. Merge and Reduce

6. Simulation: This section explains the usage of simulation for testing: Non robust protocols which work for given hold times only, or protocols which are too large to be handled by exhaustive searches. One does the testing by simulation runs, without any memory or with a fixed queue of last k states for debugging purposes. One may check for star free regular expressions, i.e., avoiding "bad sequences". We also explains how simulation is used to compute means first passage time between a given state to a set of ending states.

2. The Search.

In this section, we describe the search algorithm on the coordination graph. This can be viewed as a subgraph $G^* = (V^*, E^*)$ of a general directed graph $G = (V, E)$ which is reachable from a given subset I of initial vertices. We note that the graph is not known at the beginning of the search. What we are given is rather a graph generator, i.e. a procedure which generates the children of a given parent vertex, thus making a "breadth first search" the natural thing to do on such a graph. However, for various applications such as checking acyclicity, we need a depth-first spanning forest for $(V^*, E^*)$. We wish to describe an algorithm for finding such a forest and for counting the edges of $E^*$ classified by depth first categories: Tree edges, forward edges, self edges, back edges and cross edges. $G^*$ is acyclic if and only if there are no self edges and no back edges. Thus, we introduce a search which starts at an initial vertex, cranks all its children and records them in a Reached State Table. We call such a recorded vertex reached, and a vertex whose all children have been recorded will be called searched. The next vertex to be searched is one of the children of the initial vertex, and then we search a grandchild, and so forth as deep as possible, in a depth-first fashion. The order in which the vertices are being searched induces a depth first forest with roots at certain initial vertices. If we delete a subset P of edges of G, the same procedure will give us a depth first forest for $(V^*, E^* - P)$. In the extreme case that all the edges are deleted, the forest will degenerate into a set of roots, and the order in which they are searched will realize a breadth-first search on $(V^*, E^* - P)$.

As we said above, each reached vertex is recorded in the RST. With each v in $V^*$ we associate a pointer $\hat{v}$ to its record, name($v\hat{\,}$)=v is only one of the fields in this record. Other fields which are used in the search are parent($v\hat{\,}$), which is initially empty, and ultimately contains a pointer to the parent of v in the induced depth-first forest, and origin($v\hat{\,}$), which contains a pointer to the most recent parent of v, and enables avoiding duplications in counting edges between the same pair of vertices. The RST record also contains two flags, permanent($v\hat{\,}$), which is set for vertices which have been searched, and inpath(v^), which is set if v (in case v is permanent) or one of its ancestors (otherwise) is in the current depth first search path. More fields will be introduced in the next section, as they are required for the implementation of Tarjan's strong connectivity algorithm. Finally, two fields are required for maintaining the data structure itself (and thus, are transparent to the algorithm below): A pointer Hash(v^), for the next record in the RST, such that name(hash(v^)) is a vertex which "collides" with v in the open hashing scheme, and an integer index(v^), which is the ordinal number of v in the order of reachability, which is necessary as the RST is not contiguous in memory but rather allocated a chunk at a time. Once the search is done, the RST may be saved as an array, with all the pointers (which are implemented as memory addresses) replaced by the corresponding indices. The saved RST contains a depth first forest of $(V^*, E^* - P)$ and the strong connectivity decomposition which we describe in the next section.

A second data structure used in the search is the Boundary Deque. This is a linear list, a little more restrictive than Knuth's deque. We call one end of the list its top, and the other the rear, and we allow both stack (LIFO) and queue (FIFO) operations: Data is always taken (accessed and deleted) from the top, but is put (inserted) either at the top, as in a stack, or at the rear, as in a queue. The BD is used to save the pointers to the children of each searched vertex, until it is time to search them. Pointers to end-vertices of deleted edges are put at the rear, and thus are not searched until everybody else has been searched, while other are inserted at the top. Thus, in the extreme case P is empty, BD is a pure stack, while in the other extremity, P=E, BD is a pure queue.

We now describe the algorithm itself.

Definition: A graph generator is an ordered pair (V,c) of a finite set V, called the set of vertices, and a function c from V to its power set, called the child-set function. The graph generated by (V,c) is G=(V,E), where E is the subset of $V \times V$ consisting of all pairs (v,w) such w is a member of c(v).

Definition: Let G=(V,E) be a graph, and I is a subset of V, called the initial set. The reachable subgraph of (G,I) is the graph $G^* = (V^*, E^*)$, where $V^*$ is the subset of V consisting of the vertices v such that either v is in I or there exist a finite path (w, ..., v) in G such that w is in I, and $E^*$ is the intersection of $V^* \times V^*$ with E.

Algorithm A:
(1) back:=0 (no backtrack necessary).
(2) Take an initial vertex v from I. If no more, go to (6).
(3) Record v in RST.
(4) parent(v^):=empty, origin(v^):=empty, permanent(v^):=0, inpath(v^(:=0.
(5) Put v^ at rear (or top) of BD. Go to (2).
(6) Take a v^ from top of BD. If empty, stop (search done).
(7) If permanent(v^)=1 (v has already been searched), go to (6).
(8) If back=0, go to (13) (no backtrack).
(9) (backtrack the search path) If inpath(v^)=1 and parent(v^)≠empty, then top:=parent(v^) (top points to the vertex to which we have to backtrack). Otherwise, top:=empty (backtrack the whole path).
(10) w^:=connect (connect points to the vertex where the backtrack begins, i.e., the point where we couldn't search any deeper).
(11) inpath(w^):=0 (remove w from the path). w^:=parent(w^) (backtrack one edge). If w^=empty, go to (13).
(12) If w^≠top, go to (11).
(13) (backtrack complete) permanent(v^):=1. inpath(v^):=1 (add v to the search path).
(14) connect:=v^, back:=1 (we save our position in connect in case back is not eventually cleared and we must backtrack).
*(15) If parent(v^)=empty (v is a root in the depth-first tree), increment #root. Otherwise, increment #tree, decrement #forward (parent→v is a tree edge but has been counted as a forward edge in step (22)).
(16) Take a child vertex w from c(v). If no more, go to (6).
(17) Record w in RST. If already there, new:=0; otherwise, new:=1.
(18) If new=1, then parent (w^):=empty, origin(w^):=empty, permanent(w^):=0, inpath(w^):=0.
*(19) If origin(w^)=v^ (w has already been reached as a child of v), then increment #ignore (v→w is duplicate), go to (16); otherwise, origin(w^):=v^.
(20) If permanent (w^)=1, go to (24).
(21) (w has not been searched yet) If v→w is in P, go to (23).
*(22) (It is too early to decide if v→w is a forward edge or a tree edge) Insert w^ at the top of BD. parent(w^):=v^: inpath(w^):=1 (w has a parent in the path), back:=0 (as v has a non-searched child, do not backtrack). Increment #forward. Go to (16).
*(23) (v→w is a deleted edge) If new=1, put w^ at rear of BD (if w is not new, it is already in BD, and we don't mind where). Increment #plus. Go to (16).
*(24) (w has already been searched) If v→w is in P, increment #plus, go to (16).
*(25) If w^=v^ (v→w is a self edge), increment #self, go to (16).
*(26) (v→w is a back edge or a cross edge) If inpath(w^)=1 (w is an ancestor of v in the path), increment #back; otherwise, increment #cross. Go to (16).

Note: If no edge accounting is necessary, the updating of the counters #... in the starred steps may be omitted. The tests in steps (24)-(26) are still required for an acyclicity check. The test in step (19) together with the RST field origin may be omitted at the expense of the extra time involved in searching duplicate edges.

Theorem A: Given a graph generator (V,c), an initial subset I of V, a deleted subset P of $V \times V$, algorithm A produces a depth first forest for $(V^*, E^*)$.

The fact that algorithm A realizes a depth first search is standard, the parent and inpath RST fields implement a stack which replaces the usual recursiveness. The back flag, connect and top pointers tell us whether we should backtrack, from where an to where, respectively.

3. The Acceptance Test.

We now add more structure to G. In addition to the initial set of vertices I, the deleted set of edges P, we are now given a family of sets of vertices C={C1,C2,C3, ..., Cn). In section 2, we could test of G* had any cycle at all, we are now in position to ask if the vertices of each cycle in G* (if any) are contained in some Ci. For that end, we adapt our search so it will decompose G* into strongly connected components. Each component, unless it is degenerate to a single vertex with no self edge at it, is tested for containment in a member of C. Following Tarjan, we add some more fields to the RST:

The integers dfnumber(v^) and lowlink(v^) are respectively the ordinal number of v in the induced depth first search, and Tarjan's index defining the least ordinal, dfnumber(w^), of a vertex w belonging to the same component and reachable from v by a path consisting of tree edges followed by at most one back edge or one cross edge. In the modified algorithm, we can also distinguish between intercomponent and intracomponent cross edges as a by product from the lowlink calculation. Finally, Tarjan's stack of points is implemented by adding a third pointer field to the RST, denoted connect(v^), which links the entry for v with the entry for the previously found vertex in the same component, and a flag inscc(v^), which is set if v is in the current component, and cleared to simulate deleting v from the stack of points. Two more flags, root(v^) and self(v^), are set respectively if v is the root of the depth-first subtree of its strongly-connected component, and if v has a self-edge. The former is used to delimit the components in the connect list—the list of RST entries linked together by the connect field, and the latter is used to determine degeneracy of singleton components.

We now present the Strong connectivity algorithm. Since it is a modification of the algorithm in section 2, we omit the unmodified steps. We note, however, that while the original search is over at the moment the BD is empty, we still have to look for components in the last path.

Algorithm B:
(1) ...
(1') count:= −1. last:=empty.
( ... ) ...
(4) ...
(4') inscc(v^):=0. connect(v^):=empty.
(5) ...
(6) Take a v^ from top of BD. If empty, then v^:=empty, go to (8).
(7) ...
(8) ...
(8') root:=empty (rootwill point to the root of the subtree of the current component). If v^=empty, then top:=empty, go to (10);
( ... ) ...
(11) inpath(w^):=0. If lowlink=dfnumber(w^) (w is a root of the current component subtree), then root:=w^, root(w^):=1. w^:=parent(w^). If w^=empty go to (13).
(11') If lowlink(w^)>lowlink, lowlink(w^):=lowlink; Otherwise, lowlink:=lowlink(w^).
(12) ...
(13) (backtrack complete) if root≠empty (found at least one complete component), check the connect list from connect to root for containment at a Ci (see Note below). w^:=connect. connect:=connect(root). connect(root:=last:=w^. (last points to the vertex where the backtrack started, and it is the new beginning for the connect list. Its new end is linked to the previous beginning.)
(13') If v^=empty, stop (search complete). permanent(v^):=1. inpath(v^):=1. inscc(v^):=1. Increment count. dfnumber(v^):=count. lowlink:=count. connect(v^):=connect.
( ... ) ...
(16) Take a child vertex w from c(v). If no more, then lowlink(v^):=lowlink, go to (6).
( ... ) ...
(26) (v→w is a back edge or cross edge) If inscc(w^)=1 and lowlink>dfnumber(w^), lowlink:=dfnumber(w^) (update lowlink to be the minimum dfnumber for all end vertices of back edges or cross edges starting at v and ending in the same component).
(26') If inpath(w^)=1, increment #back. Otherwise, if inscc(w^)=1, increment #intra (an intracomponent cross edge). Otherwise, increment #inter (an intercomponent cross edge). Go to (16).

Note: In step (13) above, a check the connect list is called for. The only action relevant to the decomposition algorithm proper is the clearing of the inscc flag for all the entries in the list. We shall not elaborate the strongly connected component checking algorithm here, except for mentioning that it uses the root and self flags in the RST, in their significance mentioned above.

Theorem B: Given a graph generator (V,c), an initial subset I of V, a deleted subset P of V×V, algorithm B produces a decomposition of (V*,E*−P) into strongly connected components. The theorem follows if one verifies that the lowlink calculations, done recursively in Tarjan's original algorithm, may be done during the search backtrack steps and the classification of out edges, as above.

4. The Transition Checks.

In analyzing coordination, we do several checks on the validity of state transitions. This is done in several levels: When cranking next states, we first check for lockups, which are actually deficiencies in the specification of coordinating processes: In a particular state, we cannot compute some of the components of the global selection, or otherwise we cannot compute some resolutions. We than check for various degrees of determinism. A system of processes will be deterministic if there is only one selection for a process in each given state. A non-deterministic system can still have semi deterministic resolutions (or simply, the system is semi-deterministic), that is have only one resolution for each global selection in a given state. In checking semi-determinism, we also allow any component process to stop pausing non-deterministically, counting the two possibilities as a single resolution.

As we have mentioned, lockups and determinism are checked during graph generation. During the actual search, we first check for deadlocks. These are vertices of G* with no children except possibly the vertex itself, i.e., with no out-edges except the self-edge. This check is done by setting a flag when searching a new state (step (14)), and clearing it when traversing any non-self out edge. The last transition check is the stability check, which we now explain.

When one considers the real time behavior of a semi-deterministic system, one can distinguish between two types of state transitions, and in accordance also two types of states. A critical transition v→w is one where v and w are nominally distinct. Such a transition is considered to occur instantaneously. In contrast, A noncritical transition will involve just one or more processes stop pausing, and thus will have a non-deterministic positive duration. Noncritical states are states in which the system can pause for a positive period of time, due to the property that any transition from such a state are noncritical. Any other state is said to be critical, and in such a state it is possible to make a global selection which will resolve in a critical transition. An semideterministic system is said to be stable if it never has two consecutive critical transitions, or, equivalently, there is no edge v→w in the coordination graph G* such that both v and w are critical. To classify the vertices in V* and to detect stability failure, the following variation of the basic search algorithm is used:

Algorithm C:

(1) ...
(1') stable:=1.
(...) ...
(15) ...
(15') move:=0.
(16) Take a child vertex w from c(v). If no more, then move(v^):=move, go to (6). If v→w is critical, c2:=1; otherwise, c2:=0.
(...) ...
(19) ...
(19') If c2=0, go to (20). move:=1. If permanent(w^)=0, move(w^):=1. (19") If stable=0 go to (20) (stability failed before, don't check again). If permanent(w^)=1 and move(w^)=1 and move(w^)=1, then stable:=0; otherwise, if move(v^)=1, stable:=1.
(...) ...

Theorem C:Algorithm C produces a decomposition of V* into critical and non-critical states and tests the stability of G*.

When the search is over, for each v in V*, the RST flag move(v^) will be set if and only if v is critical. Also, the flag stable will be set if and only if G* is stable. To see that, we first observe that by (19'), until w is searched, move(w^) is set if and only if it has a parent v such that v→w is critical. On the other hand, once v is has been searched, move(v^) is set in (16) if and only if move has been ever set in (19'), i.e., if and only if it has a child w such that v→w is critical. Thus, the first part of Theorem C follows. To prove the other part, consider any stability failure caused by two consecutive critical edges in G*, let v→w be the second of these edges in the induced depth first search. Consider the following two alternatives for the critical transition v→w to fail stability: Either w is known to have a critical out-edge, or v is known to have a critical in-edge. The former alternative is equivalent to w having been already searched (otherwise its out-edges are not known) and being critical. The latter is equivalent to v having a parent u such that u→v is critical. Thus above observation, we must have either move(w^)=1 (and w permanent) or move(v^)=1, as in step (19").

We claim:

1. In a computer, a method for creating a sequential circuit comprising the steps of:
   receiving a specification and tasks for said sequential circuit;
   testing whether said tasks are performable in said sequential circuit when said circuit conforms to said specification;
   forming a refined specification by adding detailed information about said specification and defining new tasks to be performed;
   formally verifying that said refined specification preserves behavior of said given specification, in that the response of said circuit to input signals when it conforms to said refined specification is consonant with the response of said circuit to the same input signals when it conforms to said given specification;
   replacing said tasks with said new tasks and said specification with said refined specification, and returning to said step of testing; and
   developing and delivering structure information based on said specification, for effectuating said sequential circuit.

2. The method of claim 1 wherein said step of testing includes testing to determine whether to cease forming a refined specification.

3. In a computer a method for creating a sequential circuit that performs given tasks, comprising the steps of:
   entering into an analyzer a specification of said sequential circuit;
   forming a refined specification by adding to said analyzer detailed information absent in said specification;
   formally verifying that said refined specification preserves behavior of said specification, in that the response of said circuit to input signals when it conforms to said refined specification is consonant with the response of said circuit to the same input signals when it conforms to said specification;
   replacing said specification with said refined specification, and returning to said step of forming; and
   developing and delivering out of said analyzer structure information based on said specification, for effectuating said sequential circuit.

4. The method of claim 3 further comprising a step of incorporating said structure information in a pattern of connections of an integrated circuit.

5. The method of claim 3 further comprising a step of incorporating said structure information in a layout of an integrated circuit.

6. The method of claim 3 wherein said structure information comprises a sequence of control signals for controlling a processor to effectuate said sequential circuit.

7. The method of claim 6 wherein said control signals are adapted for controlling a stored program processor.

8. The method of claim 7 wherein said control signals form a plurality of modules and each module forms a switch statement construct with reference to no other modules except for modules that control input and output functions of said stored program processor.

9. In a computer, a method for creating a sequential circuit that performs given tasks in accordance with a given specification, comprising the steps of:
   defining a reduction of said given specification for each of said given tasks to form a reduced specification for each task;
   testing that each reduced specification subsumes said given specification with respect to said task and leaves its corresponding task invariant;
   testing each task to determine that it is performable in a circuit that conforms to the reduced specification corresponding to the tested task;
   developing circuit structure information, based on said given specification, for effectuating said sequential circuit; and incorporating said structure information in a pattern of connections of an integrated circuit.

10. The method of claim 9 further comprising a step of incorporating said structure information in a layout of an integrated circuit.

11. The method of claim 9 wherein said structure information comprises a sequence of control signals based on said given specification, for controlling a processor to effectuate said sequential circuit.

12. The method of claim 11 wherein said control signals are adapted for controlling a stored program processor.

13. The method of claim 12 wherein said control signals form a plurality of modules and each module forms a switch statement construct with reference to no other modules except for modules that control input and output functions of said stored program processor.

14. In a computer, a method for creating a sequential circuit comprising the steps of:
    entering into an analyzer a circuit specification and tasks;
    testing whether said tasks are performable in said sequential circuit when said sequential circuit conforms to said specification;
    forming a refined specification by adding to said analyzer detailed information about said specification and entering a new tasks to be performed;
    formally verifying that said refined specification preserves behavior of said specification, in that the response of said circuit to input signals when it conforms to said refined specification is consonant with the response of said circuit to the same input signals when it conforms to said specification;
    replacing said tasks with said new tasks and said specification with said refined specification, and returning to said step of testing;
    defining a reduction of said specification for each of said tasks to form a reduced specification for each task;
    testing the reduced specification to determine that each reduced specification subsumes said specification and leaves its corresponding task invariant;
    testing each task to determine that it is performable in a circuit that conforms to the reduced specification corresponding to the tested task; and
    developing and delivering out of said analyzer structure information based on said specification, for effectuating said sequential circuit.

15. In a computer, a method for creating a sequential machine that conforms to a given specification, which machine performs tasks, comprising the steps of:
    developing a refinement specification of said sequential circuit to form a refined candidate specification and defining tasks to be performed by said sequential machine;
    testing the assertion that the refined candidate specification is subsumed by said given specification and that the tasks are performable by said sequential machine when said machine conforms to said refined candidate specification;
    correcting said refined candidate specification and said tasks when said testing indicates rejection of said assertion;
    replacing said given specification with said refined candidate specification and returning to said step of developing a refinement when said testing indicates acceptance of said assertion.

16. The method of claim 15 wherein said steps of testing and correcting comprises the steps of:
    refinement testing, to confirm the assertion that said refinement is subsumed by said refined candidate specification,
    correcting errors in said refinement when said refinement testing indicates rejection of the refinement testing assertion,
    task testing, to confirm the assertion that said tasks are carried out by said refinement,
    correcting errors in said refinement and in said tasks when said task testing indicates rejection of task testing assertion.

17. The method of claim 16 wherein said step of testing the assertion that said tasks are carried out by said refinement comprises a step of testing the assertion that said tasks are carried out by a reduced specification of said candidate specification.

18. The method of claim 17 further comprising a step of testing said reduced specification to determine that the behavior of said reduced specification subsumes the behavior of said refined candidate specification.

19. The method of claim 15 wherein said step of specifying a refinement terminates when, for a given set of possible input signals and target output signals, said candidate specification is sufficient to process said inputs signals and develop all of said target output signals.

20. The method of claim 15 further comprising a step of developing a set of control signals for embodying said sequential machine.

21. The method of claim 20 wherein said step of developing a set of control signals comprises developing a sequence of instructions for controlling a stored program controller.

22. The method of claim 21 further including a step of incorporating said instruction in a stored program controller.

23. A sequential circuit for carrying our given tasks, having a stored program processor and a memory, with a signal set stored in said memory having a portion that is essential for performing said given tasks, and said portion consisting of a plurality of modules, with each module forming a switch construct having references to no modules other than modules that control input and output functions of said stored program processor.

24. A controller comprising: a processor to form a finite state machine with an input port and an output port and which develops prechosen responses at said output port in consequence of input signals at said input port and the state of said finite state machine, having
    an execution program for effecting said prechosen responses, and
    a memory for storing said execution program,
    wherein said execution program, in a portion thereof that is essential to effect said chosen responses, includes switch constructs, with branches of all of said switch constructs including commands selected strictly from a set that excludes calls to functions other than functions that interact with said input port and said output port.

25. Apparatus comprising: a finite state machine with an input port and an output port and which develops prechosen responses at said output port in consequence of input signals at said input port and the state of said finite state machine, having
    an execution program for effecting said prechosen responses,
    a memory for storing said execution program, and
    a processor connected to said memory and to said input port and output port,
    wherein said execution program, in a portion thereof that is essential to effect said chosen responses, includes switch constructs, with branches of all of said switch constructs including commands selected strictly from a set that excludes calls to functions other than functions that interact with said input port and said output port.

26. The apparatus of claim 25 wherein said execution program includes a concatenation of switch constructs, each of which with branches including commands that are selected strictly from said set.

27. A sequential machine, formed form a plurality of interacting finite state machines and having an input port and an output port, comprising:
   an execution program to effect chosen responses of said machine at said output port to input signals at said input port,
   a memory for storing said execution program, and
   a processor connected to said memory and to said input port and output port,
   wherein said execution program includes a switch construct for each of said interacting finite state machines, with branches of all of said switch constructs that are essential to effect said chosen responses including commands selected strictly from a set that excludes calls to functions other than functions that interact with said input ports and said output ports.

28. The machine of claim 27 wherein said switch constructs are concatenated.

29. A sequential circuit for carrying our given tasks, comprising: cooperating modules, where the structure of each of the modules forms a switch construct that is structured in accordance with an iteratively applied method comprising the steps of
   developing a circuit specification to form a given specification;
   testing whether said given tasks are performable in said sequential circuit when said circuit conforms to said given specification, and whether to continue to a step of forming a refined specification;
   forming a refined specification by adding detailed information about said specification and defining new tasks to be performed;
   verifying that said refined specification carries out said given tasks with the same responsiveness as those tasks are carried out by said given specification, in that the response of said circuit to input signals, when it conforms to said refined specification, is consonant with the response of said circuit to the same input signals when it conforms to said given specification;
   replacing said given tasks with said new tasks and said given specification with said refined specification, and returning to said step of testing; and
   developing said set of modules from said given specification.

* * * * *